United States Patent [19]

Notani et al.

[11] Patent Number: 5,592,109

[45] Date of Patent: Jan. 7, 1997

[54] PHASE COMPARATOR AND PLL CIRCUIT

[75] Inventors: Hiromi Notani; Harufusa Kondoh, both of Hyogo, Japan

[73] Assignee: Mitsubishi Denki Kabushiki Kaisha, Tokyo, Japan

[21] Appl. No.: 403,948

[22] Filed: Mar. 14, 1995

[30] Foreign Application Priority Data

Apr. 1, 1994 [JP] Japan .................. 6-065190

[51] Int. Cl.$^6$ .................. H03K 51/22
[52] U.S. Cl. .................. 327/3; 327/22; 327/23
[58] Field of Search .................. 327/3, 22, 23

[56] References Cited

U.S. PATENT DOCUMENTS 5,381,085  1/1995  Fischer .................. 377/39

OTHER PUBLICATIONS

Electronics Selected Book, "How-To-Use PLL-IC", Masayasu Hata, et al, Chapter 10, pp. 194–197, Jun. 1987.
IEEE Journal of Solid-State Circuits, vol. SC-22, No. 2, Apr. 1987 "Design of PLL-Based Clock Generation Circuits", Deog-Kyoon Jeong, et al, pp. 255–261.

Primary Examiner—Margaret Rose Wambach
Attorney, Agent, or Firm—Oblon, Spivak, McClelland, Maier & Neustadt, P.C.

[57] ABSTRACT

It is an object of the present invention to provide a phase comparator which can compare phase at high speed with simple structure. The phase is compared by a precharge type NAND gate including transistors (Q35–Q37). The result of comparison in the NAND gate is then outputted only in a period in which the input clock CLKref is at "1" by the NAND gate (NA 15), and thus the phase lag of the internal clock CLKint with respect to the input clock CLKref is detected. Phase lead of the internal clock CLKint with respect to the input clock CLKref is compared with interchanged relation of clocks inputted to a phase detecting portion (PD 2). Phase comparison can be made at high speed with a simple circuit including the precharge type NAND gate and the NAND gate (NA 15).

17 Claims, 52 Drawing Sheets

FIG. 3A CLKref 
FIG. 3B CLKint 
FIG. 3C $\overline{Su}$ 
FIG. 3D $\overline{Sd}$ 
FIG. 3E $\overline{R}$ 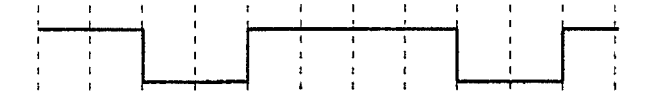
FIG. 3F UP 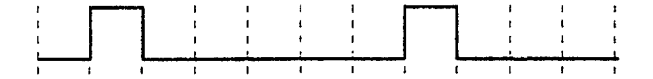
FIG. 3G DOWN 

FIG. 4A CLKref
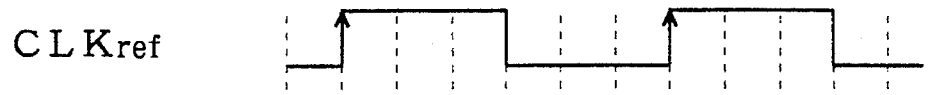
FIG. 4B CLKint
FIG. 4C $\overline{Su}$
FIG. 4D $\overline{Sd}$
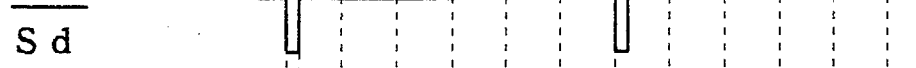
FIG. 4E $\overline{R}$
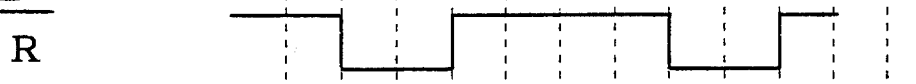
FIG. 4F UP
FIG. 4G DOWN
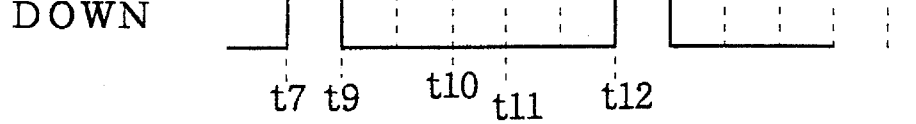

FIG. 14A CLKref
FIG. 14B CLKint
FIG. 14C a
FIG. 14D b
FIG. 14E UP
FIG. 14F DOWN

FIG.18A CLKref 
FIG.18B CLKint 
FIG.18C nd1 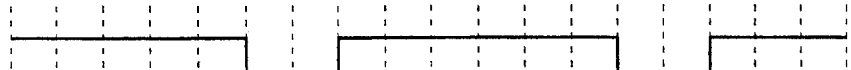
FIG.18D nd2 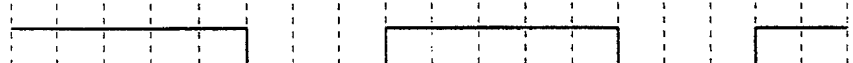
FIG.18E UP 
FIG.18F DOWN 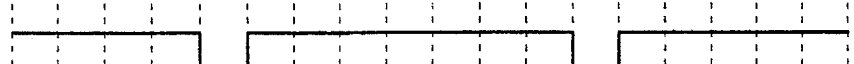
FIG.18G nd3 
FIG.18H nd4 
FIG.18I UPf 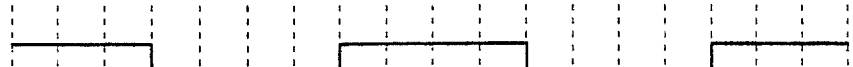
FIG.18J DOWNf 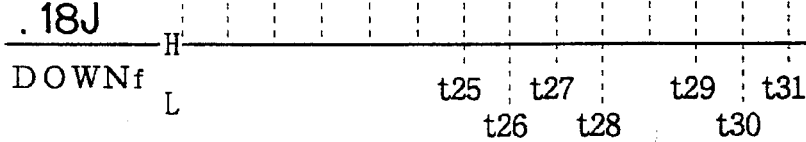
t25 t27 t29 t31
t26 t28 t30

<u>4 2</u>

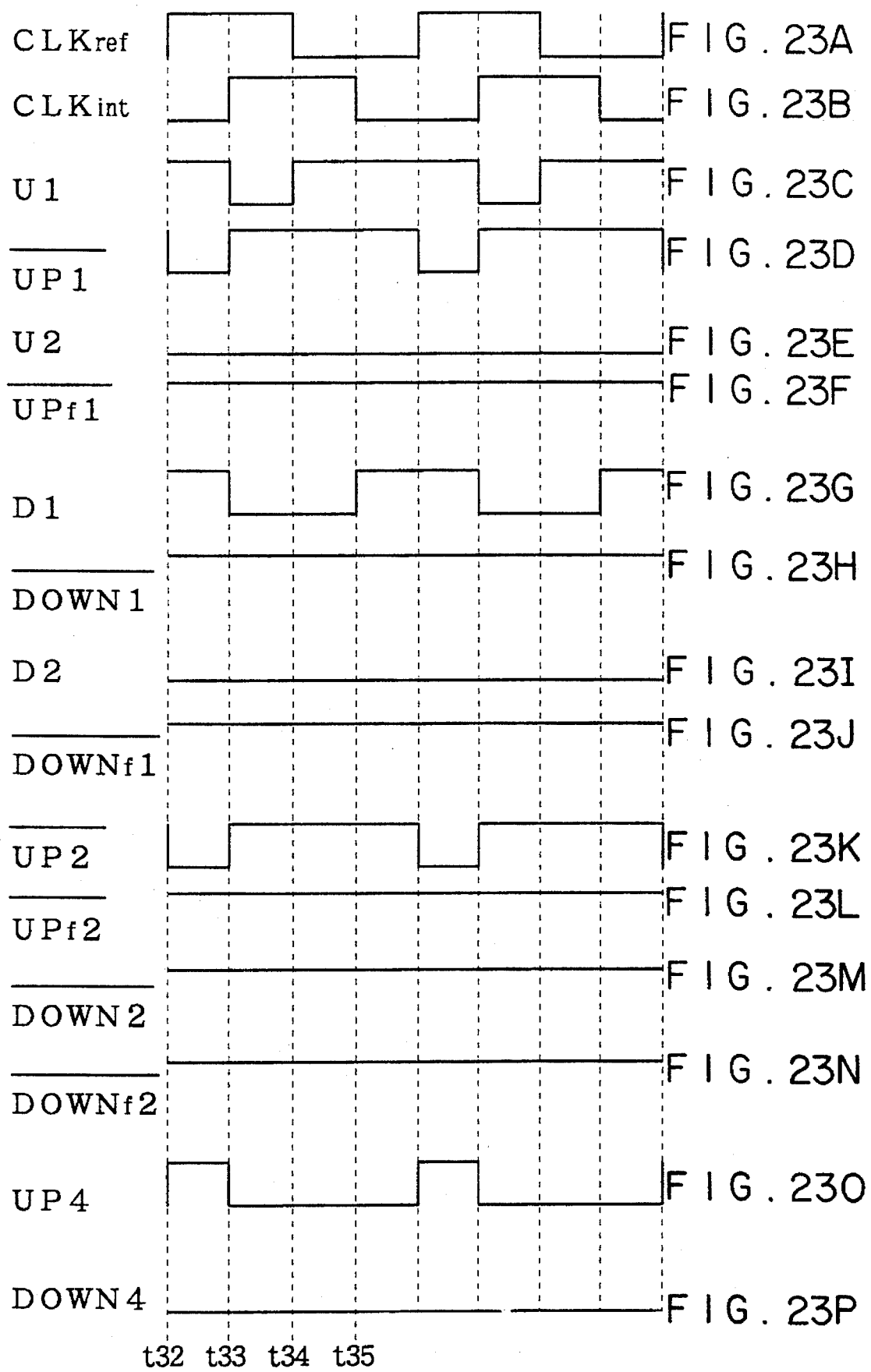

FIG. 24A $CLK_{ref}$

FIG. 24B $CLK_{int}$

FIG. 24C $U1$

FIG. 24D $\overline{UP1}$

FIG. 24E $U2$

FIG. 24F $\overline{UPf1}$

FIG. 24G $D1$

FIG. 24H $\overline{DOWN1}$

FIG. 24I $D2$

FIG. 24J $\overline{DOWNf1}$

FIG. 24K $\overline{UP2}$

FIG. 24L $\overline{UPf2}$

FIG. 24M $\overline{DOWN2}$

FIG. 24N $\overline{DOWNf2}$

FIG. 24O $UP4$

FIG. 24P $DOWN4$

FIG. 25A CLKref

FIG. 25B CLKint

FIG. 25C U1

FIG. 25D $\overline{UP1}$

FIG. 25E U2

FIG. 25F $\overline{UPf1}$

FIG. 25G D1

FIG. 25H $\overline{DOWN1}$

FIG. 25I D2

FIG. 25J $\overline{DOWNf1}$

FIG. 25K $\overline{UP2}$

FIG. 25L $\overline{UPf2}$

FIG. 25M $\overline{DOWN2}$

FIG. 25N $\overline{DOWNf2}$

FIG. 25O UP4

FIG. 25P DOWN4

FIG. 26A CLKref
FIG. 26B CLKint
FIG. 26C U1
FIG. 26D $\overline{UP1}$
FIG. 26E U2
FIG. 26F $\overline{UPf1}$
FIG. 26G D1
FIG. 26H $\overline{DOWN1}$
FIG. 26I D2
FIG. 26J $\overline{DOWNf1}$
FIG. 26K
FIG. 26L UP2
FIG. 26M $\overline{UPf2}$
FIG. 26N
FIG. 26O DOWN2
FIG. 26P $\overline{DOWNf2}$
FIG. 26Q UP4
FIG. 26R DOWN4

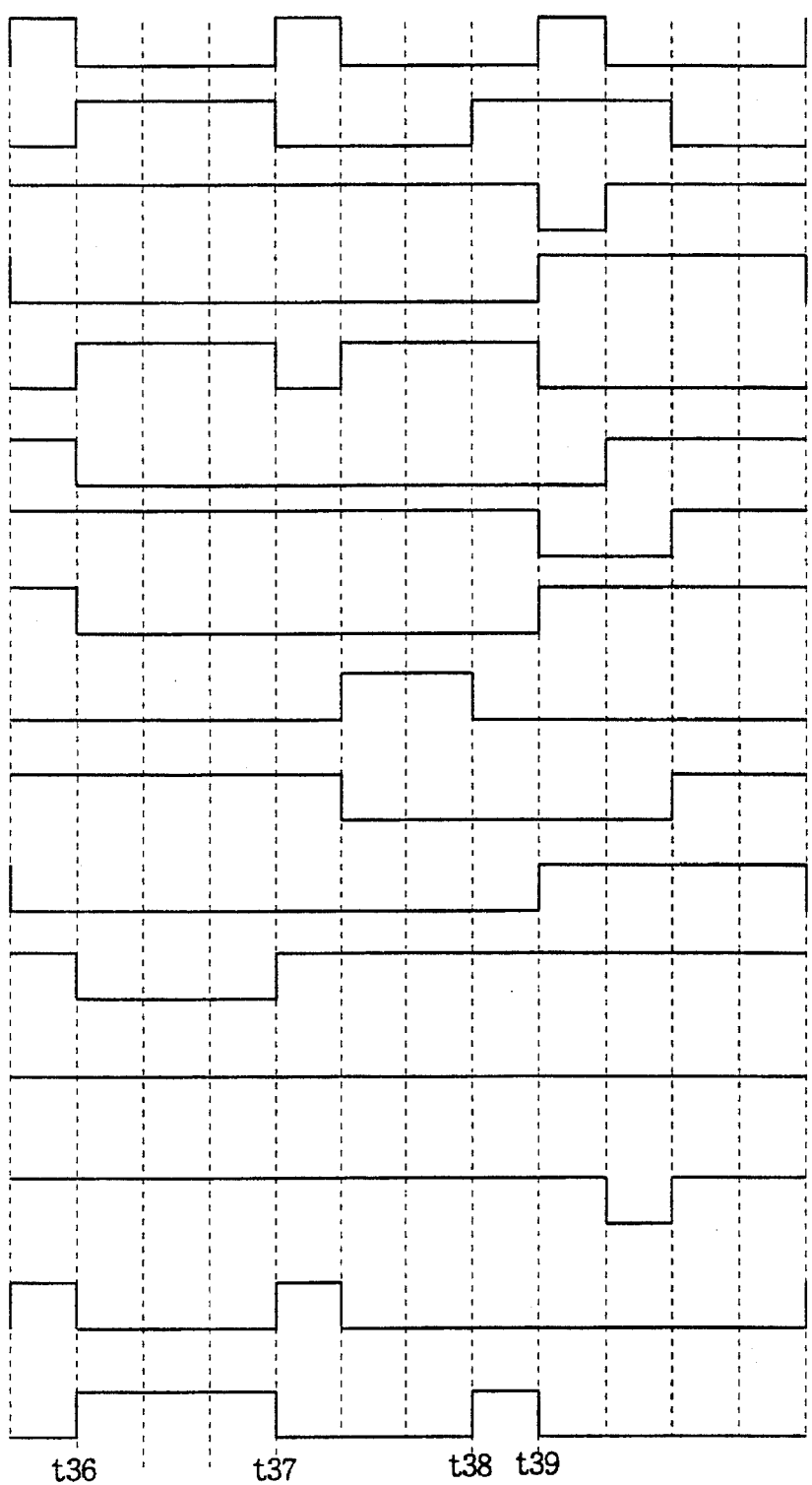

FIG. 28A CLKref
FIG. 28B CLKint
FIG. 28C U1
FIG. 28D UP1
FIG. 28E U2
FIG. 28F UPf1
FIG. 28G D1
FIG. 28H DOWN1
FIG. 28I D2
FIG. 28J DOWNf1
FIG. 28K UP2
FIG. 28L UPf2
FIG. 28M DOWN2
FIG. 28N DOWNf2
FIG. 28O UP4
FIG. 28P DOWN4

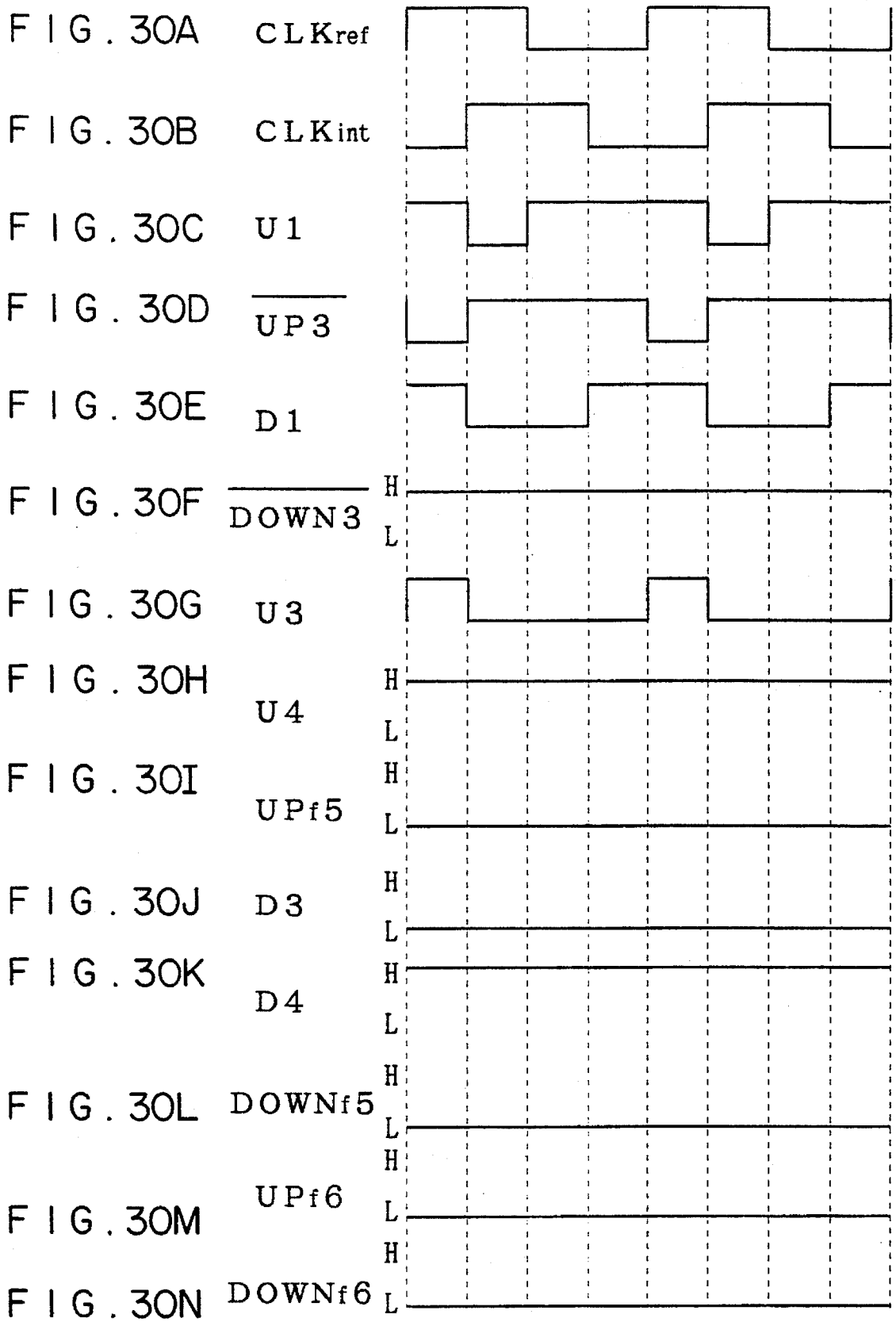

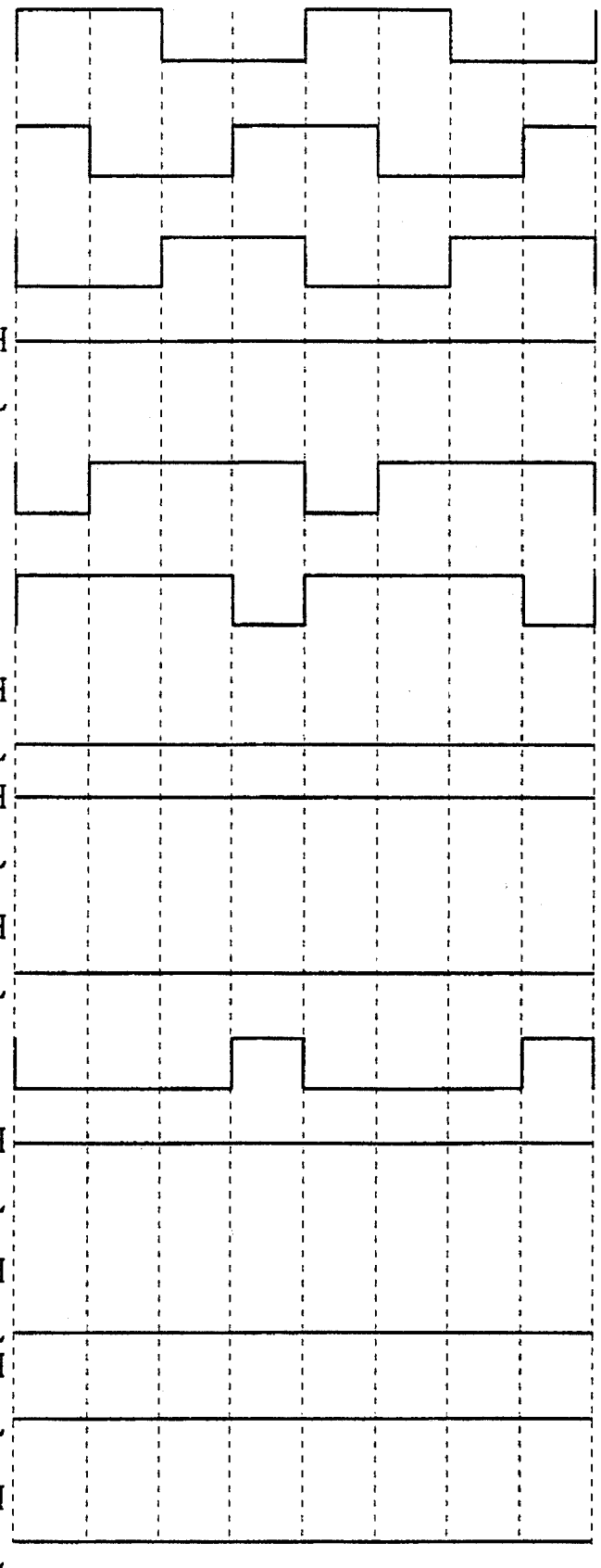
FIG. 31A CLKref
FIG. 31B CLKint
FIG. 31C U1
FIG. 31D $\overline{UP3}$
FIG. 31E D1
FIG. 31F $\overline{DOWN3}$
FIG. 31G U3
FIG. 31H U4
FIG. 31I UPf5
FIG. 31J D3
FIG. 31K D4
FIG. 31L DOWNf5
FIG. 31M UPf6
FIG. 31N DOWNf6

FIG. 32A CLKref 
FIG. 32B CLKint 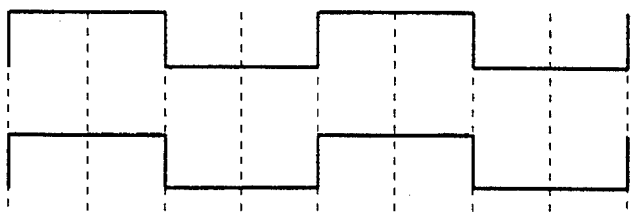
FIG. 32C U1 
FIG. 32D $\overline{UP3}$ 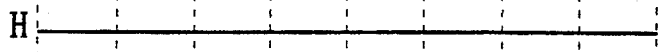
FIG. 32E D1 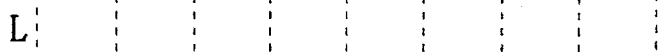
FIG. 32F $\overline{DOWN3}$ 
FIG. 32G U3 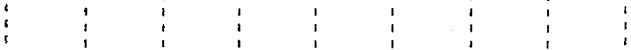
FIG. 32H U4 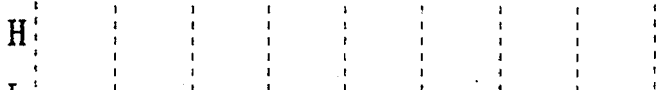
FIG. 32I UPf5 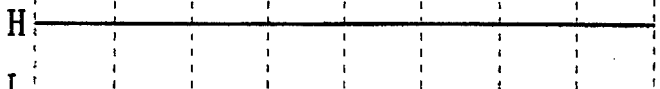
FIG. 32J D3 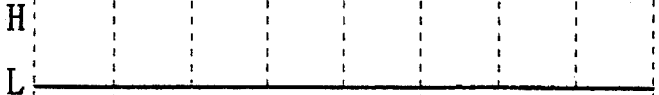
FIG. 32K D4 
FIG. 32L DOWNf5 
FIG. 32M UPf6 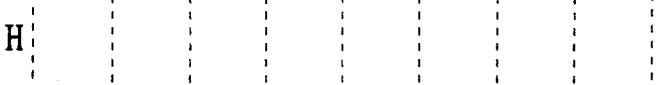
FIG. 32N DOWNf6 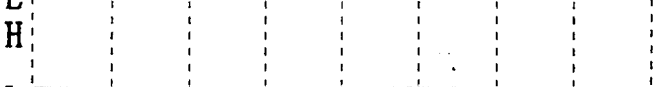

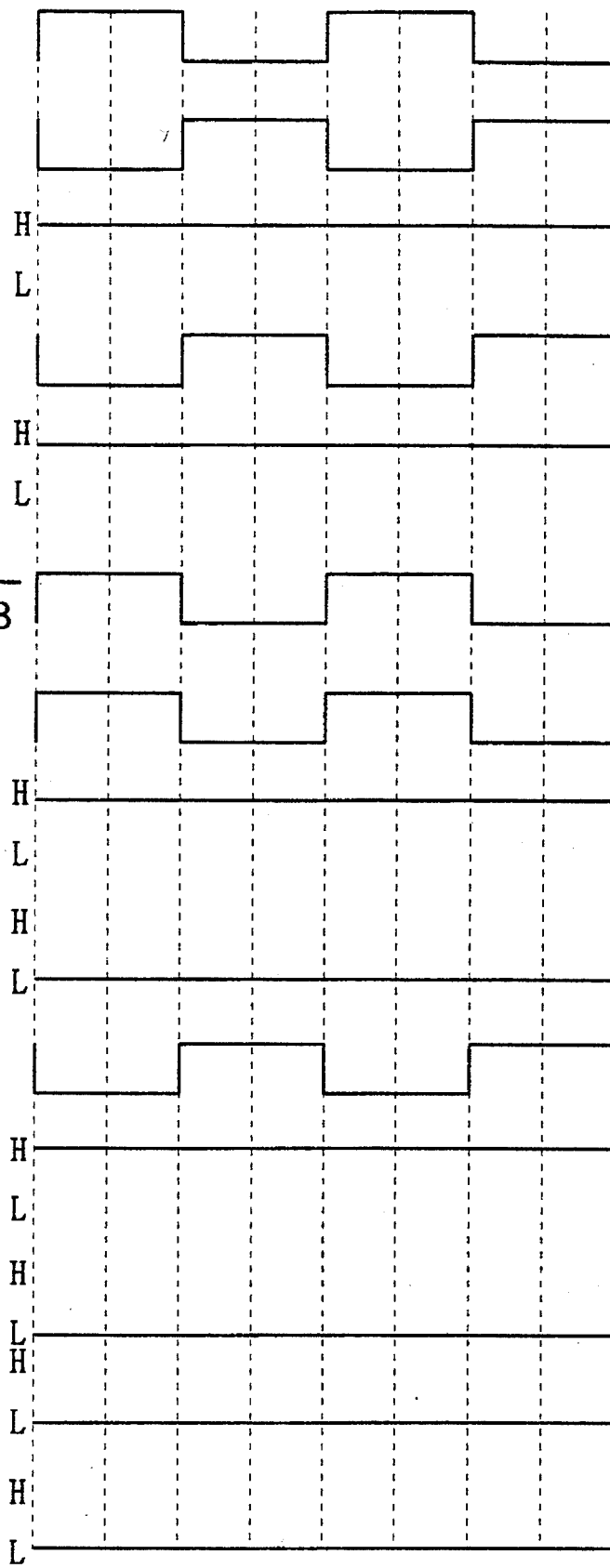

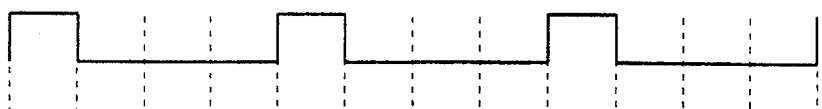
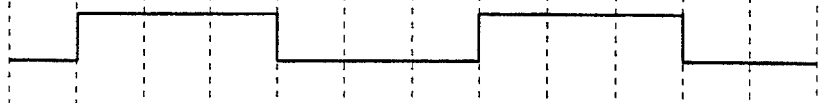
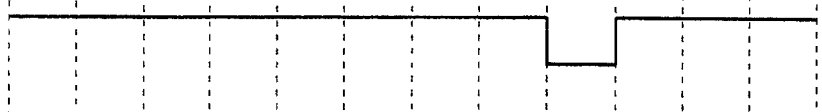
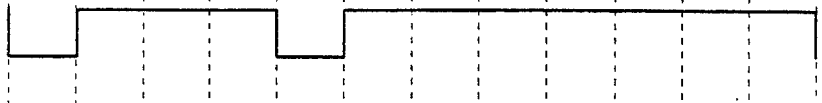
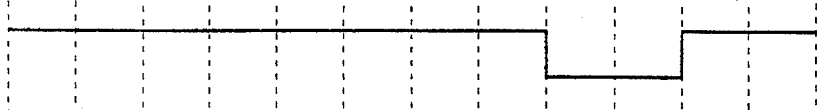
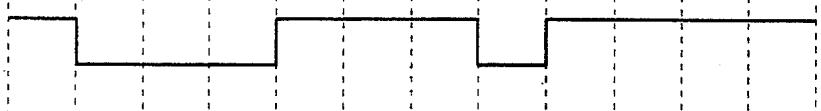
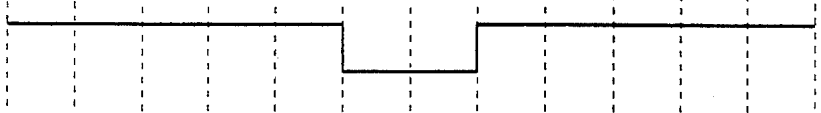
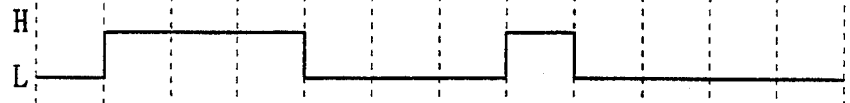
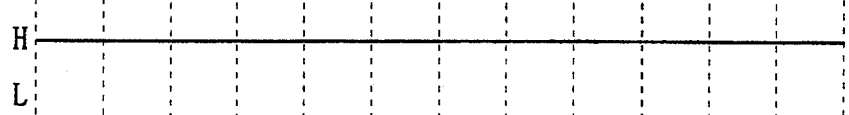
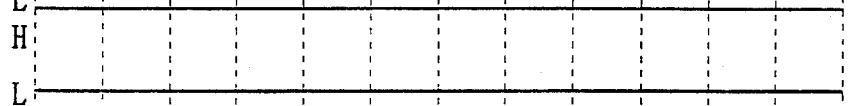
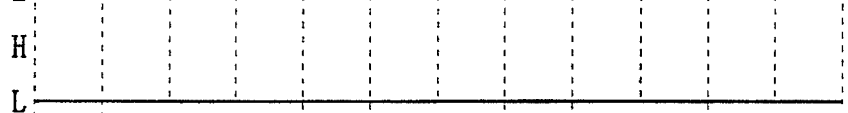

FIG. 35A CLKref 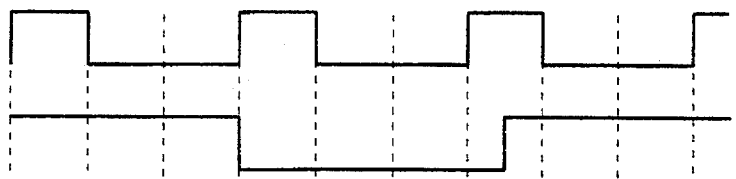
FIG. 35B CLKint 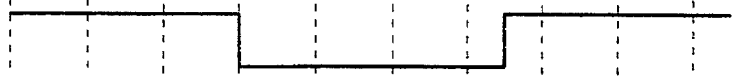
FIG. 35C U1 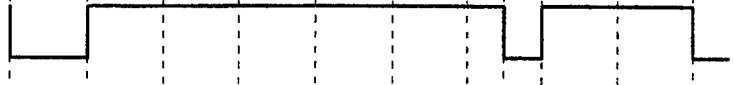
FIG. 35D $\overline{UP3}$ 
FIG. 35E D1 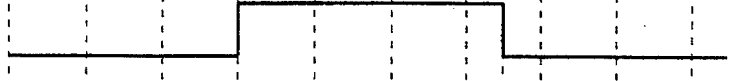
FIG. 35F DOWN3 
FIG. 35G U3 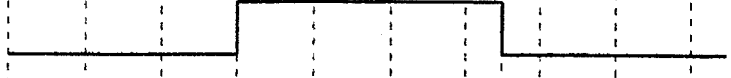
FIG. 35H U4 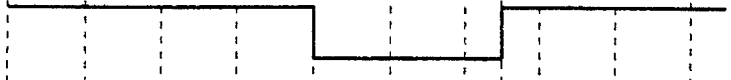
FIG. 35I UPf5 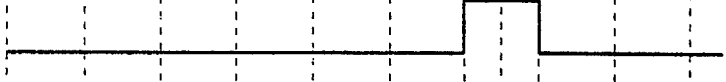
FIG. 35J D3 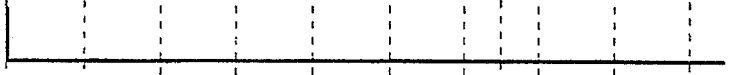
FIG. 35K D4 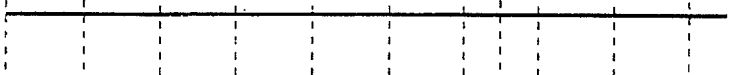
FIG. 35L DOWNf5 
FIG. 35M UPf6 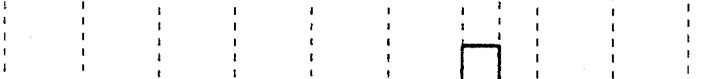
FIG. 35N DOWNf6 

FIG. 40A $CLK_{ref}$ 
FIG. 40B $CLK_{int}$ 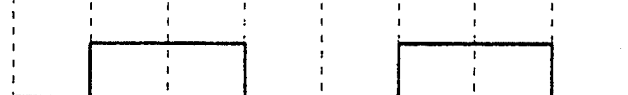
FIG. 40C U5 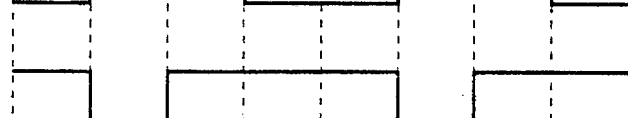
FIG. 40D UP7 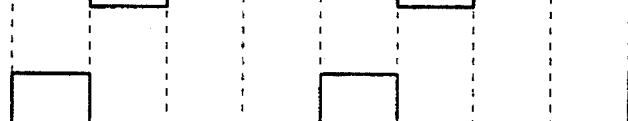
FIG. 40E D5 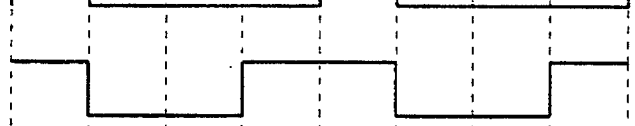
FIG. 40F DOWN7 

FIG. 41A CLKref
FIG. 41B CLKint
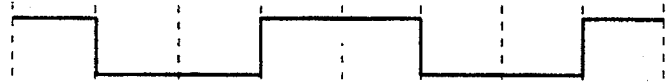
FIG. 41C U5
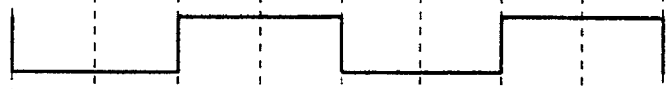
FIG. 41D UP7
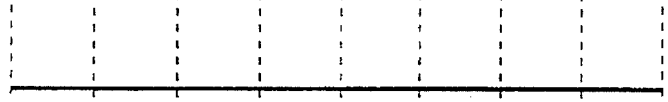
FIG. 41E D5
FIG. 41F DOWN7

FIG. 42A CLKref 
FIG. 42B CLKint 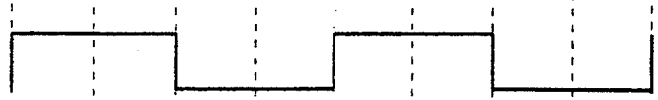
FIG. 42C U5 
FIG. 42D UP7 
FIG. 42E D5 
FIG. 42F DOWN7 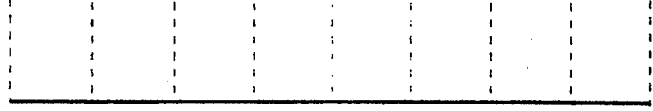

FIG. 43A CLKref 
FIG. 43B CLKint 
FIG. 43C U5 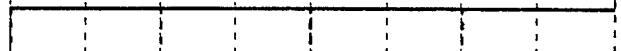
FIG. 43D UP7 
FIG. 43E D5 
FIG. 43F DOWN7 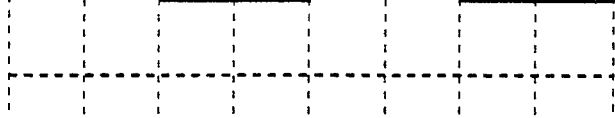

FIG. 44A
CLKref
FIG. 44B
CLKint
FIG. 44C
U5
FIG. 44D
UP7
FIG. 44E
D5
FIG. 44F
DOWN7
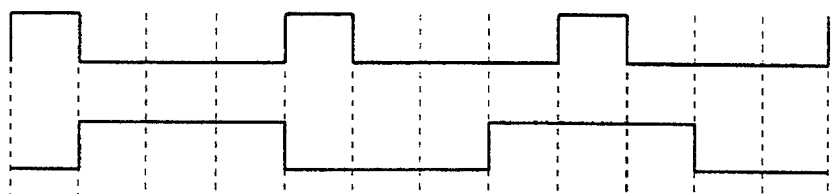
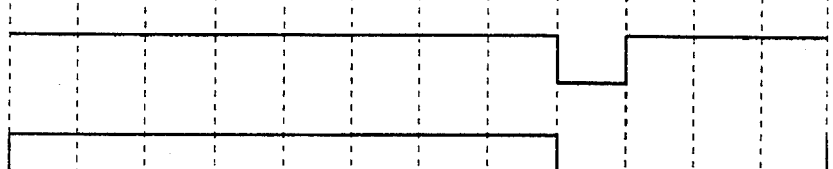
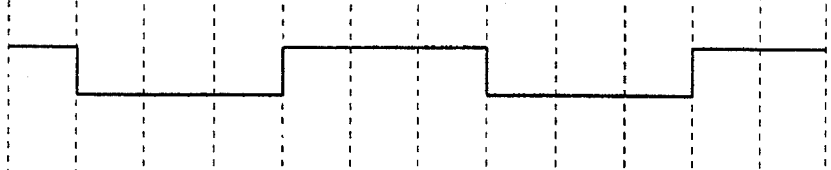

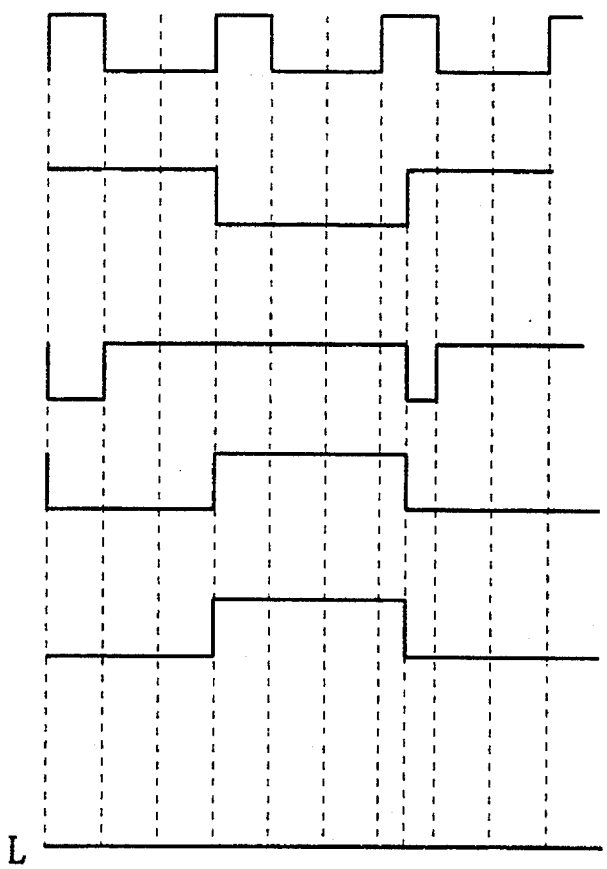
F I G . 45A  CLKref
F I G . 45B  CLKint
F I G . 45C  U5
F I G . 45D  UP7
F I G . 45E  D5
F I G . 45F  DOWN7

FIG. 52A PRIOR ART CLKref

FIG. 52B PRIOR ART CLKint

FIG. 52C PRIOR ART e

FIG. 52D PRIORT ART $\overline{UP}$

FIG. 52E PRIOR ART f

FIG. 52F PRIOR ART $\overline{DOWN}$

PHASE COMPARATOR AND PLL CIRCUIT

BACKGROUND OF THE INVENTION

1. Field of the Invention

The present invention relates to phase comparing circuits and PLL circuits, and particularly to a phase comparing circuit which is used for a PLL circuit operating stably at high speed, and also particularly to a PLL circuit which can easily be miniaturized.

2. Description of the Background Art

The PLL (Phase Locked Loop) circuits which have been widely used in the field of communication to establish synchronization with received data are now increasingly provided inside the LSIs to establish synchronization with input clocks with speeding up of the LSIs. The PLL circuits are used, for instance, for ATM (Asynchronous Transfer Mode) switches used in the ATM communication. For example, FIG. 49 is a conceptional diagram for illustrating the structure of an ATM switch which is described in "LSIs for ATM Switches", Mitsubishi Denki Giho, Vol. 67, No. 3, pp. 42–45, 1993 etc. In FIG. 49, 80 denotes an A-LSI having functions of phasing of input/output cells, header extraction of input cells, parity generation of input cells, parity check of output cells, various kinds of error detection etc. and holding two lines of both input and output in one chip, 81 denotes a B-LSI having buffering and switching functions for cells, eight being used for bit slices and one being used for parity, 82 denotes a C-LSI having functions of generating addresses for reading/writing of buffer memories and control signals of spatial switches, and 83 denotes a PLL circuit (Phase-Locked Circuit) provided in each B-LSI 81 for establishing synchronization between input clock of each B-LSI 81 and an internal clock. The demand for higher speed operations of the ATM switches is increasing year by year, and the demand is on the increase for such high speed operations as can be adapted to frequencies of several hundred MHz.

FIG. 50 is a block diagram showing the structure of a general PLL circuit. A PLL circuit 105 includes a phase comparator (also referred to as PC hereinafter) 101, a charge pump (also referred to as CP hereinafter) 102, a loop filter (also referred to as LF hereinafter) 103 and a voltage-controlled oscillator (also referred to as VCO hereinafter) 104. Generally, the "PC" is referred to as including CP, but the CP is shown as one block separated from the PC herein for convenience of description.

The function of each block will be described below. In the PC, the input clock CLKref and the internal clock CLKint are compared in phase with each other, and if the internal clock CLKint is lagging behind the input clock CLKref, "1" is outputted as an output UP and if it is ahead of the same, "1" is outputted as an output DOWN. When the output UP is "1", the CP 102 turns on to charge a capacitor of the LF 103.

When the output DOWN is "1", the CP 102 turns on to discharge the capacitor of the LF 103. The result of the phase comparison is thus integrated in the LF 103 to be a control voltage for the VCO 104, based on which the oscillation frequency of the VCO 104 changes. The output clock of the VCO 104 is distributed to an internal circuit having a load 107 through a clock driver (also referred to as a DRV hereinafter) 106. The internal clock CLKint is fed back as an input of the PLL circuit.

FIG. 51 is a circuit diagram showing one example of the structure of a conventional phase comparator. The phase comparator circuit shown in FIG. 50 is configured using four flip-flops (also referred to as FF). The four FFs are each comprised of two NAND gates NA 50 and NA 51 as depicted as the FF 110.

The input clock CLKref is provided via an inverter IN 50 as set input of the FF 110. The internal clock CLKint is provided via an inverter IN 51 as set input of the FF 113. The output e of the FF 110 is inputted to a 4-input NAND gate NA 60, and the output f of the FF 113 is inputted to the NAND gate NA 60. The outputs g and h of the FFs 111 and 112 are also inputted to the NAND gate NA 60.

The output of the NAND gate NA 60 is applied to the reset inputs of the FF 111 and FF 112, and the output of the NAND gate NA 60 is applied to the inputs of AND gates AN 50 and AN 51. The outputs g and h of the FF 111 and FF 112 are applied to another input of each AND gate AN 50 and AN 51 respectively. The output of the AND gates AN 50 and 51 are applied to the reset inputs of the FF 110 and FF 113 respectively. Then inversion outputs of the FF 110 and FF 113 are outputted as an output $\overline{UP}$ and an output $\overline{DOWN}$, respectively.

The operation of this circuit will be described below referring to the timing chart of FIG. 52. It is assumed that before the time t100, as the initial state, the input clock CLKref and the internal clock CLKint are "0" and the output $\overline{UP}$ and the output $\overline{DOWN}$ are "1", that is, the nodes e and f are at "0" and the nodes g, h and i are at "1".

At the time t100, if the input clock CLKref attains "1" earlier, the FF 110 is set and the node e goes to "1" and the output $\overline{UP}$ goes to "0". After that, at the time t101, when the internal clock CLKint attains "1", the FF 113 is set, and the node f goes to "1" and the output $\overline{DOWN}$ becomes "0", and the node i goes to "0" simultaneously. This resets all the FFs, the outputs $\overline{UP}$ and $\overline{DOWN}$ go back to "1", and the nodes g and h go to "0", and thus the node i goes back to "1".

Next, at the time t102, when the input clock CLKref goes back to "0", the node e goes back to "0", the FF 111 is set and the node g goes back to "1". In the same way, at the time t103, when the internal clock CLKint goes back to "0", the node f goes to "0", the node h goes to "1", and thus it returns to the initial state.

As described above, the output $\overline{UP}$ is outputted only for a period corresponding to the phase difference between the input clock CLKref and the internal clock CLKint, while only a spike-like pulse appears for a moment in the output $\overline{DOWN}$. On the other hand, when the internal clock CLKint attains "1" first, the output $\overline{DOWN}$ is outputted for a period corresponding to the phase difference in contrast to the case described above, and a spike-like pulse momentarily appears in the output $\overline{UP}$. Now, if the NAND gate NA 51 in the FF 110 (FF 113) is made 3-input and the AND gates AN 50 and AN 51 are omitted, the spike-like pulses will not appear. Since this circuit compares the phase on leading edges (rising edges) of the clock, it operates even when the duty of the clock changes. As output of FF is fed back to input, however, it takes time until states of all FFs become stable. Accordingly, the conventional PLL circuit has had a problem that it can not be satisfactorily adapted to a clock with a frequency higher than several hundred MHz, and for example, it has had a disadvantage that it can not be applied to a high-speed clock over 500 MHz.

FIG. 53 is a state transition diagram showing the operation of the phase comparator shown in FIG. 51. In this state transition diagram, when (↑, X) is indicated, for example, "↑" represents a rise of a signal and "X" represents an arbitrary state. A state of the input clock CLKref is indicated on the left side and a state of the internal clock CLKint is indicated on the right side in the parentheses. Furthermore, α represents a state in which the output $\overline{UP}$ and the output $\overline{DOWN}$ are both "1" in the phase comparator, β represents a state in which the output $\overline{UP}$ only is "0" in the phase comparator, γ represents a state in which the output $\overline{DOWN}$ only is "0" in the phase comparator, and δ represents a state in which the output $\overline{UP}$ and the output $\overline{DOWN}$ are both "0" in the phase comparator. Also, "*" shows that the state δ instantly makes transition to the state α without being stabilized at the state δ. As can be seen from this state transition diagram, it must go by way of the state δ to transfer from the state β and the state γ to the state α, with the result that the phase comparison operation becomes slow.

Next, FIG. 54 is a circuit diagram for describing the structure of the conventional PLL circuit. FIG. 54 shows a part of the PLL circuit, where the structure from the phase comparator (PC) 101 to the loop filter (LF) 103 shown in FIG. 50 is illustrated. Shown as an example of the charge pump (CP)102 is a charge pump 121 including a P-channel transistor Q70 for supplying current from VDD to LF and an N-channel transistor 071 for extracting current from LF to GND, and shown as an example of the LF 103 is a lag-type filter 122 including a resistor Re2 and a capacitor C2.

The time constant of the LF given from product of the resistance value of the resistor Re2 and the capacity of the capacitor C2 is deeply related to the locking time, stability, jitter etc. of the PLL, where a large time constant is required in consideration of the stability and jitter. However, there has been a problem that large areas are needed to provide capacitors with large capacity inside chips.

As described above, according to the conventional phase comparing circuit, when the CLKint attains "1" first, DOWN is outputted only for a period corresponding to the phase difference conversely to the description above and a spike-like pulse momentarily appears in UP. Now, if the NAND gate NA 51 of the FFs 110 and 113, for example, are made 3-input and the AND gates AN 50 and AN 51 are omitted, the spike-like pulse will not appear. However, since the phase is compared at a leading edge of clock in this circuit, it operates even if the duty of the clock changes. However, in the conventional phase comparator, it takes time until the states of all FFs become stable because outputs of the FFs are fed back to inputs. Accordingly, the conventional PLL circuit has had a problem that it can not be satisfactorily adapted to clocks with frequencies higher than several hundred MHz, and for example, it can not be applied to high speed clocks over 500 MHz.

Also, in the conventional PLL circuit, the time constant of LF is deeply related to locking time, stability, jitter etc. of PLL and a large time constant is required in consideration of the stability and the jitter, therefore it has had a problem that large areas are necessary to build capacitors with large capacity in chips.

SUMMARY OF THE INVENTION

The present invention is directed to a phase comparator for detecting a phase difference between a first clock in which a first signal level and a second signal level alternately appear and a second clock in which a third signal level and a fourth signal level alternately appear by comparing timing of changing from the first signal level to the second signal level and timing of changing from the third signal level to the fourth signal level and outputting a first output signal when a phase of the first clock is leading a phase of the second clock and outputting a second output signal when the first clock is lagging behind the second clock. According to the present invention, the phase comparator is characterized by going into a first state in which the first and second output signals are not outputted when the phase of the first clock and the phase of the second clock agree, and in the first state, holding the first state if the second clock changes from the third signal level to the fourth signal level when the first clock is at the second signal level, in the first state, holding the first state if the first clock changes from the first signal level to the second signal level when the second clock is at the fourth signal level, in the first state, changing to a second state in which only the first output signal is outputted if the first clock changes from the first signal level to the second signal level when the second clock is at the third signal level, in the second state, holding the second state if the first clock changes from the first signal level to the second signal level when the second clock is at the third signal level, in the second state, changing to the first state if the second clock changes from the third signal level to the fourth signal level when the first clock is at the second signal level, in the first state, changing to a third state in which the second output signal only is outputted if the second clock changes from the third signal level to the fourth signal level when the first clock is at the first signal level, in the third state, holding the third state if the second clock changes from the third signal level to the fourth signal level when the first clock is at the first signal level, in the third state, changing to the first state when the first clock changes from the first signal level to the second signal level when the second clock is at the fourth signal level, and making no state transition among the first, second and third states when the first clock changes from the second signal level to the first signal level and when the second clock changes from the fourth signal level to the third signal level.

In the phase comparator according to the invention, since a state transition is not made among the first, second and third states when the first clock changes from the second signal level to the first signal level and when the second clock changes from the fourth signal level to the third signal level, only the change from the first signal level to the second signal level and the change from the third signal level to the fourth signal level should be detected, with the result that the structure can be simple.

Furthermore, when the phase of the first clock is leading the second clock, in the first state, when the first clock changes from the first signal level to the second signal level when the second clock is at the third signal level, it changes to the second state in which the first output signal is outputted, and in the second state, when the second clock changes from the third signal level to the fourth signal level when the first clock is at the second signal level, it changes to the first state, so that it is directly placed in the state in which the first output signal is outputted when the first clock lags behind the second clock, it therefore can be operated at high speed. It is the same when the first clock is lagging behind the second clock in phase.

Accordingly, according to the phase comparator of the invention, transitions are made directly between the first state and the second state, and directly between the first state and the third state, which enables high speed operation. Also, it has the effect that a phase comparator can be realized with smaller number of elements since the change in the first clock from the first signal level to the second signal level and the change in the second clock from the third signal level to the fourth signal level only are detected.

In another aspect of the present invention, a phase comparator for detecting a phase difference between a first clock in which a first signal level and a second signal level alternately appear and a second clock in which a third signal level and a fourth signal level alternately appear by comparing timing of changing from the first signal level to the second signal level and timing of changing from the third signal level to the fourth signal level comprises a control circuit for outputting a first control signal when the first clock changes from the first signal level to the second signal level when the second clock is at the third signal level, outputting a second control signal when the first clock changes from the first signal level to the second signal level when the second clock is at the fourth signal level, outputting a third control signal when the second clock changes from the third signal level to the fourth signal level when the first clock is at the first signal level, and outputting the second control signal when the second clock changes from the third signal level to the fourth signal level when the first clock is at the second signal level, a first flip-flop circuit having a first input terminal receiving the first control signal and a second input terminal receiving the second control signal for holding the first control signal in response to the second control signal, and a second flip-flop circuit having a first input terminal receiving the third control signal and a second input terminal receiving the second control signal for holding the third control signal in response to the second control signal.

In the first flip-flop circuit according to the invention, for example, a signal indicating that the first clock is leading the second clock can be outputted by the first control signal outputted from the control circuit when the first clock changes from the first signal level to the second signal level when the second clock is at the third signal level, and when the second clock changes from the third signal level to the fourth signal level when the first clock is at the second signal level reset can be made and output of a signal indicating lead can be stopped by the second control signal outputted from the control circuit. Accordingly, the phase lead of the first clock from the second clock can be detected by the signal outputted from the first flip-flop.

Also, in the second flip-flop circuit, for example, a signal indicating that the first clock is delayed from the second clock can be outputted by the third control signal outputted from the control circuit when the second clock changes from the third signal level to the fourth signal level when the first clock is at the first signal level, and signal output indicating lag can be stopped by making reset by the second control signal outputted by the control circuit when the first clock changes from the first signal level to the second signal level when the second clock is at the fourth signal level. Accordingly, the phase lag of the first clock with respect to the second clock can be detected by the signal outputted from the second flip-flop circuit.

The control circuit can be formed of logic circuit, for example, therefore its structure is simple. Also, since feedback is not made so that the phase comparison results can be outputted only with the delay in the flip-flop circuit and the control circuit, it can be used for PLL circuits operating at high speed.

Accordingly, the phase comparator according to the invention has the effect that the structure of the phase comparator can be simplified because the control circuit can be configured with logic circuits. It also has the effect that the comparison in phase can be speeded up because feed back paths are not used and results of phase comparison can be outputted only with lag in the flip-flop circuits and the control circuits.

In another aspect of the present invention, a phase comparator for detecting a phase difference between a first clock in which a first signal level and a second signal level alternately appear and a second clock in which a third signal level and a fourth signal level alternately appear by comparing timing of changing from the first signal level to the second signal level and timing of changing from the third signal level to the fourth signal level comprises first through fourth signal generating means for outputting a fifth or a sixth signal level in response to a control signal, first control means receiving the first and second clocks as input for causing the first signal generating means to output the fifth signal level when the first clock is at the first signal level and the second clock is at the third signal level, causing the first signal generating means to hold the state as it is when the first clock is at the first signal level and the second clock is at the fourth signal level, causing the first signal generating means to output the fifth signal level when the first clock is at the second signal level and the second clock is at the third signal level and causing the first signal generating means to output the sixth signal level when the first clock is at the second signal level and the second clock is at the fourth signal level, second control means receiving the first and second clocks as input for causing the second signal generating means to output the fifth signal level when the second clock is at the third signal level and the first clock is at the first signal level, causing the second signal generating means to hold the state as it is when the second clock is at the third signal level and the first clock is at the second signal level, causing the second signal generating means to output the fifth signal level when the second clock is at the fourth signal level and the first clock is at the first signal level and causing the second signal generating means to output the sixth signal level when the second clock is at the fourth signal level and the first clock is at the second signal level, third control means receiving the second clock and an output of the first signal generating means for causing a signal outputted from the third signal generating means at that time to be outputted as it is when the second clock is at the third signal level and the output of the first signal generating means is at the fifth signal level, causing the third signal generating means to output the sixth signal level when the second clock is at the fourth signal level and the output of the first signal generating means is at the fifth signal level and causing the third signal generating means to output the fifth signal level when the second clock is at the fourth signal level and the output of the first signal generating means is at the sixth signal level, and fourth control means receiving the first clock and an output of the second signal generating means for causing a signal outputted from the fourth signal generating means at that time to be outputted as it is when the first clock is at the first signal level and the output of the second signal generating means is at the fifth signal level, causing the fourth signal generating means to output the sixth signal level when the first clock is at the second signal level and the second signal generating means is at the fifth signal level and causing the fourth signal generating means to output the fifth signal level when the first clock is at the second signal level and the output of the second signal generating means is at the sixth signal level.

In the third signal generating means according to the invention, when the first and the second clock are of the same frequency and the duty is 50%, for example, the sixth signal is outputted only when the first clock is lagging behind the second clock and the second clock is the signal of 4 and the first clock is the signal of 1. Accordingly, the phase lag of the first clock with respect to the second clock can be known with the output of the third signal generating means.

In the same way, in the fourth signal generating means, when the first and the second clock are at the same frequency and the duty is 50%, for example, the sixth signal is outputted only when the first clock is ahead of the second clock and the second clock is the signal of 4 and the first cock is the signal of 1. Accordingly, the phase lead of the first clock with respect to the first clock can be known with the output of the fourth signal generating means.

The first through fourth control circuits can be formed of simple logic circuits, thus the configuration can be simple. Also, feed-back is not made and results of the phase comparison can be outputted only with the delay in the first and third signal generating means and the first and third control circuits connected in series or the second and fourth signal generating means and the second and fourth control circuits connected in series, it therefore can be used in PLL circuits and the like which operate at high speed.

Accordingly, the phase comparator according to the invention has the effect that the structure of the phase comparator can be simplified because the phase lag of the first clock from the second clock can be known with output of the third signal generating means and the phase lead of the first clock from the second clock can be known with output of the fourth signal generating means, and the first through fourth control circuits have simple structure. It also has the effect that the comparison in phase can be speeded up since feed-back is not used and results of the phase comparison can be outputted only with the delay in the first and third signal generating means and the first and third control circuits connected in series and the second and fourth signal generating means and the second and fourth control circuit connected in series.

In another aspect of the present invention, a phase comparator for detecting a phase difference between a first clock in which a first signal level and a second signal level alternately appear and a second clock in which a third signal level and a fourth signal level alternately appear by comparing timing of changing from the first signal level to the second signal level and timing of changing from the third signal level to the fourth signal level comprises first phase comparing means receiving the first and second clocks as input and having a first node, first precharge means for causing the first node to raise a first potential when the second clock is at the third signal level and first and second switch means connected in series between the first node and a second potential different from the first potential for placing the first switch means in a conductive state when the second clock is at the fourth signal level and placing the second switch in a conductive state when the first clock is at the second signal level, and second phase comparing means receiving the first and second clocks as input and having a second node, second precharge means for causing the second node to raise the first potential when the second clock is at the first signal level and third and fourth switch means connected in series between the second node and the second potential for placing the third switch means in a conductive state when the first clock is at the second signal level and placing the fourth switch in a conductive state when the second clock is at the fourth signal level, wherein the first and second clocks are compared in phase in accordance with potential at the first and second nodes and a comparison result is outputted.

In the first phase comparing means according to the invention, the first node is precharged to the first potential by the first precharge means when the first clock is at the first signal level and the second clock is at the third signal level. The first phase comparing means closes the first switch to implement a conductive state when the second clock becomes the fourth signal level. Then when the first clock changes from the first signal level to the second signal level, the first node and the second potential are connected and the first node changes to the second potential. Next, when the second clock becomes the third signal level again, the first node is precharged to the first potential. Accordingly, if the first clock changes from the first signal level to the second signal level lagging behind the second clock changing from the third signal level to the fourth signal level, the period in which the first node is at the second potential is shortened by the amount of the lag, and thus the phase lag of the first clock with respect to the second clock can be detected.

In the same way, in the second phase comparing means, the second node is precharged to the first potential by the second precharge means when the second clock is at the third signal level and the first clock is at the first signal level. The second phase comparing means closes the third switch to implement a conductive state when the first clock attains the second signal level. Then, when the second clock changes from the third signal level to the fourth signal level the second node and the second potential are connected and the second node changes to the second potential. Next when the first clock comes to the first signal level again, the second node is precharged to the first potential. Accordingly, if the second clock attains the fourth signal level from the third signal level lagging behind the first clock attaining the second signal level from the first signal level, the period in which the second node is at the second potential is shortened by the amount of the lag, and thus the phase lead of the first clock from the second clock can be detected.

In detecting the phase lag of the first clock from the second clock, the phase difference can be detected by open/close of the first and the second switches by the first comparing means, therefore, the phase lag can be detected at high speed. Also, in detecting the phase lead of the first clock from the second clock, the phase difference can be detected by open/close of the third and fourth switches by the first phase comparing means, therefore the phase lead can be detected at high speed.

Accordingly, it has the effect that the structure can be simplified and the phase comparison can be speeded tip.

Preferably, the phase comparator according to the invention further comprises first signal output means for outputting a phase lag signal indicating that the phase of the first clock is lagging behind the phase of the second clock in accordance with exclusive OR of logic provided by potential at the first node and logic provided by the second clock, and second signal output means for outputting a phase lead signal indicating that the phase of the first clock is leading the phase of the second clock in accordance with exclusive OR of logic provided by potential at the second node and logic provided by the first clock.

In the first signal output means according to the invention, for example, when the first and second clocks are at the same frequency and the duty is 50%, the phase lag signal can be outputted from the timing at which the second clock changes from the third signal level to the fourth signal level to the timing at which the first clock changes from the first signal level to the second signal level. Similarly, in the second signal output means, for example, when the first and second clocks are at the same frequency and the duty is 50%, the phase lead signal can be outputted from the timing at which the first clock changes from the first signal level to the second signal level to the timing at which the second clock changes from the third signal level to the fourth signal level. Accordingly, a phase comparator which if suitable for PLL circuits can be configured easily.

Accordingly, in the phase comparator according to the invention, by the first and second signal output means, the phase lag signal can be outputted only from the timing at which the second clock changes from the third signal level to the fourth signal level to the timing at which the first clock changes from the first signal level to the second signal level, the phase lead signal can be outputted only from the timing at which the first clock changes from the first signal level to the second signal level to the timing at which the second clock changes from the third signal level to the fourth signal level, and the configuration of the first and second signal output means is simple, it therefore has the effect that a phase comparator suitable for PLL circuits etc. can be obtained with simple configuration.

Preferably, the phase comparator according to the invention further comprises first signal output means receiving the second clock and the potential at the first node as input and having a third node for outputting a phase lag signal, third precharge means for causing the third node to raise the first potential when the first node is at the second potential and fifth and sixth switch means connected in series between the third node and the second potential for placing the fifth switch means in a conductive state when the second clock is at the fourth signal level and placing the sixth switch means in a conductive state when the first node is at the first potential, and second signal output means receiving the first clock and potential at the second node as input and having a fourth node for outputting a phase lead signal, fourth precharge means for causing the fourth node to raise the first potential when the second node is at the second potential and seventh and eighth switch means connected in series between the fourth node and the second potential for placing the seventh switch means in a conductive state when the first clock is at the second signal level and placing the eighth switch means in a conductive state when the potential at the second node is at the first potential.

In the first signal output means according to the invention, for example, if the first and second clocks are at the same frequency and the duty is 50%, at the timing at when the second clock changes from the third signal level to the fourth signal level, the fifth and the sixth switch implement the conductive state and the third node goes to the fifth signal level, and at the timing at when the first clock changes from the first signal level to the second signal level the sixth switch closes and the third precharge means precharges the third node to the first potential, so that the phase lag signal can be outputted from the timing at when the second clock changes from the third signal level to the fourth signal level to the timing at when the first clock changes from the first signal level to the second signal level.

Similarly, in the second signal output means, for example, if the first and second clocks are at the same frequency and the duty is 50%, at the timing at when the first clock changes from the first signal level to the second signal level the seventh and eighth switches are placed in a conductive state and the fourth node attains the fifth signal level, and at the timing at when the second clock changes from the third signal level to the fourth signal level the eighth switch closes and the fourth precharge means precharges the fourth node to the first potential, therefore the phase lead signal can be outputted only from the timing at when the second clock changes from the third signal level to the fourth signal level to the timing at when the first clock changes from the first signal level to the second signal level. Accordingly, a phase comparator suitable for PLL circuits can be formed easily.

Accordingly, according to the phase comparator of the invention, the phase lag signal can be outputted only from the timing of the second clock changing from the third signal level to the fourth signal level to the timing of the first clock changing from the first signal level to the second signal level, and phase lead signal can be outputted only between the timing of the second clock changing from the third signal level to the fourth signal level and the timing of the first clock changing from the first signal level to the second signal level, and the structure of the first and second signal output means is simple, it therefore has the effect that a phase comparator suitable for PLL circuits etc. can be easily configured with simple structure.

Preferably, the phase comparator according to the invention further comprises first signal holding means for holding the phase lag signal outputted from the first signal output means according to the second clock, and second signal holding means for holding the phase lead signal outputted from the second signal output means according to the first clock.

The first signal holding means according to the invention, for example, holds the phase lag signal of the first signal output means when the second clock changes from the fourth signal level to the third signal level to generate a signal so that the second signal output means dose not erroneously output when the frequency of the first clock differs from that of the second clock.

Similarly, the second signal holding means holds the phase lead signal of the second signal output means when the first clock changes from the second signal level to the first signal level, for example, to generate a signal so as to prevent the first signal output means from erroneously outputting when the first clock and the second clock are different from each other in frequency.

According to the phase comparator of the invention, a signal can be generated for preventing the second signal output means from erroneously outputting when the frequency of the first clock is different from that of the second clock, and a signal can be outputted so that the first signal output means dose not erroneously output when the frequency of the first clock and that of the second clock are different, it therefore has the effect of preventing malfunction of the phase comparator.

Preferably, the phase comparator according to the invention further comprises signal holding means receiving an output of the first signal output means and the second clock as input and having fifth and sixth nodes, fifth precharge means for causing the fifth node to raise the second potential when the second clock is at the fourth signal level, sixth precharge means for causing the sixth node to raise the second potential when the fifth node is at the first potential, ninth and tenth switch means connected in series between the fifth node and the first potential and eleventh and twelfth switch means connected in series between the sixth node and the first potential, for placing the ninth switch means in a conductive state when the second clock is at the third signal level, placing the tenth switch means in a conductive state when output of the first signal output means is at the second potential, placing the eleventh switch means in a conductive state when the second clock is at the third signal level and placing the twelfth switch means in a conductive state when the fifth node is at the second potential, and signal holding means receiving output of the second signal output means and the first clock as input and having seventh and eighth nodes, seventh precharge means for causing the seventh node to raise the second potential when the first clock is at the second signal level, eighth precharge means for causing the eighth node to raise the second potential when the seventh node is at the first potential, thirteenth and fourteenth switch means connected in series between the seventh node and the first potential and fifteenth and sixteenth switch means connected in series between the eighth node and the first potential, for placing the thirteenth switch means in a conductive state when the first clock is at the first signal level, placing the fourteenth switch means in a conductive state when the output of the second signal output means is at the second potential, placing the fifteenth switch means in a conductive state when the first clock is at the first signal level and placing the sixteenth switch means in a conductive state when the seventh node is at the second potential.

In the first signal holding means according to the invention, when the frequency of the first clock is lower as compared with the second clock, for example when the duty is 50% in the first and the second clock, the fifth precharge means precharges the potential at the fifth node to the second potential when the second clock changes from the third signal level to the fourth signal level. When the first clock did not change from the first signal level to the second signal level while the second clock is at the fourth signal level, the first signal output means is outputting the second potential when the second clock changes from the fourth signal level to the third signal level next time, so that the fifth node changes to the second potential. Accordingly, the sixth node is precharged to the second potential by the sixth precharging means. Then that state is held until the fifth node attains the second potential and the second clock goes to the third signal level. Accordingly, the first signal holding means can generate a signal to negate the signal erroneously outputted by the second signal output means because the frequency of the second clock is higher than that of the first clock.

Also, in the second signal holding means, when the frequency of the second clock is lower than that of the first clock, when the duty is 50% in the first and second clocks, for example, the seventh precharge means precharges the potential at the node 7 to the second potential when the first clock changes from the first signal level to the second signal level. Then, if the second clock did not change from the third signal level to the fourth signal level while the first clock is at the second signal level, the second signal output means is outputting the second potential when the first clock changes from the second signal level to the first signal level next time, therefore the seventh node changes to the second potential. Accordingly, the eighth node is precharged to the second potential by the eighth precharge means. Then that state is held until the seventh node changes to the second potential and the first clock goes to the first signal level. Accordingly, the second signal holding means can generate a signal to negate the signal erroneously outputted by the first signal output means because the frequency of the first clock is higher than that of the second clock.

Accordingly, according to the phase comparator of the invention, as the first signal holding means can generate a signal for negating a signal erroneously outputted by the second signal output means because the frequency of the second clock is higher than that of the first clock, and the second signal holding means can generate a signal for negating a signal erroneously outputted by the first signal output means because the frequency of the first clock is higher than that of the second clock, it has the effect of preventing malfunction of the phase comparator due to the difference in frequency between the first clock and the second clock.

Preferably, the phase comparator according to the invention further comprises mask means for limiting output signal so that the first and second signal output means do not output the phase lead signal and the phase lag signal at the same time.

The mask means according to the invention, when the clock duty of the first clock and the clock duty of the second clock are different from each other, controls simultaneous output of the phase lead signal and the phase lag signal from the first and second signal output means to prevent troubles occurring in devices which operate with output of the first and second signal output means of the phase comparator.

Preferably, the phase comparator according to the invention further comprises mask means for limiting an output signal so that the second signal output means dose not output the phase lead signal when the first signal holding means is outputting the phase lag signal and the first signal output means dose not output the phase lag signal when the second signal holding means is outputting the phase lead signal.

The mask means according to the invention can prevent the first signal holding means and the second signal output means from simultaneously outputting the phase lag signal and the phase lead signal, and can also prevent the second signal holding means and the first signal output means from simultaneously outputting the phase lead signal and the phase lag signal, and when used in a PLL circuit, for example, it can give priority to the agreement of frequency.

Accordingly, since the phase comparator of the invention is configured having mask means which controls output signals so that the second signal output means dose not output a phase lead signal when the first signal holding means is outputting a phase lag signal and first signal output means dose not output a phase lag signal when the second signal holding means is outputting a phase lead signal, it can be prevented that the first signal holding means and the second signal output means simultaneously output the phase lag signal and the phase lead signal and that the second signal holding means and the first signal output means simultaneously output the phase lead signal and the phase lag signal, thus producing the effect of giving priority to the agreement of frequency when it is used for a PLL circuit, for example.

Preferably, the phase comparator according to the invention further comprises mask means for limiting output signal so that the first signal output means outputs the phase lag signal when the first signal holding means is outputting the phase lag signal or the second signal output means outputs the phase lead signal when the second signal holding means is outputting the phase lead signal.

With the mask means according to the invention, the first signal output means can output the phase lag signal when the first signal holding means is outputting the phase lag signal, or the second signal output means can output the phase lead signal when the second signal holding means is holding the phase lead signal, thus when used for a PLL circuit it can accelerate the leading-in of frequency.

Accordingly, since the phase comparator of the invention is configured having the mask means for controlling output signal so that the first signal output means outputs the phase lag signal when the first signal holding means is outputting the phase lag signal, or the second signal output means outputs the phase lead signal when the second signal holding means is outputting the phase lead signal, the first signal output means can output the phase lag signal when the first signal holding means is outputting the phase lag signal, or the second signal output means can output the phase lead signal when the second signal holding means is holding the phase lead signal, resulting in the effect of accelerating the leading-in of frequency when used for a PLL circuit, for example.

Preferably, the phase comparator according to the invention further comprises first signal output means for outputting an output signal in accordance with NOT-AND of logic provided by the potential at the first node and logic provided by the second clock, and second signal output means for outputting an output signal in accordance with NOT-AND of logic provided by the potential at the second node and logic provided by the first clock.

As the first signal output means according to the invention takes NOT-AND of output of the first phase comparing means and the logic provided by the second clock, it can make control so that output of the first phase comparing means is provided only when the second clock is at the fourth signal level, for example, or, taking NOT-AND of output of the second phase comparing means and the logic provided by the first clock, it can make control so that output of the first phase comparing means is provided only when the first clock is at the second signal level, for example, therefore the logics of the first and the second signal output means never be true at the same time.

Accordingly, it has the effect of providing a phase comparator suitable for PLL circuits etc. with simple structure.

Preferably, the phase comparator according to the invention further comprises first determining means for determining whether the first clock goes to the second signal level or not when the second clock is at the third signal level if the first clock has not changed from the first signal level to the second signal level when the second clock has been at the fourth signal level, first holding means for holding the defemination result of the first determining means when the second clock changes from the third signal level to the fourth signal level, second determining means for determining whether the second clock goes to the fourth signal level or not when the first clock is at the first signal level if the second clock has not changed from the third signal level to the fourth signal level when the first clock has been at the second signal level, and second holding means for holding the determination result of the second determining means when the first clock changes from the first signal level to the second signal level.

When the first clock did not change from the first signal level to the second signal level when the second clock is at the fourth signal level, the first determining means according to the invention makes determination as to whether the first clock goes to the second signal level or not when the second clock is at the third signal level to determine whether the frequency of the second clock is higher than that of the first clock or not, or whether the clock duty is not 50%, and the first holding means holds the result of determination by the first determining means when the second clock changes from the third signal level to the fourth signal level to output a signal for indicating that the frequencies differ only when the frequency of the second clock is higher than that of the first clock.

In the same way, when the second clock did not change from the third signal level to the fourth signal level when the first clock is at the second signal level, the second determining means makes determination as to whether the second clock goes to the fourth signal level when the first clock is at the first signal level to determine whether the frequency of the second clock is higher than that of the second clock or not, or whether the clock duty is not 50%, and the second holding means holds the result of determination of the second determining means when the first clock changes from the first signal level to the second signal level to output a signal indicating that the frequencies differ only when the frequency of the first clock is higher than that of the second clock.

Accordingly, in the phase comparator of the invention, the first determining means and the first holding means can output signal indicating the difference in frequency only when the frequency of the second clock is higher than that of the first clock and the second determining means and the second holding means can output signal indicating the difference in frequency only when the frequency of the first clock is higher than that of the second clock, resulting in the effect of preventing malfunctions of the phase comparator.

Preferably, in the phase comparator according to the invention, the first holding means is able to output the determination result held therein when the first phase comparing means is outputting the second potential, and the second holding means is able to output the determination result held therein when the second phase comparing means is outputting the second potential.

The first holding means according to the invention limits a period in which held determination result can be outputted to a period in which the first phase comparing means is outputting the second potential, or the second holding means limits a period in which the held determination result can be outputted to a period in which the second phase comparing means is outputting the second potential, to accelerate the agreement of frequency when used for PLL circuits, for example.

Preferably, the phase comparator according to the invention further comprises mask means for outputting NOT-OR of logic provided by output of the first output means and inversion logic of logic provided by the second clock and outputting NOT-OR of logic provided by output of the second output means and inversion logic of logic provided by the first clock.

The mask means according to the invention outputs NOT-OR of logic provided by output of the first output means and inversion logic of the logic provided by the second clock to limit the period in which the first output means outputs the phase lag signal to when the second clock is at the fourth signal level with simple structure, and outputs NOT-OR of logic provided by output of the second output means and inversion logic of the logic provided by the first clock to limit a period in which the second output means outputs the phase lead signal to when the first clock is at the second signal level with simple structure.

Accordingly, in the phase comparator of the invention, the period in which the first output means outputs the phase lag signal can be limited to when the second clock is at the fourth signal level, and the period in which the second output means outputs the phase lead signal can be limited to when the first clock is at the second signal level, resulting in the effect of preventing malfunctions of the phase comparator.

Preferably, in the phase comparator according to the invention, the first phase comparing means further comprises tenth switch means connected in parallel to the second switch means and which goes into a conductive state when output of the second signal output means is at the second potential, and the second phase comparing means further comprises tenth switch means connected in parallel to the fourth switch means and which goes into a conductive state when output of the first signal output means is at the second potential.

The ninth switch means according to the invention is connected to the second switch means in parallel and is placed in a conductive state when output of the second signal output means is at the second potential, and the tenth switch means is connected in parallel to the fourth switch means also and is placed in a conductive state when output of the first signal output means is at the second potential, so that the first signal output means and the second signal output means are prevented from outputting the second potential at the same time.

Accordingly, in the phase comparator of the invention, it can be prevented that the first signal output means and the second signal output means simultaneously output the second potential to produce the effect of preventing occurrence of problems in devices operating with output of the first and second signal output means of the phase comparator.

Preferably, in the phase comparator according to the invention, the first signal level and the third signal level are the same level and the second signal level and the fourth signal level are the same level.

In the phase comparator according to the invention, the first signal level and the third signal level are the same level and the second signal level and the fourth signal level are the same level, therefore the first and the second signal level can be used as the power-supply level of the phase comparator and the first and the second clocks can be directly compared using the same power source, with the result that the device can easily be configured.

Accordingly, the phase comparator of the invention has the effect of facilitating the comparison of the first and the second clock to facilitate fabrication of the phase comparator.

The present invention is also directed to a PLL circuit comprising a digital filter for thinning out signal in a predetermined ratio between a phase comparator and a charge pump.

The digital filter according to the invention thins out signal provided to the charge pump in a predetermined ratio to control high frequency components to ease prevention of malfunction and facilitate stability.

Accordingly, the PLL circuit of the invention has the effect of controlling high frequency components to facilitate the prevention of malfunctions and improve the stability to reduce occupied area of the low-pass filter.

Accordingly, it is an object of the present invention to provide a phase comparator which can perform phase comparison at a high speed with simple structure. It is also an object of the present invention to provide a phase comparator which will not malfunction when used for a PLL circuit. Also, it is an object to make low-pass filters smaller to downsize the PLL circuits.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a timing chart for describing the operation of the phase comparator shown in FIG. 1.

FIG. 4 is a timing chart for describing the operation of the phase comparator shown in FIG. 1.

FIG. 18 is a timing chart illustrating the operation of the phase comparator shown in FIG. 17.

FIG. 23 is a timing chart illustrating the operation of the phase comparator shown in FIG. 22.

FIG. 24 is a timing chart illustrating the operation of the phase comparator shown in FIG. 22.

FIG. 25 is a timing chart illustrating the operation of the phase comparator shown in FIG. 22.

FIG. 26 is a timing chart illustrating the operation of the phase comparator shown in FIG. 22.

FIG. 27 is a timing chart illustrating the operation of the phase comparator shown in FIG. 22.

FIG. 28 is a timing chart illustrating the operation of the phase comparator shown in FIG. 22.

FIG. 30 is a timing chart illustrating the operation of the phase comparator shown in FIG. 29.

FIG. 31 is a timing chart illustrating the operation of the phase comparator shown in FIG. 29.

FIG. 32 is a timing chart illustrating the operation of the phase comparator shown in FIG. 29.

FIG. 33 is a timing chart illustrating the operation of the phase comparator shown in FIG. 29.

FIG. 34 is a timing chart illustrating the operation of the phase comparator shown in FIG. 29.

FIG. 35 is a timing chart illustrating the operation of the phase comparator shown in FIG. 29.

FIG. 40 is a timing chart for illustrating the operation of the phase comparators according to the eleventh through fourteenth preferred embodiments.

FIG. 41 is a timing chart for illustrating the operation of the phase comparators according to the eleventh through fourteenth preferred embodiments.

FIG. 42 is a timing chart for illustrating the operation of the phase comparators according to the eleventh through fourteenth preferred embodiments.

FIG. 43 is a timing chart for illustrating the operation of the phase comparators according to the eleventh through fourteenth preferred embodiments.

FIG. 44 is a timing chart for illustrating the operation of the phase comparators according to the eleventh through fourteenth preferred embodiments.

FIG. 45 is a timing chart for illustrating the operation of the phase comparators according to the eleventh through fourteenth preferred embodiments.

DETAILED DESCRIPTION OF THE PREFERRED EMBODIMENTS

<First Preferred Embodiment>

Figure 1:
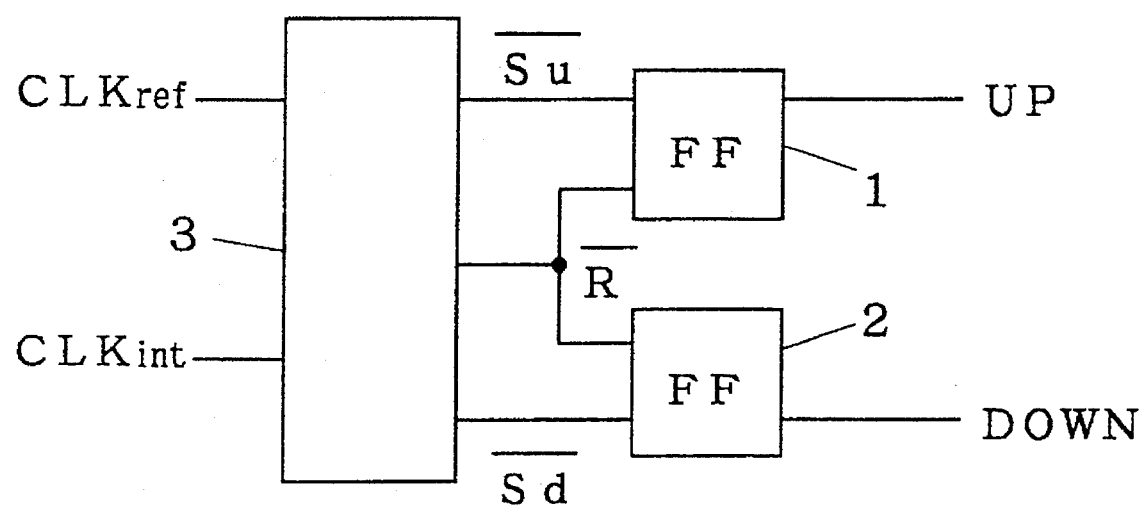
FIG. 1 is a block diagram showing the structure of a phase comparator according to the first preferred embodiment of the present invention.
Figure 2:
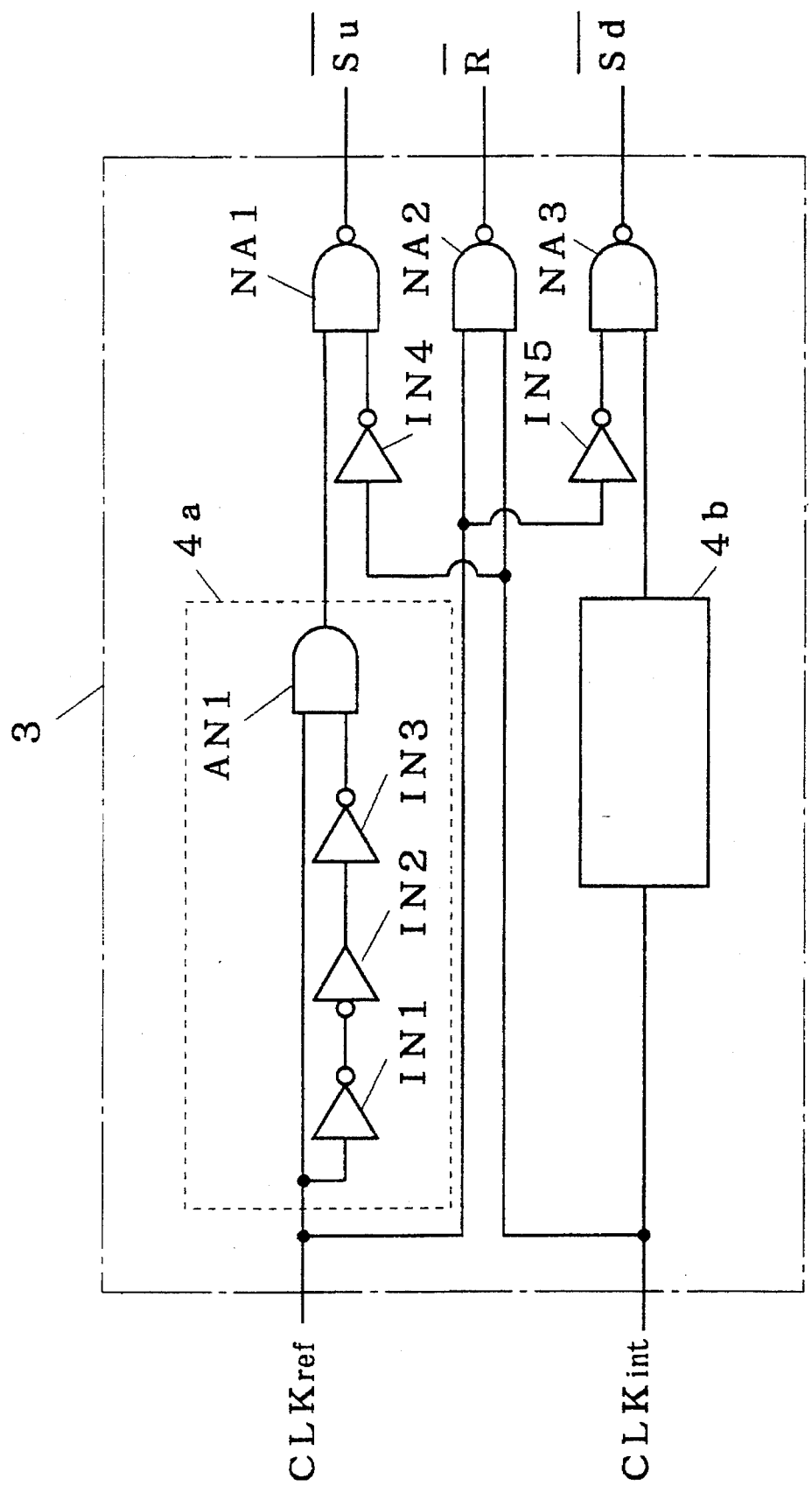
FIG. 2 is a circuit diagram showing the structure of the logic circuit shown in FIG. 1.

A phase comparator according to the present invention will now be described below referring to the figures. FIG. 1 is a block diagram showing the structure of a phase comparator according to the first preferred embodiment of the present invention. In FIG. 1, 1 and 2 denote RS flip-flop circuits receiving set signal S and reset signal R and providing output Q and 3 denotes a logic circuit receiving an input clock CLKref and an internal clock CLKint. As shown in the figure, the phase comparator is composed of the logic circuit 3 and the two FFs 1 and 2. The logic circuit 3 operates on leading edges (rising edges) of the input clock CLKref and the internal clock CLKint and outputs the set input $\overline{Su}$ for the FF 1, the et input $\overline{Sd}$ for the FF 2 and the reset input $\overline{R}$ for the FF 1 and FF 2 according the logic of Table 1.

TABLE 1

| CLKref | CLKint | $\overline{Su}$ | $\overline{Sd}$ | $\overline{R}$ | UP | DOWN |
|---|---|---|---|---|---|---|
| ↑ | 0 | 0 | 1 | 1 | 1 | No change |
| ↑ | 1 | 1 | 1 | 0 | 0 | 0 |
| 0 | ↑ | 1 | 0 | 1 | No change | 1 |
| 1 | ↑ | 1 | 1 | 0 | 0 | 0 |

Among the outputs of the logic circuit 3, the set input $\overline{Su}$ and the reset input $\overline{R}$ are provided to the FF 1. The FF 1 then outputs an output UP indicated Table 1.

If the phase of the internal clock CLKint is advanced with respect to the phase of the input clock CLKref, the FF 1 outputs "1" when (CLKref, CLKint)=(↑, 0), and the FF 1 outputs "0" when (CLKref, CLKint)=(1, ↑). Hence, the output UP becomes "1" only in a period corresponding to the difference of rise between the input clock CLKref and the internal clock CLKint in the phase comparator. The "↑" here represents a rise of a clock pulse.

Also, among the outputs of the logic circuit 3, the set input $\overline{Sd}$ and the reset input $\overline{R}$ are provided to the FF 2. The FF 2 then outputs the output DOWN indicated in Table 1.

If the phase of the internal clock CLKint is lagging with respect to the phase of the input clock CLKref, the FF 2 outputs "1" when (CLKref, CLKint)=(0, ↑), and the FF 2 outputs "0"when (CLKref, CLKint)=(↑, 1). Accordingly, the output DOWN becomes "1" in the phase comparator only in a period corresponding to a difference of rise of clock between the input clock CLKref and the internal clock CLKint.

Next, an example of a configuration of the logic circuit 3 is shown in FIG. 2. In FIG. 2, 4a, 4b denote leading (rising) edge detecting circuits for detecting leading (rising) edges of clock pulses, AN 1 denotes an AND gate, IN 1–IN 5 denote inverters and NA 1–NA 3 denote NAND gates.

The leading (rising) edge detecting circuit 4a includes inverters IN 1–IN 3 connected in series for making an input lagged and inverted and outputting it, and the 2-input AND gate having its one input terminal directly receiving an input and its other input terminal receiving the same input via the inverters IN 1–IN 3 connected in series. The leading (rising) edge detecting circuit 4a inputs the input clock CLKref and provides an output to one input terminal of the NAND gate NA 1. The NAND gate NA 1 then receives the internal clock CLKint at the other input terminal via the inverter IN 4 and outputs the set input $\overline{Su}$.

The leading (rising) edge detecting circuit 4b, having the configuration similar to that of the leading (rising) edge detecting circuit 4a, inputs the internal clock CLKint and provides an output to one input terminal of the NAND gate NA 3. The NAND gate NA 3 then receives the input clock CLKref at the other input terminal via the inverter IN 5 and outputs the set input $\overline{Sd}$. The NAND gate NA 2 receives the input clock CLKref at its one input terminal, and at the same time receives the internal clock CLKint at the other input terminal and outputs the reset input $\overline{R}$.

Figure 51:
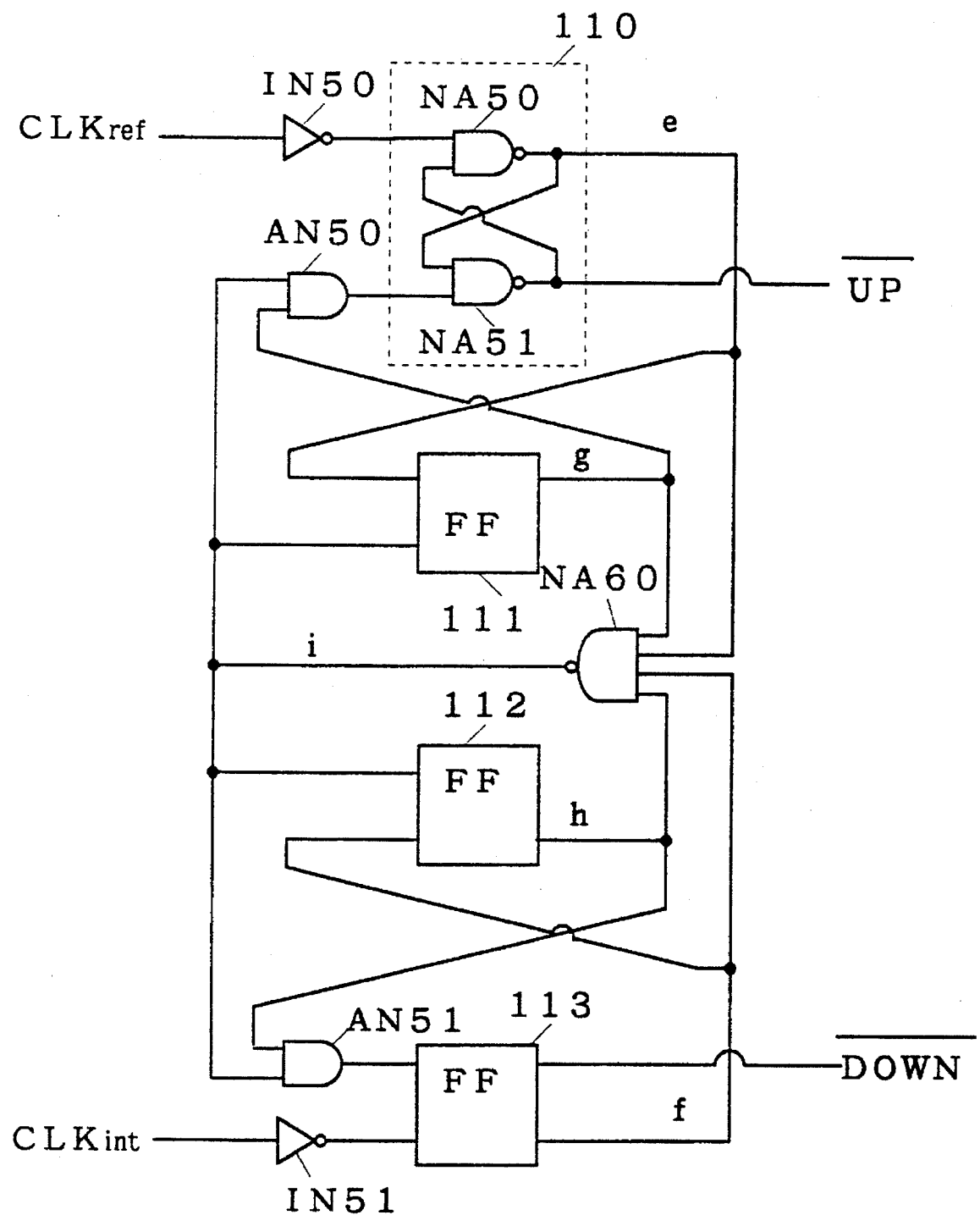
FIG. 51 is a circuit diagram showing an example of the structure of a conventional phase comparator.
Figure 52:
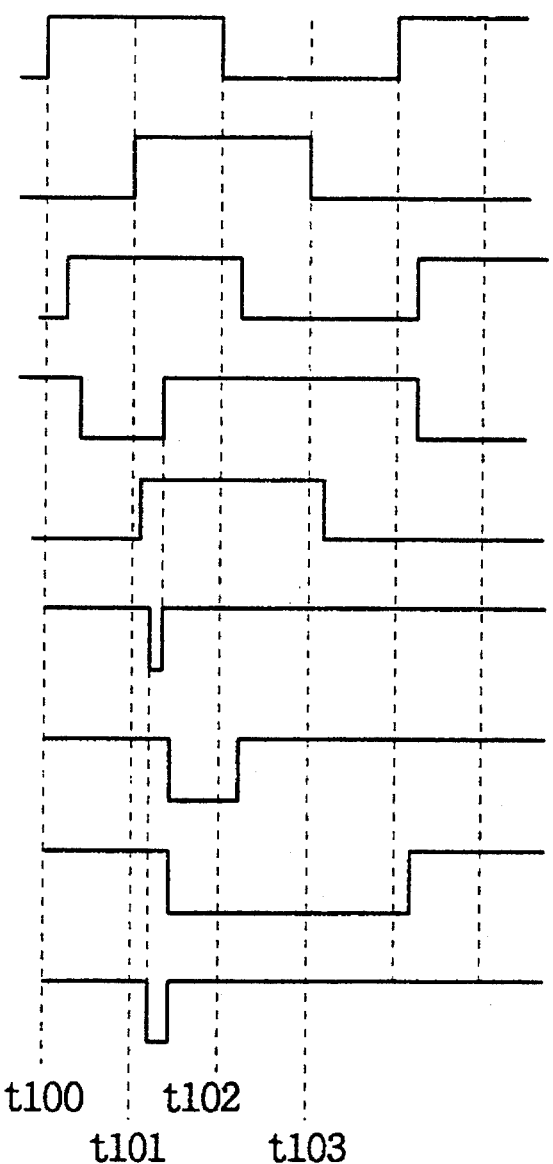
FIG. 52 is a timing chart illustrating the operation of the conventional phase comparator shown in FIG. 50.
Figure 53:
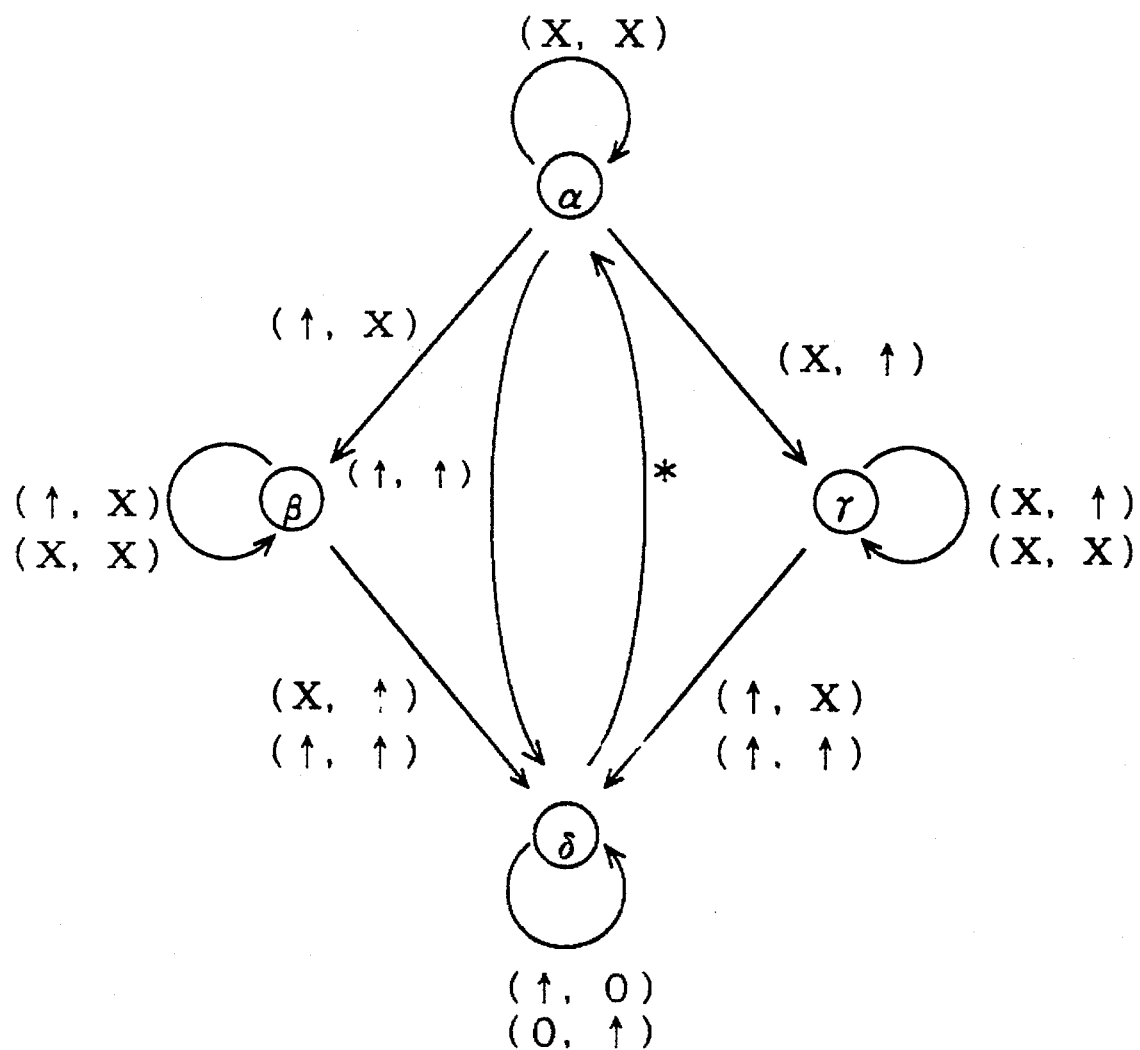
FIG. 53 is a state transition diagram showing the operation of the phase comparator shown in FIG. 51.
Figure 54:
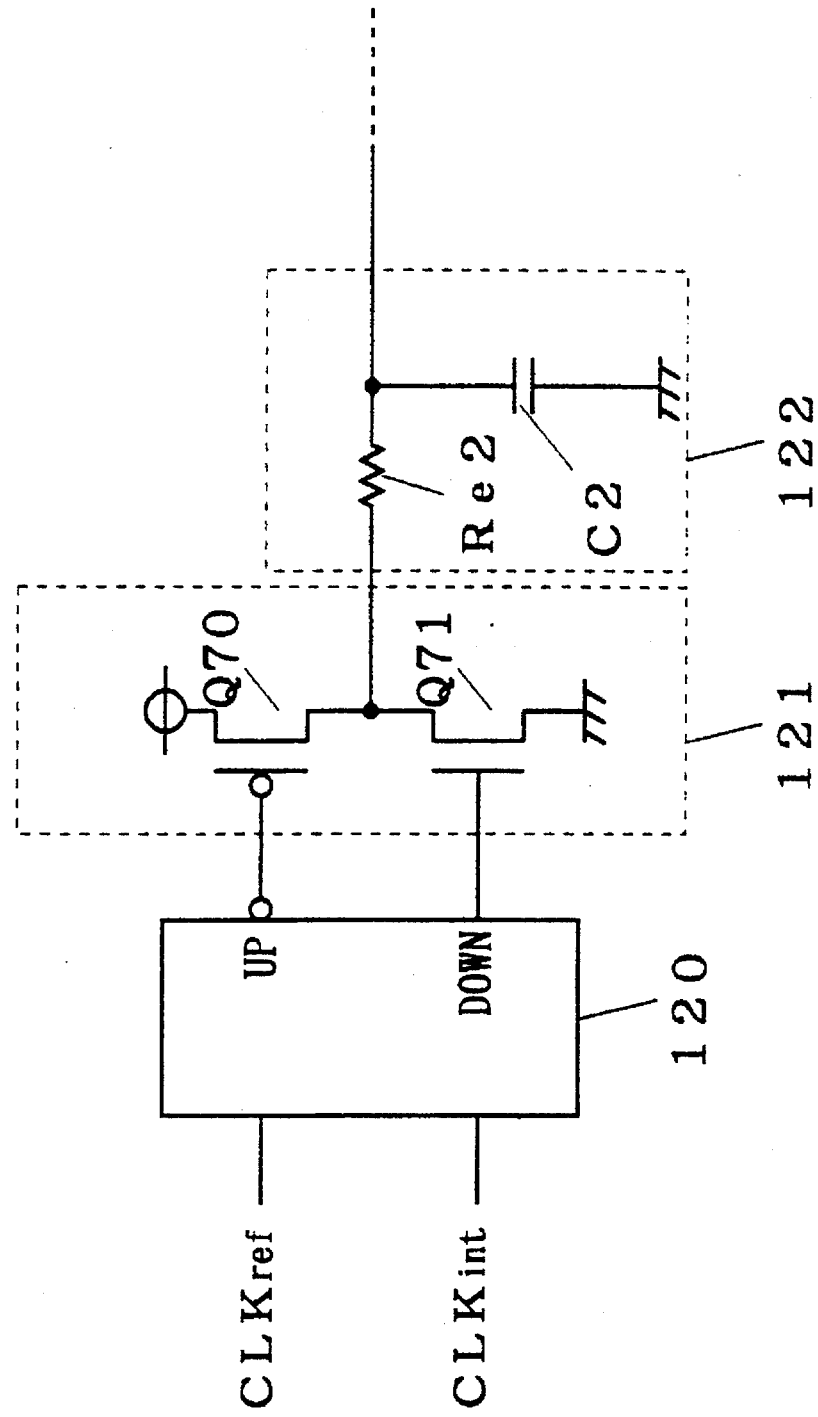
FIG. 54 is a block diagram showing part of the conventional PLL circuit, from the phase comparator to the loop filter.

Now, the structure of the FF 1 and FF 2 receiving outputs of the logic circuit 3 is similar to the flip-flop used in the conventional phase comparing circuit shown in FIG. 51.

Next, the operation of the phase comparator using the logic circuit shown in FIG. 2 will be described referring to FIG. 3 and FIG. 4. First, a description will be made on the case in which the phase of the internal clock CLKint is advanced from the phase of the input clock CLKref referring to the timing chart in FIG. 3. At the time t1, when the input clock CLref only rises from the state in which both the internal clock CLKint and the input clock CLKref are "0", one input terminal of the AND gate AN 1 attains "1". At this time, since the other input terminal of the AND gate AN 1 is at "1" the AND gate AN 1 outputs "1". Accordingly, one and the other input terminals of the NAND gate NA 1 attain "1" and the NAND gate NA 1 outputs "1" as the set input $\overline{Su}$. Also, the NAND gate NA 2 outputs "1" as the reset input $\overline{R}$ since the internal input CLKint is "0". Upon receiving the outputs $\overline{Su}$ and $\overline{R}$ of the logic circuit 3, the output UP attains "1" in the FF 1.

Next, at the time t2, that is, when the lag time of the inverters IN 1–IN 3 has passed after the input clock CLKref rises, one input terminal of the AND gate AN 1 is at "1" and the other terminal thereof goes to "0". Consequently, one input terminal of the NAND gate NA 1 goes to "0" and the output $\overline{Su}$ goes "1". In the FF 1, however, the output UP remains "1".

At the time t3, when the internal clock CLKint rises, the leading edge detecting circuit 4b detects the rise of the internal clock CLKint and outputs "1". At this time, the NAND gate NA 2, attaining "1" at both of its one and the other internal terminals, outputs "0" as the output $\overline{R}$. In the NAND gate NA 3, one input terminal goes to "1" but the other input terminal is at "0", so that it continues to output "1" as the output $\overline{Sd}$.

In the FF 1, the reset input $\overline{R}$ becomes "0" and thus it is reset and the output UP becomes "0".

Next, at the time t4, when the input clock CLKref falls to "0", one input terminal of the NAND gate NA 2 goes "0", and thus the reset input $\overline{R}$ becomes "1". The set input $\overline{Su}$, which does not change to "0" unless it is at a rise because of the edge detecting circuit 4a, continues to output "1". Accordingly, The output UP of the FF 1 does not change and remains at "0". At the time t5, when the internal clock CLKint falls, the other input terminal of the NAND gate NA 2 goes to "0" but the reset input $\overline{R}$ has already changed to "1" at the time t4, therefore it continues to output "1". Furthermore, the set input $\overline{Sd}$, which does not change to "0" unless it is at a rise because of the leading edge detecting circuit 4b, continues to output "1". Accordingly, the output DOWN of the FF 2 continuously remains "0". At the time t6, the same operation as the time t1 is repeated when the input clock CLKref rises.

Next, a description will be made on the case in which the phase of the internal clock CLKint is lagging behind the phase of the input clock CLKref referring to the timing chart of FIG. 4. At the time t7, when only the internal clock CLKint rises from the state in which the internal clock CLKint and the input clock CLKref are both "0", the leading edge detecting circuit 4b detects the rise of the clock pulse and outputs "1". Hence, one and the other input terminals of the NAND gate NA 3 go to "1", and the NAND gate NA 3 outputs "1" as the set input $\overline{Sd}$. The NAND gate NA 2 outputs "1" as the reset input $\overline{R}$ because the internal input CLKref is "0". In the FF 2, receiving these outputs $\overline{Sd}$ and $\overline{R}$ of the logic circuit 3, the output DOWN becomes "1".

Next, at the time t8, a predetermined time has passed from the time t7 and the output of the leading edge detecting circuit 4b becomes "0". One input terminal of the NAND gate NA 3 becomes "0". Accordingly, the output $\overline{Sd}$ of the NAND gate NA 3 becomes "1". In the FF 2, however, the output DOWN is held and stays at "1".

At the time t9, when the input clock CLKref rises, the leading edge detecting circuit 4a detects the rise of the input clock CLKref and outputs "1". Also, at this time, as one and the other input terminals of the NAND gate NA 2 attain "1", it outputs "0" as the output $\overline{R}$. Furthermore, in the NAND gate NA 1, one input terminal attains "1" but the other input terminal is at "0", therefore "1" is continuously outputted as the output $\overline{Su}$. As the reset input $\overline{R}$ becomes "0" in the FF 2 it is reset and the output DOWN becomes "0".

Next, at the time t10, when the internal clock CLKint falls to "0", one input terminal of the NAND gate NA 2 goes to "0" and thus the reset input $\overline{R}$ goes to "1". The set input $\overline{Sd}$ continues to output "1" because it does not change to "0" unless there is a rise because of the edge detecting circuit 4b. Accordingly, the output DOWN of the FF 2 remains "0". At the time t11, when the internal clock CLKint falls, although the other input terminal of the NAND gate NA 2 goes to "0", the reset input $\overline{R}$ has already changed to "1" at the time t4, thus it continues to output "1". The set input $\overline{Sd}$ continues to output "1" because it does not change to "0" when it is not a rise by means of the edge detecting circuit 4b. Accordingly the output UP of the FF 1 does not change and stays at "0". At the time t6, as the input clock CLKref rises and the same operation as that at the time t1 is repeated.

Figure 5:
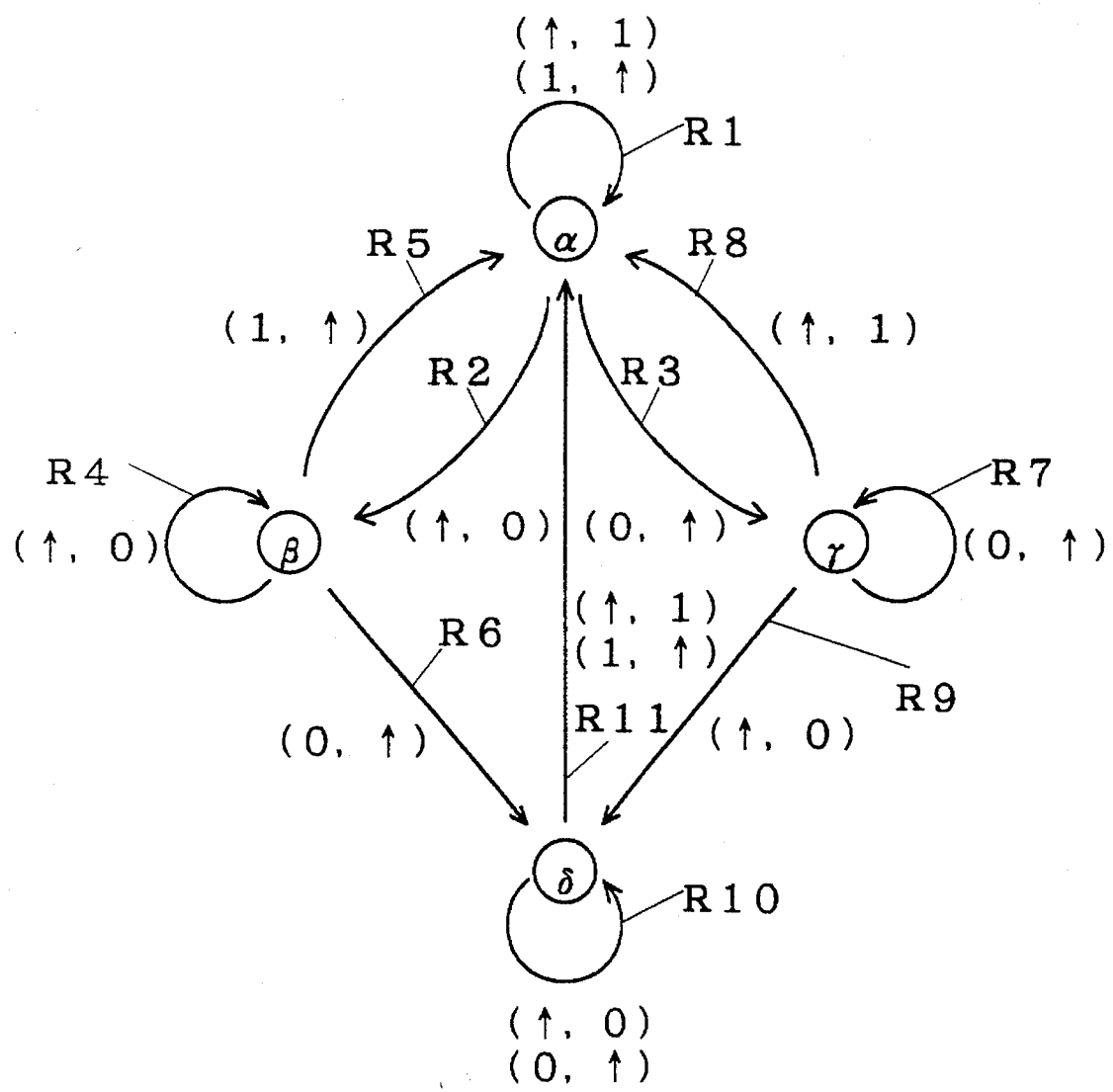
FIG. 5 is a state transition diagram showing operation of the phase comparator according to the first preferred embodiment of the present invention.

The operation described above will be described using the state transition diagram shown in FIG. 5. In the figure, "α" represents a state in which the output UP and the output DOWN are both "0" in the phase comparator, "β" represents a state in which only the output UP is "1" in the phase comparator, "γ" represents a state in which only the output DOWN is "1" in the phase comparator, and "δ" represents a state in which the output UP and the output DOWN are both "1" in the phase comparator.

The "R1" represents that when both the output UP and the output DOWN are "0", if (CLKref, CLKint) becomes (↑, 1) or (1, ↑), i.e., if the input clock CLKref rises with the internal clock CLKint being "1" or the internal clock CLKint rises with the input clock CLKref being "1", the output UP and the output DOWN of the phase comparator do not change and remain "0". The "R2" represents that when both the output UP and the output DOWN are "0" in the phase comparator, if (CLKref, CLKint) becomes (↑, 0), the output UP changes from "0" to "1". The "R3" represents that when both the output UP and the output DOWN are "0" in the phase comparator if (CLKref, CLKint) becomes (0, ↑), the output DOWN changes from "0" to "1".

The "R4" represents that in the phase comparator when only the output UP is "1", if (CLKref, CLKint) becomes (↑, 0), the output UP and the output DOWN do not change and remain at "0" and "1", respectively. The "R5" represents that in the phase comparator when only the output UP is "1", if (CLKref, CLKint) becomes (1, ↑), the output UP changes from "1" to "0". The "R6" represents that in the phase comparator when only the output UP is "1", if (CLKref, CLKint) becomes (0, ↑), the output DOWN changes from "0" to "1".

The "R7" represents that in the phase comparator when only the output DOWN is "1", if (CLKref, CLKint) becomes (0, ↑), the output UP and the output DOWN do not change and stay at "0" and "1", respectively. The "R8" represents that in the phase comparator, when the output DOWN only is "1", if (CLKref, CLKint) becomes (↑, 1), the output DOWN changes from "1" to "0". The "R9" represents that in the phase comparator when the output DOWN only is "1", if (CLKref, CLKint) becomes (↑, 0), the output UP changes from "0" to "1".

Also, "R10" represents that in the phase comparator when the output UP and the output DOWN are both "1", even if (CLKref, CLKint) goes to (↑, 0) or (0, ↑), i.e., even if the input clock CLKref rises with the internal clock CLKint being "0" or even if the internal clock CLKint rises with the input clock CLKref being "0", the output UP and the output DOWN of the phase comparator do not change remaining "1". The "R11" represents that in the phase comparator when both the output UP and the output DOWN are "1", if (CLKref, CLKint) becomes (↑, 1) or (1, ↑), both the output UP and the output DOWN change from "1" to "0".

Immediately before the time t1, the phase comparator is in the state α. Then, at the time t1, as (CLKref, CLKint) becomes (↑, 0), it goes to the state β through the path R2. At the time t3, (CLKref, CLKint) becomes (1, ↑), and then it goes in the state α through the path R5. At the time 6, (CLKref, CLKint) becomes (↑, 0), and then it gets in the state β through the path R2 again.

Immediately before the time t8, the phase comparator is in the state α. Then at the time t8, (CLKref, CLKint) becomes (0, ↑), and then it is put into the state γ through the path R3. At the time t9, (CLKref, CLKint) becomes (↑, 1) and then it is put in the state α through the path R8. At the time t8, (CLKref, CLKint) becomes (0, ↑), and then it is put in the state γ through the path R2 again.

As described above, since the phase comparator according to the first preferred embodiment of the present invention compares only a rise of clock pulses, there exist only the paths R1, R2, R3, R4, R5, R7 and R8 when comparing clocks with the same frequency, and the phase lag is directly detected by the paths R2 and R5 and the phase lead is directly detected by the paths R3 and R8, it therefore operates at very high speed without causing malfunctions.

When comparing clock pulses with different frequencies, however, it may be put into the state δ where the output UP and the output DOWN are simultaneously outputted as the paths R6 and R9 exist. If a trouble occurs in a device using the phase comparator due to the state δ where the output UP and the output DOWN are simultaneously outputted, a protection circuit must be provided as will be described later.

As stated above, the phase comparator described in the first preferred invention has a configuration in which output of flip-flops is not fed back to input differing from the conventional phase comparators, therefore the state transition time of FF is equal to the delay peculiar to the FF and it can be operated at very high speed though there exists delay of the logic circuit 3.

<Second Preferred Embodiment>

Figure 6:
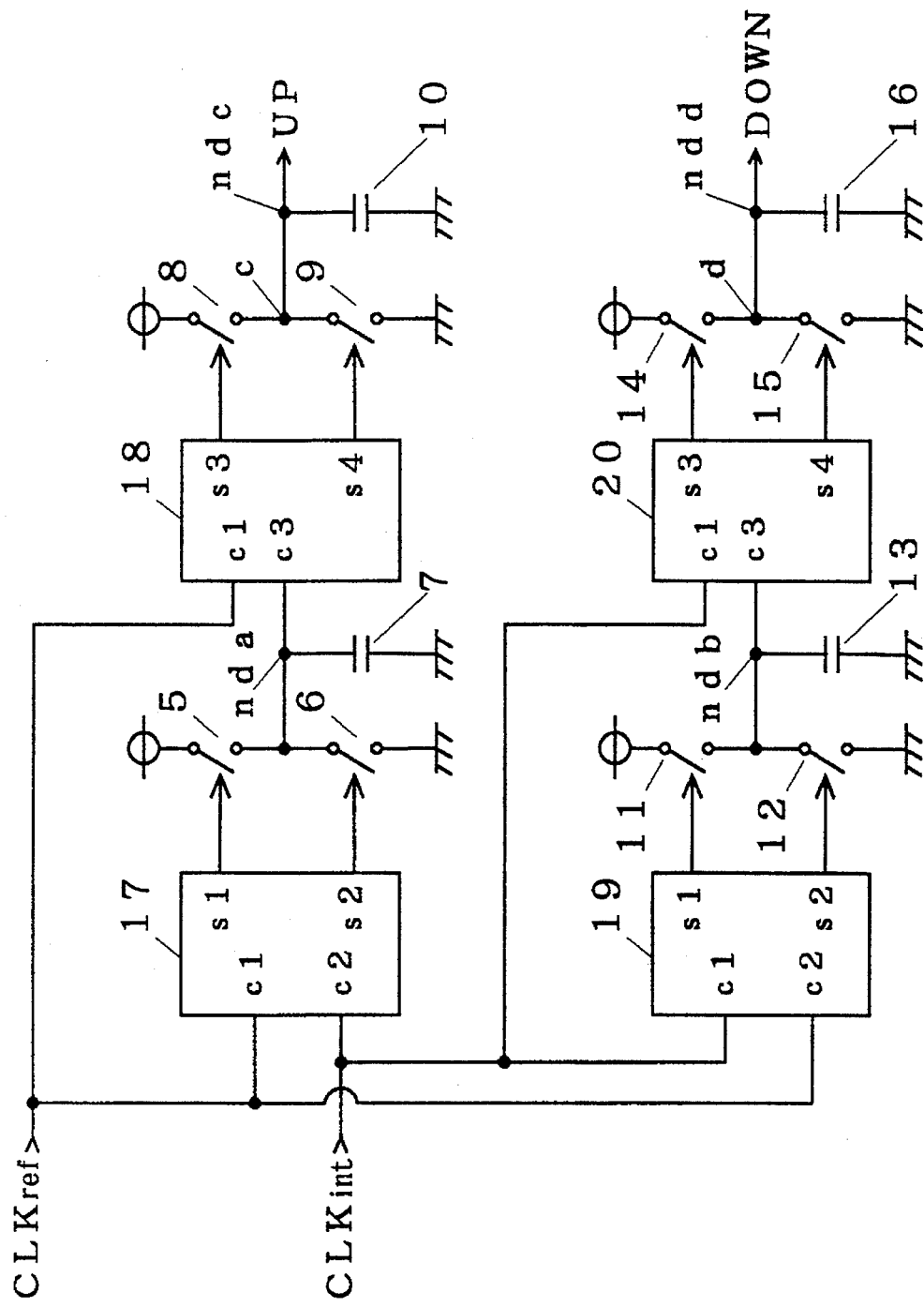
FIG. 6 is a circuit diagram showing the structure of a phase comparator according to the second preferred embodiment of the present invention.

Next, the second preferred embodiment of the present invention will be described using FIGS. 6 through 9. FIG. 6 is a block diagram showing a phase comparator according to the second preferred embodiment of the present invention. The phase comparator of the second preferred embodiment has the circuit configuration of the switched capacitor type which takes digital values. The phase comparator includes four paths each composed of two switches connected in series between two power sources and a capacitance of an output node. The capacitance here may be parasitic capacity of interconnection or connection elements. In the figure, 5 and 6 denote switches connected in series between two power sources, nda denotes an output node to which the switches 5 and 6 are connected, 7 denotes a capacitance set between the output node nda and the power source on the low potential side, 8 and 9 denote switches connected in series between the two power sources, ndc denotes an output node to which the switches 8 and 9 are connected, 10 denotes a capacitance set between the output node ndc and the power source on the low potential side, 11 and 12 denote switches connected in series between two power sources, ndb denotes an output node to which the switches 11 and 12 are connected, 13 denotes a capacitance set between the output node ndb and the power source on the low potential side, 14 and 15 denote switches connected in series between the two power sources, ndd denotes an output node to which the switches 14 and 15 are connected, and 16 denotes a capacitance set between the output node ndd and the power source on the low potential side. The switches 5, 6, 8, 9, 11, 12, 14 and 15 are assumed to be in the conductive state while the signal "1" is inputted.

Also, in FIG. 6, 17 denotes a control circuit for providing control signals s1 and s2 to the switches 5 and 6 to control them, 18 denotes a control circuit for providing control signals s3 and s4 to the switches 8 and 9 to control them, 19 denotes a control circuit for providing the control signals s1 and s2 to the switches 11 and 12 to control them, and 20 denotes a control circuit for providing the control signals s3 and s4 to the switches 14 and 15 to control them. The control circuits 17 and 19 operate according to the logic in Table 2 and the control circuits 18 and 20 operate according to the logic in Table 3, respectively.

TABLE 2

| C1 | C2 | S1 | S2 | a/b |
|---|---|---|---|---|
| 0 | * | 0 | 1 | 0 |
| 1 | all0 | 0 | 0 | 0 |
| 1 | all1 | 1 | 0 | 1 |
| 1 | 0→1 | 0→1 | 0 | 0→1 |
| 1 | 1→0 | 1→0 | 0 | 1 |

TABLE 3

| C1 | C3 | S3 | S4 | U/D |
|---|---|---|---|---|
| 0 | 0 | 0 | 0 | No change |
| 1 | 0 | 1 | 0 | 1 |
| 1 | 1 | 0 | 1 | 0 |
| 1 | 0→1 | 1→0 | 0→1 | 1→0 |

Figure 7:
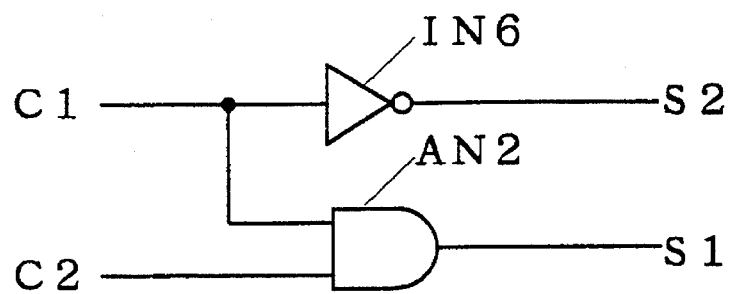
FIG. 7 is a circuit diagram showing the structure of the control circuit shown in FIG. 6.
Figure 8:
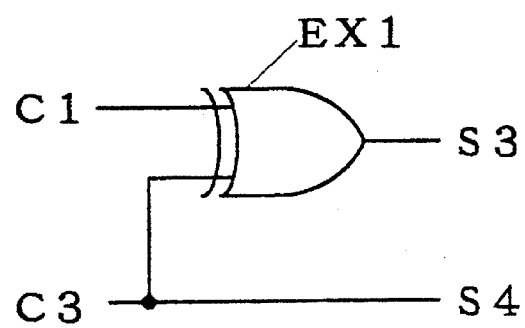
FIG. 8 is a circuit diagram showing the structure of the control circuit shown in FIG. 6.

FIG. 7 is a logic circuit diagram showing an example of a configuration of the control circuits 17 and 19. The signal s2 is generated by inverting the signal c1 in an inverter IN 6. The signal s1 is obtained by ANDing the inputted signal c1 and signal c2 in an AND gate AN 2. FIG. 8 is a logic circuit diagram showing an example a of configuration of the control circuits 18 and 19. The signal s3 is obtained by taking exclusive OR of the signal c1 and the signal c3 in the EXOR gate EX 1.

Figure 9:
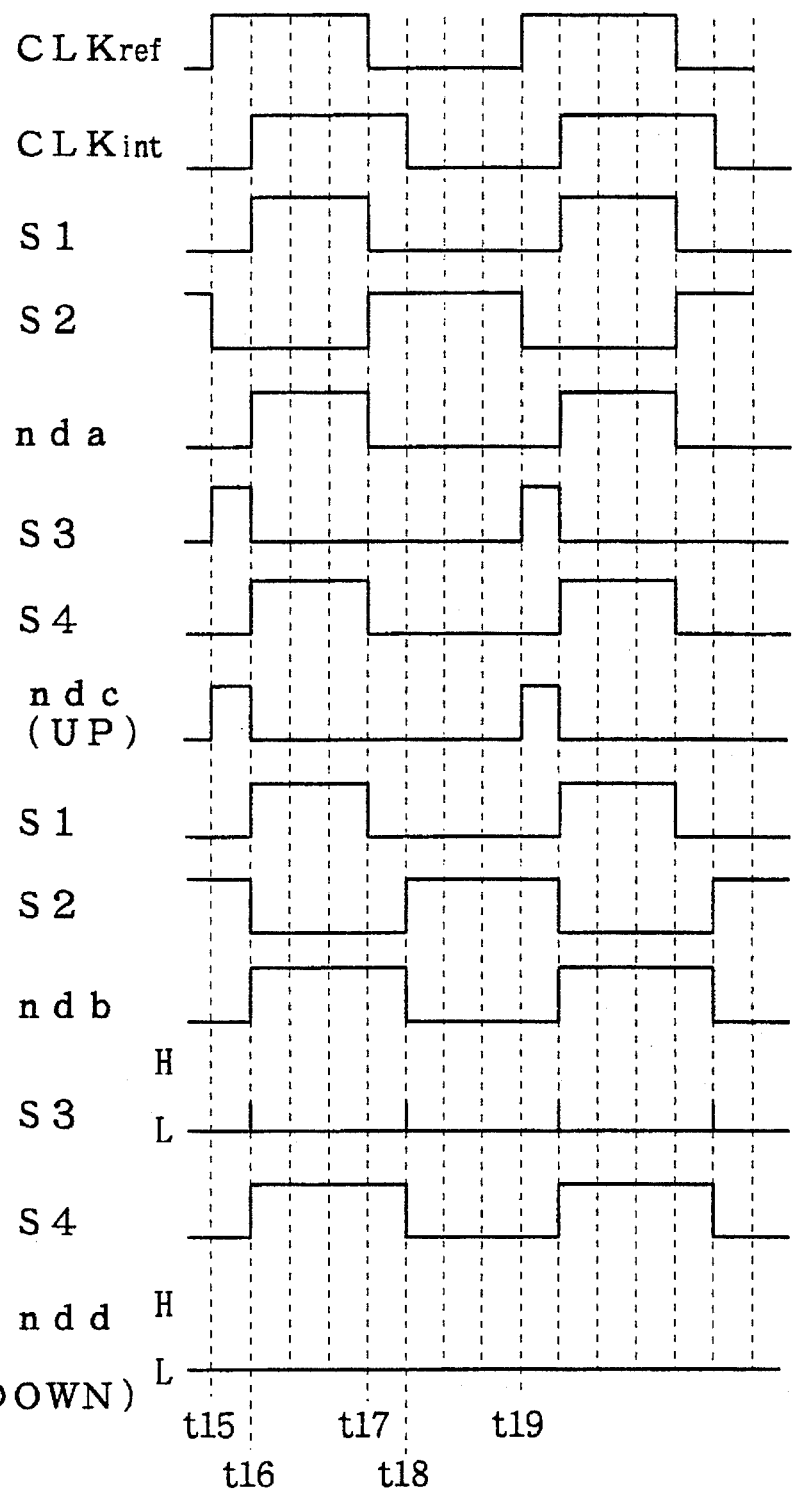
FIG. 9 is a timing chart for describing operation of the phase comparator shown in FIG. 6.

Next, the operation of this phase comparator will be described according to the timing chart of FIG. 9. At the time t15, when the input clock CLKref rises, the output s2 of the control circuit 17 falls from "1" to "0" since it is an inversion signal of the input clock CLKref. The output s1 of the control circuit 17, which is AND of the input clock CLKref and the internal clock CLKint, remains at "0". Accordingly, the switches 5 and 6 are both open and the output node nda maintains the state "0" as it is.

Also, in the control circuit 18, since the input clock CLKref is the signal c1 and the value of the output node nda is the signal c3, the output signal s3 is "1" and the signal s4 is "0". Thus the switch 8 is closed and the switch 9 is open, and the output node ndc (output UP) becomes "1".

On the other hand, the output s2 of the control circuit 19, which is an inversion signal of the internal clock CLKint, stays at "1". The output s1 of the control circuit 19, which is AND of the input clock CLKref and the internal clock CLKint, stays at "0". Accordingly, the switch 12 is closed and the switch 11 is open, and the output node ndb maintains "0" as it is.

In the control circuit 20, since the internal clock CLKint is the signal c1 and the value at the output node ndb is the signal c3, both the output signal s3 and the signal s4 are "0". Accordingly, both the switches 14 and 15 are "0", and thus the output node ndd (output DOWN) maintains "0".

Next, at the time t16, when the internal clock CLKint rises, the output s2 of the control circuit 17 remains "0" because it is an inversion signal of the input clock CLKref, and the output s1 of the control circuit 17 changes from "0" to "1" because it is AND of the input clock CLKref and the internal clock CLKint. Thus the switch 5 is closed and the switch 6 is open, and the output node nda receives supply of electric charge to attain "1".

In the control circuit 18, when the value at the output node nda changes from "0" to "1", the signal s3 changes from "1" to "0" and the signal 4 changes from "0" to "1". Accordingly, the switch 8 opens and the switch 9 closes, and so the output node ndc (output UP) changes to "0".

On the other hand, the output s2 of the control circuit 19 changes from "1" to "0" since it is an inversion signal of the internal clock CLKint. The output s1 of the control circuit 19, which is AND of the input clock CLKref and the internal clock CLKint, changes from "0" to "1". Accordingly, the switch 12 opens and the switch 11 closes, and the output node ndb changes from "0" to "1".

In the control circuit 20, the signal c1 changes as the internal clock CLKint rises, and the output signal s3 maintains "0" but impulse occurs instantaneously. The signal s4 is "1". The switch 14 is thus opened and the switch 15 is closed, hence the output node ndd (output DOWN) maintains "0".

Next, at the time t17, when the input clock CLKref falls, the output s2 of the control circuit 17 changes from "0" to "1" since it is an inversion signal of the input clock CLKref, and the output s1 of the control circuit 17 changes from "1" to "0" since it is AND of the input clock CLKref and the internal clock CLKint. Accordingly, the switch 5 opens and the switch 6 closes, and thus the output node nda goes "0".

In the control circuit 18, the signal s3 maintains "0" even if the value at the output node nda changes from "1" to "0". In the control circuit 18, however, the signal s4 changes from "1" to "0". Accordingly, both the switches 8 and 9 open and hence the output node ndc (output UP) maintains "0".

On the other hand, the output s2 of the control circuit 19 dose not change from "0" because it is an inversion signal of the internal clock CLKint. The output s1 of the control circuit 19 changes from "1" to "0" because it is AND of the input clock CLKref and the internal clock CLKint. Accordingly, the output node ndb maintains "1" as it is because both of the switches 11 and 12 are open.

Also, in the control circuit 20, the signal c1 does not change since the internal clock CLKint is continuously "1" and the output signal s3 remains at "0". The signal s4 maintains "1". Accordingly, the switch 14 opens and the switch 15 is closed, and therefore the output node ndd (output DOWN) maintains "0".

Next, at the time 18, as the internal clock CLKint falls, the output s2 of the control circuit 17 maintains "0" since the input clock CLKref does not change, and the output s1 of the control circuit 17 stays at "0" because it is AND of the input clock CLKref and the internal clock CLKint. Accordingly, the switches 5 and 6 are open and thus the output node nda stays at "0".

In the control circuit 18, the value of the output node nda is maintained at "0" and the signals s3 and s4 maintain "0". Accordingly, the output node ndc (output UP) maintains "0" as both the switches 8 and 9 are open.

On the other hand, the output s2 of the control circuit 19, being an inversion signal of the internal clock CLKint, changes from "0" to "1". The output signal s1 of the control circuit 19, being AND of the input clock CLKref and the internal clock CLKint, does not change from "0". Accordingly, as the switch 11 opens but the switch 12 is closed, the output node ndb changes from "1" to "0".

Also, in the control circuit 20, the internal clock CLKint changes from "1" to "0" so that the output signal s3 is maintained at "0", but impulse is generated instantaneously. The signal s4 changes from "1" to "0". Consequently, the switch 14 opens and the switch 15 opens, too, but the output node ndd (output DOWN) maintains "0". Next, at the time t19, the same operation as that at the time t15 is repeated. The state transition is as illustrated in the state transition diagram of FIG. 5 as in the phase comparator shown in the first preferred embodiment.

To summarize the operation of the phase comparator according to the second preferred embodiment, the previous stage is reset and the following stage laches a value immediately before while the input clock CLKref and the internal clock CLKint are "0". While the input clock CLKref and the internal clock CLKint are "1", the previous stage detects the leading (rising) edge of the internal clock CLKint and the input clock CLKref and the following stage operates as an inverter. By thus providing reset periods, change of data only in one direction can be transferred.

Now, if s1 and s2 are interchanged in Table 2, the values of the output node nda and the output node ndb are inverted to implement precharge but not reset. Also, if s3 and s4 are interchanged in Table 3, the values of UP and DOWN are inverted to implement buffer but not inverter.

Although a single switch is provided between the capacitance and each power source in the phase comparator shown in FIG. 6, two may be provided in series/parallel in combination with control logic.

As described above, since the phase comparator according to the second preferred embodiment directly compares the input clock CLKref and the internal clock CLKint using AND gates in the control circuits 17 and 19, it can operate at very high speed.

<Third Preferred Embodiment>

Figure 10:
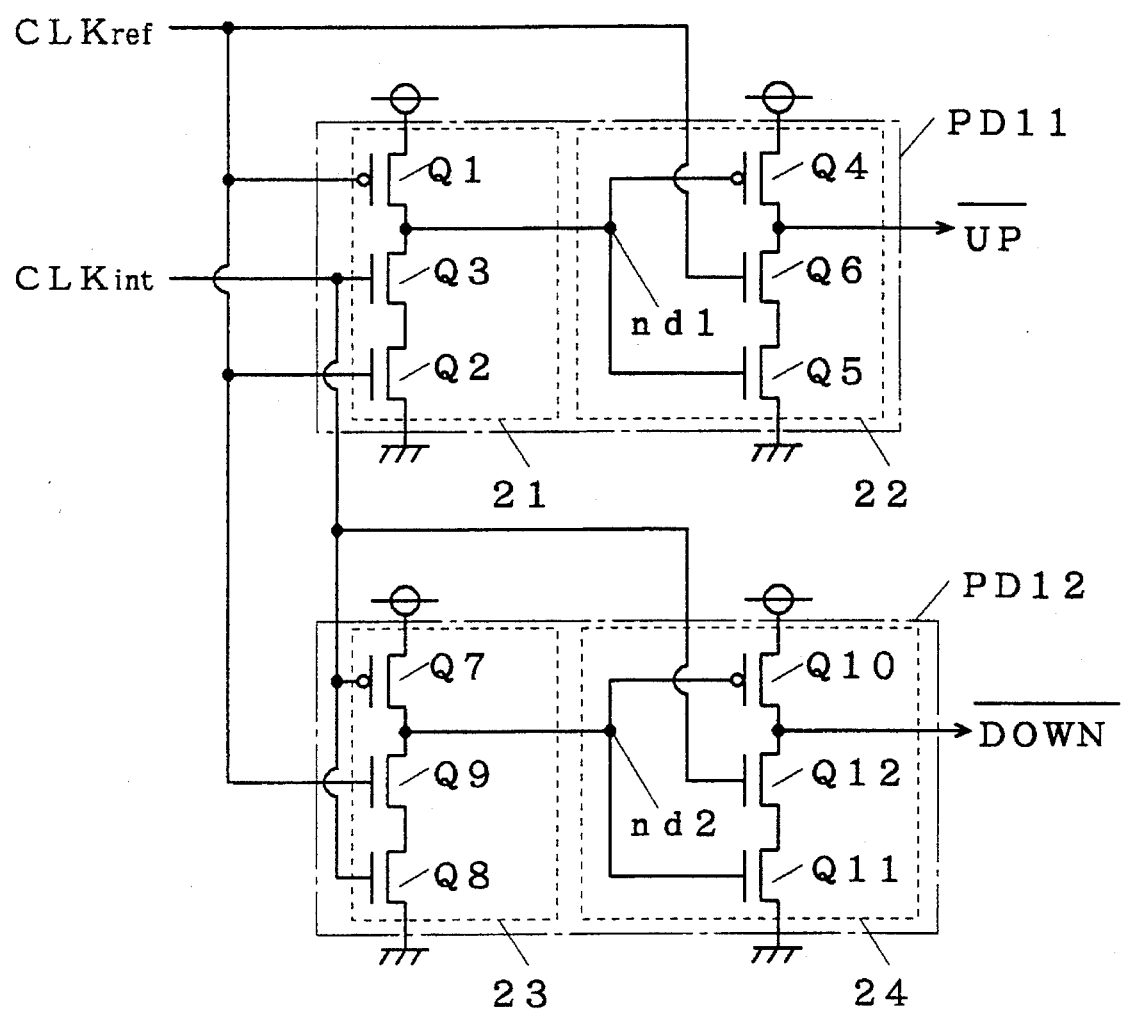
FIG. 10 is a circuit diagram showing the structure of a phase comparator according to the third preferred embodiment of the present invention.

Next, a phase comparator according to the third preferred embodiment of the present invention is shown in FIG. 10.

FIG. 10 is a circuit diagram illustrating the configuration of the phase comparator according to the third preferred embodiment of the present invention. The phase comparator of the third preferred embodiment has a circuit configuration of the precharge type using phase comparing portions PD 11 and PD 12 which are dynamic single-phase latches using no inversion clock. It is composed of paths 21–24 each having one P-channel transistor and two N-channel transistors connected in precharge NAND form in series.

The path 21 includes a P-channel transistor Q1 having its source connected to a power source on the high potential side, its drain connected to a node nd1 and its gate receiving input clock CLKref, an N-channel transistor Q2 having its source connected to the power source on the low potential side, its drain and its gate receiving the input clock CLKref, and an N-channel transistor Q3 having its source connected to the drain of the transistor Q2, its drain connected to the node nd1 and its gate receiving the internal clock CLKint.

The path 22 includes a P-channel transistor Q4 having its source connected to the power source on the high potential side, its drain and its gate connected to the node nd1, an N-channel transistor Q5 having its source connected to the power source on the low potential side, its drain and its gate connected to the node nd1, and an N-channel transistor Q6 having its source connected to the drain of the transistor Q5, its drain connected to the drain of the transistor Q4 and its gate receiving the input clock CLKref.

The path 23 includes a P-channel transistor Q7 having its source connected to the power source on the high potential side, its drain connected to a node nd2 and its gate receiving the internal clock CLKint, an N-channel transistor Q8 having its source connected to the power source on the low potential side, its drain and its gate receiving the internal clock CLKint, and an N-channel transistor Q9 having its source connected to the drain of the transistor Q8, its drain connected to the node nd2 and its gate receiving the input clock CLKref.

The path 24 includes a P-channel transistor Q10 having its source connected to the power source on the high potential side, its drain and its gate connected to the node nd2, an N-channel transistor Q11 having its source connected to the power source on the low potential side, its drain and its gate connected to the node nd2, and an N-channel transistor Q12 having its source connected to the drain of the transistor Q11, its drain connected to the drain of the transistor Q10 and its gate receiving the internal clock CLKint.

Figure 11:
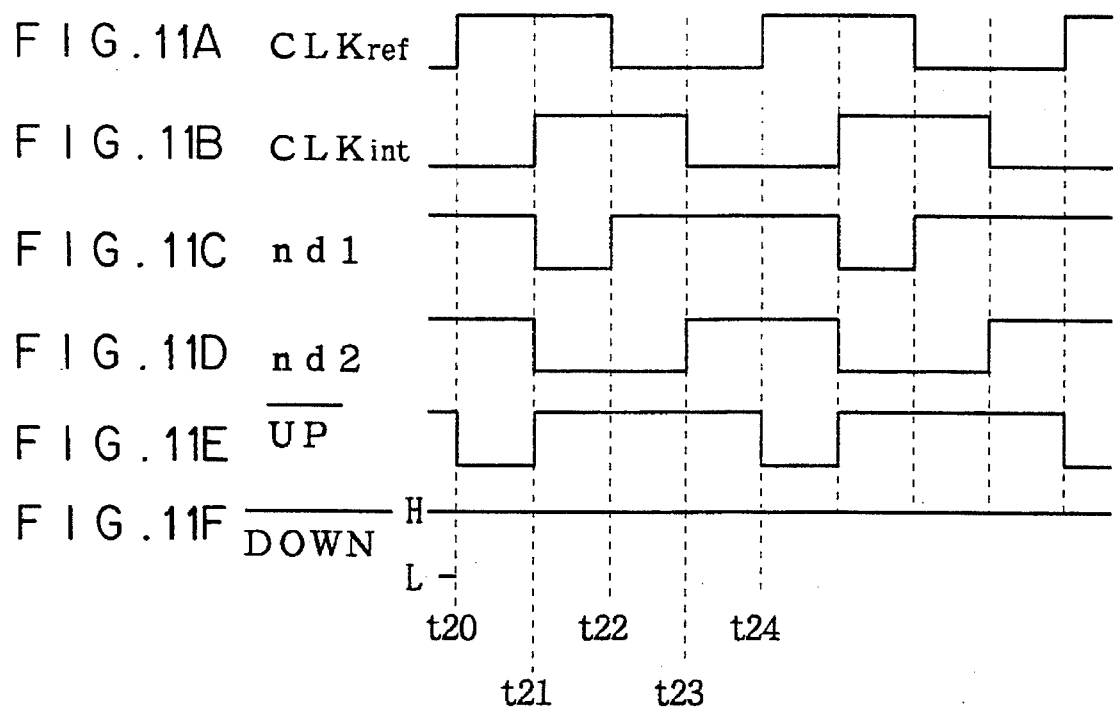
FIG. 11 is a timing chart illustrating the operation of the phase comparator shown in FIG. 10.
Figure 12:
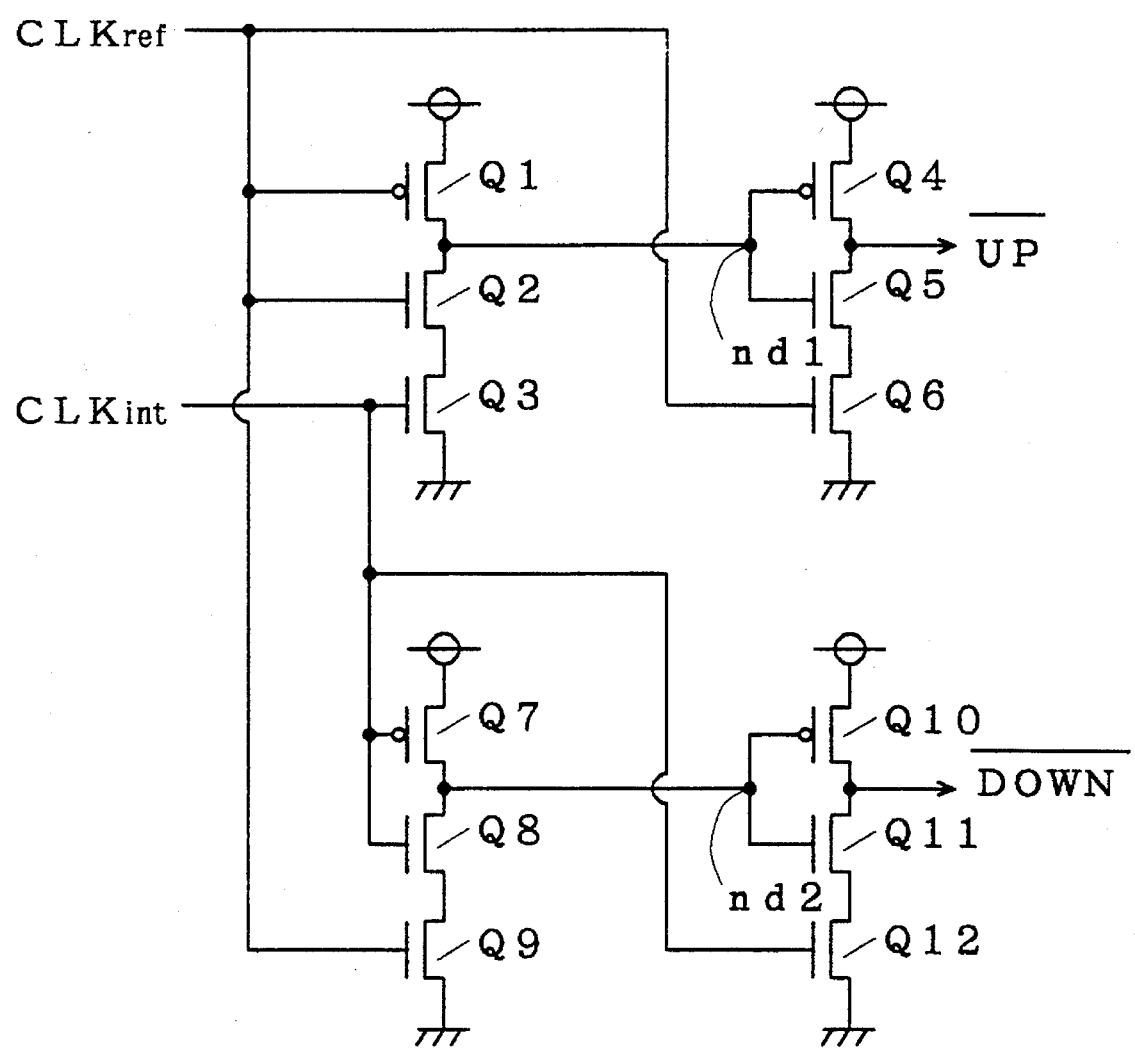
FIG. 12 is a circuit diagram showing the structure of the phase comparator according to the third preferred embodiment of the present invention.

Next, the operation of this circuit is described along the timing chart of FIG. 11 and FIG. 12.

FIG. 11 illustrates the case where the internal clock CLKint lags behind the input clock CLKref. Immediately before the time t20, when the input clock CLKref and the internal clock CLKint are "0", the P-channel transistors Q1 and Q7 are ON and the paths 21 and 23 are precharged. Then the node nd1 and the node nd2 are at "1", and the paths 22 and 24, with the P-channel transistors Q4 and Q10 turning off and the N-channel transistors Q6 and Q12 being OFF, are in the high impedance state.

At the time t20, when the input clock CLKref rises, the transistors Q2 and Q9 are placed into the ON state, but since the transistors Q3 and Q8 are OFF, the state of the paths 21 and 23 does not change. However, the transistor Q6 turns on and thus the output $\overline{UP}$ becomes "0". On the other hand, the transistor Q12 maintains OFF in the path 24 and the output $\overline{DOWN}$ maintains "1".

At the time t21, if the internal clock CLKint rises when the input clock CLKref is "1", the transistor Q3 turns on in the path 21 and the node nd1 goes to "0". Accordingly, the transistor Q5 turns off and the transistor Q4 turns on in the path 22, so that the output $\overline{UP}$ becomes "1". Similarly, the output $\overline{DOWN}$ also maintains "1".

At the time t22, when the input clock CLKref falls the transistor Q2 turns off and the transistor Q1 turns on and the node nd1 is precharged to attain "1". At the same time, in the path 22, the transistors Q4 and Q6 turn off to be in the high impedance state.

At the time t23, when the internal clock CLKint falls, the transistor Q8 turns off, the transistor Q7 turns on and the node nd2 is precharged to attain "1". At the same time, in the path 23, the transistors Q10 and Q12 turn off to be in the high impedance state. Then at the time t24, the same operation as that at the time t20 is repeated.

Next, the operation in the case where the internal clock CLKint is ahead of the input clock CLKref, where the internal clock CLKint and the input clock CLKref are interchanged with each other, can be described as the operation in which the operations of the path 21 and the path 23 are interchanged, the operations of the path 22 and the path 24 are interchanged, and the output $\overline{UP}$ and the output $\overline{DOWN}$ are interchanged.

In this circuit, the phase is compared on leading (rising) edge of clock pulse so that trailing edge (falling edge) of either one can come first. The output $\overline{UP}$ is thus outputted only in the period corresponding to the phase difference of the input clock CLKref and the internal clock CLKint. On the other hand, if the internal clock CLKint attains "1" first, the output $\overline{DOWN}$ is outputted contrary to the above.

In this circuit, the input clock CLKref and the internal clock CLKint are compared by transistors connected in series, therefore even small phase differences close to the switching time of transistor can be detected. That is to say, a phase comparator capable of high speed operation can be obtained.

The phase comparator shown in FIG. 12 has only a difference that gate inputs of the two N-channel transistors connected in series are opposite, i.e., the order of each interconnection of the transistors Q2 and Q3, the transistors Q5 and Q6, the transistors Q8 and Q9 and the transistors Q11 and Q12 differ, but operates in the same way as the circuit of FIG. 11.

Figure 13:
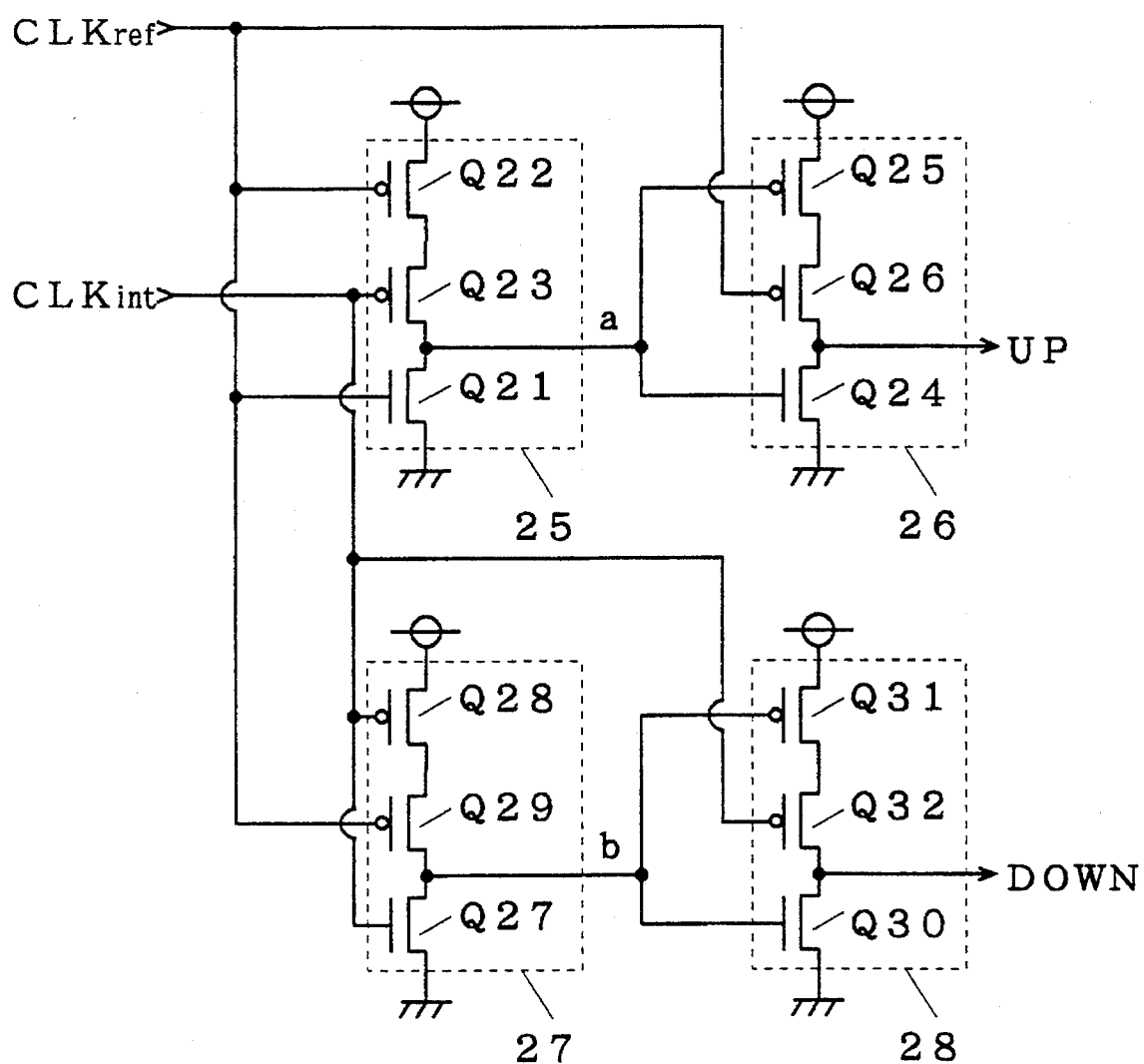
FIG. 13 is a circuit diagram showing the structure of a phase comparator according to another implementation of the third preferred embodiment of the present invention.

FIG. 13 is a circuit diagram illustrating a phase comparator according to another implementation of the third preferred embodiment of the present invention. The circuit of FIG. 13 has a configuration which is complementary to the circuit shown in FIG. 10. The phase comparator according to another implementation of the third preferred embodiment also has the circuit configuration of the precharge type using dynamic single-phase latch using no inversion clock. It is composed of paths 25–28 each having two P-channel transistors and a single N-channel transistor precharge NAND connected in series. These paths 25–28 are different from the paths 21–24 shown in FIG. 10 in that the precharged state is a state of outputting "0".

Figure 14:
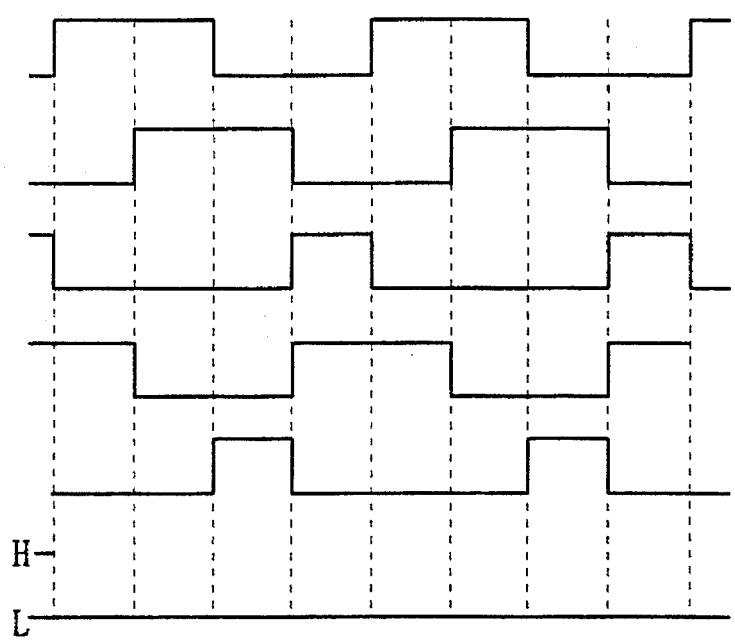
FIG. 14 is a timing chart illustrating the operation of the phase comparator shown in FIG. 13.

The operation of the phase comparator shown in FIG. 13 is illustrated in the timing chart of FIG. 14. In this circuit, the comparison in phase is made on trailing (falling) edge of clocks.

Figure 15:
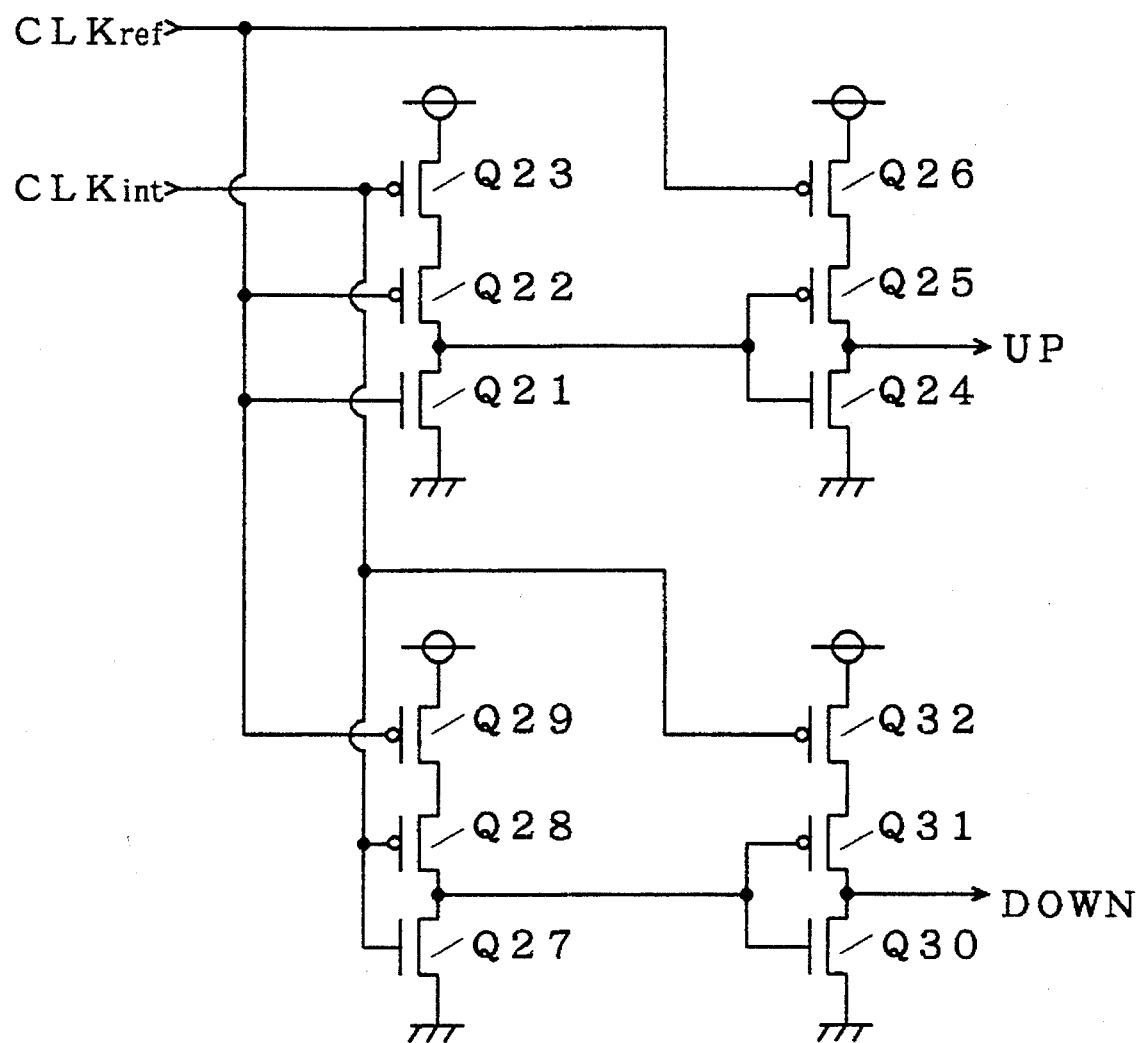
FIG. 15 is a circuit diagram showing the structure of a phase comparator according to another implementation of the third preferred embodiment of the present invention.

The phase comparator shown in FIG. 15 operates in the same way as the phase comparator shown in FIG. 13, because the only difference is that the gate inputs of the two P-channel transistors connected in series are opposite.

<Fourth Preferred Embodiment>

Figure 16:
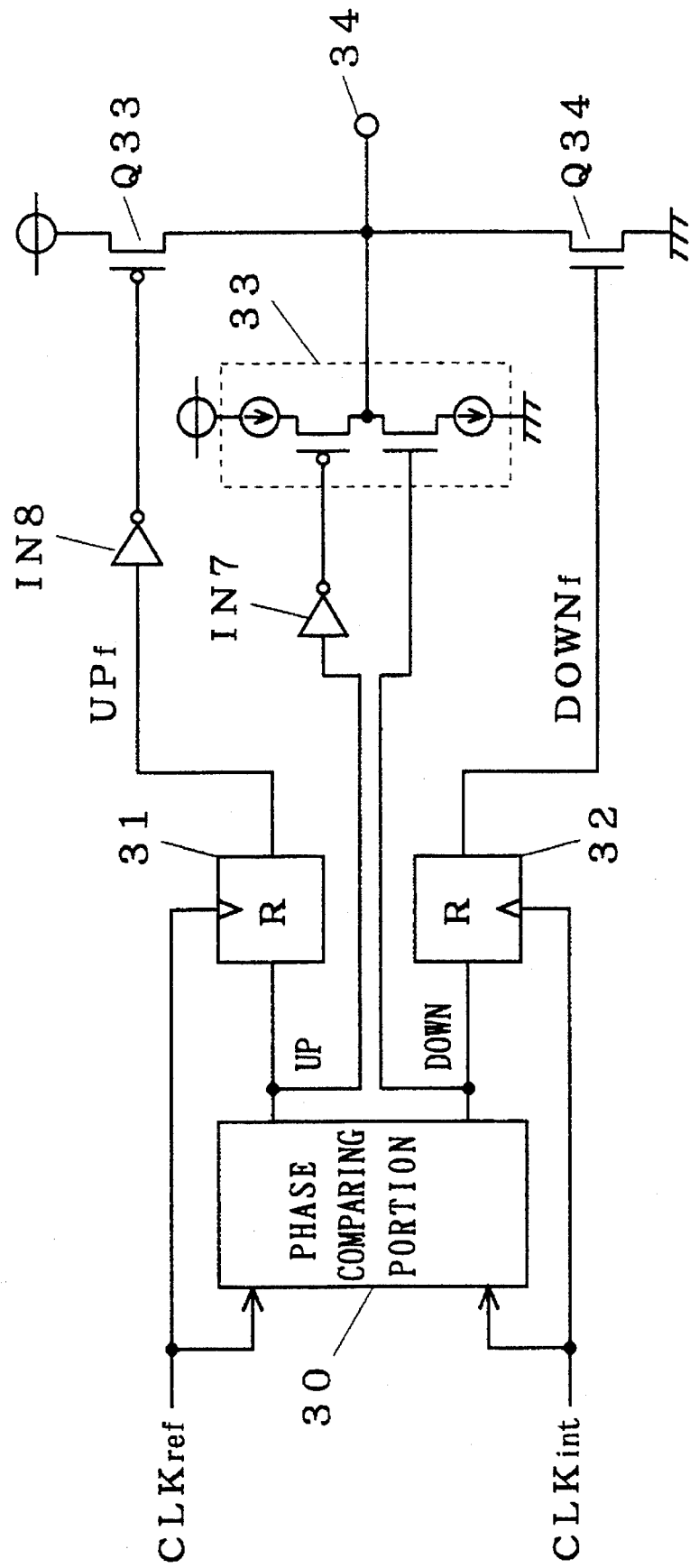
FIG. 16 is a block diagram showing the structure of a phase comparator according to the fourth preferred embodiment of the present invention.

Next, a phase comparator according to the fourth preferred embodiment of the present invention will be described. FIG. 16 is a block diagram showing the structure of the phase comparator according to the fourth preferred embodiment of the present invention. In the figure, 30 denotes a phase comparing portion characterized by the state transition shown in FIG. 5, 31 and 32 denote registers respectively for holding output UP and output DOWN at trailing edges of the input clock CLKref and the internal clock CLKint to generate output UPf and output DOWNf, 33 denotes a charge pump, Q33 denotes a P-channel transistor connected to the output 34 of the charge pump 33 for turning on and off with an output $\overline{\text{UPf}}$, and Q34 denotes an N-channel transistor connected to the output 34 of the charge pump 33 for turning on and off with the output DOWNf. An inverter IN 7 generates an output $\overline{\text{UP}}$ and provides it to the charge pump 33. An inverter IN 8 generates the output $\overline{\text{UPf}}$ from the output UPf.

The phase comparator according to the fourth preferred embodiment includes a frequency comparing circuit. The frequency comparing circuit includes two registers 31 and 32 operating on trailing (falling) edge of clock to generate frequency comparison results UPf and DOWNf from the phase comparison results UP and DOWN. As shown in Table 2 and Table 3, only when the internal clock CLKint is "0" throughout the period in which the input clock CLKref is "1", UP holds "1" in the period in which the following input clock CLKref is "0". The fact that the internal clock CLKint does not change while the input clock CLKref is "1" means that the frequency of the internal clock CLKint is lower as compared with the input clock CLKref. Accordingly, the value of the output UP is captured in the register on the trailing edge of the input clock CLKref and is outputted as UPf. The DOWNf can also be generated in the same way.

<Fifth preferred embodiment>

Figure 17:
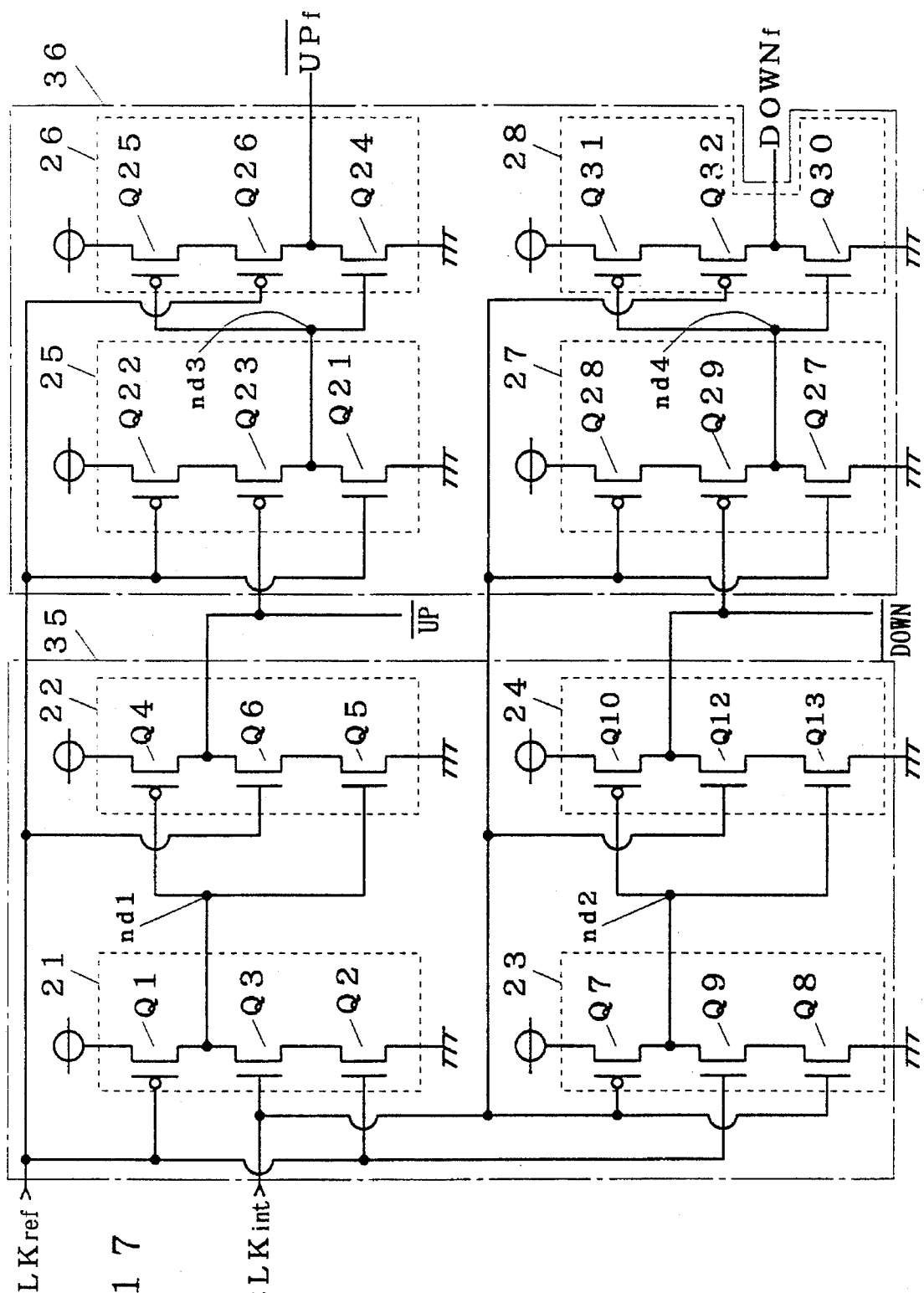
FIG. 17 is a circuit diagram showing the structure of a phase comparator according to the fifth preferred embodiment of the present invention.

Next a phase comparator according to the fifth preferred embodiment of the present invention will be described using FIG. 17 and FIG. 18. FIG. 17 is a circuit diagram showing the structure of the phase comparator according to the fifth preferred embodiment of the present invention. The phase comparator of the fifth preferred embodiment has a frequency comparing function. The phase comparator shown in FIG. 17 is a circuit having single-phase latches connected in two stages, a previous stage 35 having the same structure as that of the phase comparator shown in FIG. 10 for outputting phase comparison results UP and DOWN, and a following stage 36 having the structure complementary to that of the previous stage 35, and having the same circuit structure as that of the phase comparator shown in FIG. 13 for outputting frequency comparison results UPf and DOWNf. Accordingly, the output $\overline{\text{UP}}$ is provided to the gate of a transistor Q23 in place of the internal clock CLKint and the output $\overline{\text{DOWN}}$ is provided to the gate of a transistor Q29 in place of the input clock CLKref.

Next, the operation in the case where the frequency of the internal clock CLKint is lower as compared with the input clock CLKref will be described referring to the timing chart of FIG. 18.

At the time t25, when the input clock CLKref and the internal clock CLKint are "1", the N-channel transistors Q2, Q3, Q8 and Q9 turn on and the nodes nd1 and nd2 are at "0", and the P-channel transistors Q4 and Q10 turn on and both the outputs $\overline{\text{UP}}$ and $\overline{\text{DOWN}}$ are "1". At this time, the transistors Q21 and Q27 turn on and the nodes nd3 and nd4 are "0", and the outputs $\overline{\text{UPf}}$ and $\overline{\text{DOWNf}}$ are in the high impedance state holding the value immediately before.

Next, at the time t26, when the input clock CLKref falls, the transistor Q2 turns off at the same time as the transistor Q1 turns on so that the node nd1 goes to "1". At this time, the transistor Q9 turns off to place the node nd2 into the high impedance state, and the node nd2 maintains "0". Then the output $\overline{\text{DOWN}}$ holds "1". Accordingly, the output $\overline{\text{DOWN}}$ and the internal clock CLKint do not change, and neither does the output $\overline{\text{DOWNf}}$. On the other hand, since the node nd1 attains "1" and the input clock CLKref becomes "0", both the transistors Q21 and Q23 turn off. Consequently, the node nd3 holds "0", the transistors Q25, Q26 turn on and the output $\overline{\text{UPf}}$ attains "1".

Next, at the time t27, when the internal clock CLKint falls, the transistor Q3 turns off and the node nd1 is placed into the high impedance state to hold "1". On the other hand, since the transistor Q8 turns off and the transistor Q7 turns on, the node nd2 goes "1". Then, the transistors Q10 and Q12 turn off and hence the output $\overline{\text{DOWN}}$ is placed into the high impedance state to maintain "1". The internal clock CLKint attaining "0" causes the transistor Q27 to turn off and the transistor Q28 to turn on, but the node nd4 holds "0" because the transistor Q29 is OFF. Accordingly, the transistors Q31 and Q32 are ON and the output $\overline{\text{DOWNf}}$ is "1". As the output $\overline{\text{UP}}$ and the input clock CLKref do not change, the output $\overline{\text{UPf}}$ stays at "1".

Next, at the time t28, when the input clock CLKref attains "1" first, the node nd1 is placed into the high impedance state to hold "1", and the transistor Q5 turns on and the output $\overline{\text{UP}}$ goes "0". As the input clock CLKref is "1" the transistor Q21 turns on and the node nd3 remains "0", and the output $\overline{\text{UPf}}$ is placed into the high impedance state to hold "1".

Next, at the time t29, when the input clock CLKref becomes "0" again, the precharge transistor Q1 turns on to cause the node nd1 to go to "1", but the output $\overline{\text{UP}}$ goes into the high impedance state to hold "0", so that the transistors Q22 and Q23 turn on to cause the node nd3 to go "1" and the transistor Q24 turns on to cause the output $\overline{\text{UPf}}$ to go "0".

Subsequently, at the time t30, when the internal clock CLKint attains "1", the node nd2 goes into the high impedance state to hold "1", therefore the transistors Q11 and Q12 turn on to cause the output $\overline{\text{DOWN}}$ to go "0", transistor Q27 turns on to allow the node nd4 to stay at "0" and the output $\overline{\text{DOWNf}}$ goes into the high impedance state holding "1".

Then at the time t31, when the input clock CLKref attains "1" again, the transistors Q2, Q3, Q8 and Q9 turn on to cause the nodes nd1 and nd2 to go "0", and the transistors Q4 and Q10 turn on to cause the output $\overline{\text{UP}}$ and the output $\overline{\text{DOWN}}$ to "1". When the input clock CLKref and the internal clock CLKint attain "1", the transistors Q21 and Q27 turn on to cause the node nd3 "0", the node nd4 remaining "0", and the output $\overline{\text{UPf}}$ and $\overline{\text{DOWNf}}$ go into the high impedance state, holding "0" and "1". When the internal clock CLKint is "0" all through the period in which the CLKref is "1" as stated above, that is, when the internal clock CLKint has frequency a lower than that of the input clock CLKref, the output $\overline{\text{UPf}}$ is outputted for one cycle from a trailing edge of the input clock CLKref.

On the other hand, if the input clock CLKref is "0" all through the period in which the internal clock CLKint is "1", that is to say, if the internal clock CLKint has a frequency higher than that of the input clock CLKref, the output $\overline{\text{DOWNf}}$ is outputted contrary to the above-mentioned case.

Although the case in which the frequency comparing function is provided to the circuit of FIG. 10 has been shown in the fifth preferred embodiment, the frequency comparing function can also be provided to the circuits shown in FIG. 12, FIG. 13 and FIG. 15 in the same way.

<Sixth Preferred Embodiment>

Figure 19:
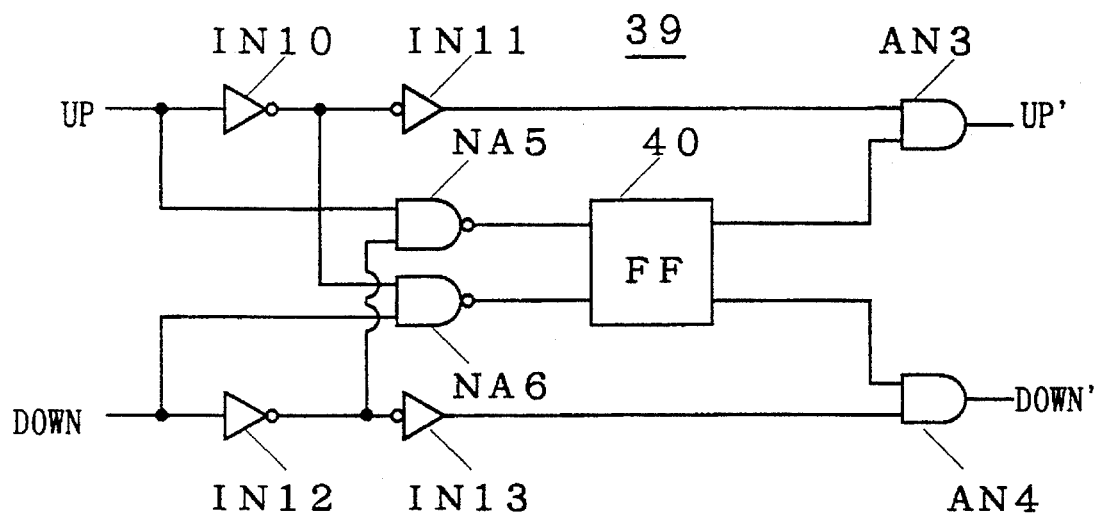
FIG. 19 is a circuit diagram for describing a phase comparator according to the sixth preferred embodiment of the present invention.

Next, a phase comparator according to the sixth preferred embodiment of the present invention will be described referring to FIG. 19. FIG. 19 is a logic circuit diagram showing the structure of a mask circuit used in the phase comparator according to the sixth preferred embodiment of the present invention. Shown is a mask circuit for preventing simultaneous output of the output UP and the output DOWN. In the phase comparator shown in the first through fifth preferred embodiments, the output UP and the output DOWN may be outputted at the same time as can be seen from the state transition diagram of FIG. 5. If the output UP and the output DOWN are simultaneously inputted to the charge pump, then the current flows throughout from VDD to GND to increase the consumption power. To prevent this, the masking function for avoiding simultaneous output of the output UP and the output DOWN is added to the phase comparator.

The reference numeral 39 denotes a mask circuit receiving the output UP and the output DOWN of the phase comparing portion and outputting an output UP' and an output DOWN', IN 10 to IN 13 denote inverters, NA 5 and NA 6 denote NAND gates, AN 3 and AN 4 denote AND gates and 40 denotes set/reset FF. The output UP is inputted to the input terminal of the inverter IN 10, and at the same time, is inputted to one input terminal of the NAND gate NA 5. Output of the inverter IN 10 is inputted to the input terminal of the inverter IN 11 and at the same time is inputted to one input terminal of the NAND gate NA 6. The output DOWN is inputted to the input terminal of the invertor IN 12, and at the same time, is inputted to the other input terminal of the NAND gate NA 6. Output of the inverter IN 12 is inputted to the input terminal of the inverter IN 13, and at the same time, is inputted to the other input terminal of the NAND gate NA 5. Outputs of the NAND gates NA 5 and NA 6 are inputted to the set input terminal and the reset input terminal of the FF 40, respectively. Output of the FF 40 is inputted to one input terminal of the AND gate AN 3. Output of the inverter IN 11 is inputted to the other input terminal of the AND gate AN 3. Inversion output of the FF 40 is inputted to one input terminal of the AND gate AN 4. Output of the inverter IN 13 is inputted to the other input terminal of the AND gate AN 4. The output UP' is outputted from the AND gate AN 3 and the output DOWN' is outputted from the AND gate AN 4. The operation of the mask circuit 30 follows the logic in Table 4.

TABLE 4

| UP | DOWN | UP' | DOWN' |
|----|------|-----|-------|
| 0 | 0 | 0 | 0 |
| 0 | 1 | 0 | 1 |
| 1 | 0 | 1 | 0 |
| 1 | 1 | No change | No change |

If the output UP is outputted first from the state in which the output UP and the output DOWN are "0", the FF 40 is set and the output UP' is outputted. When the output DOWN is outputted next, inputs of the FF 40 are disabled to each other and the FF 40 holds value. That is, the output UP' is intactly outputted and the output DOWN' is masked.

On the contrary, if the output DOWN is outputted first, then the output DOWN' is outputted and the output UP' is masked. In this way, if the output UP and the output DOWN are simultaneously outputted, then the state immediately before is maintained, and one outputted first only is outputted and one outputted later is masked.

<Seventh Preferred Embodiment>

Figure 20A:
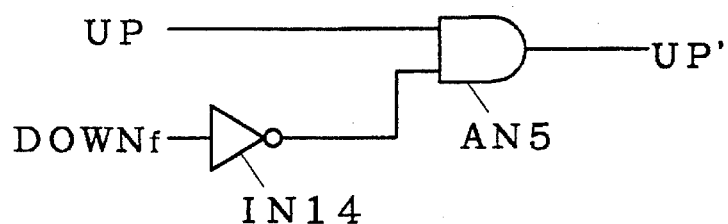
FIG. 20 is a circuit diagram for describing a phase comparator according to the seventh preferred embodiment of the present invention.
Figure 20B:
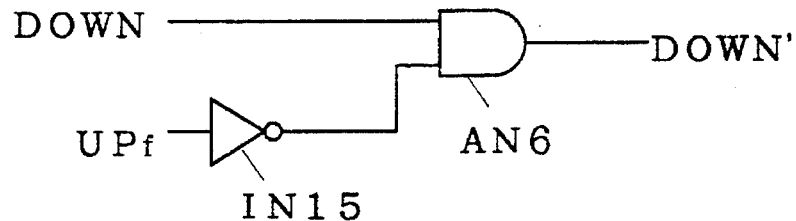

Next, a phase comparator according to the seventh preferred embodiment of the present invention will be described referring to FIG. 20. FIG. 20 is a logic circuit diagram showing the structure of a mask circuit used in the phase comparator according to the seventh preferred embodiment of the present invention. The mask circuit shown in FIG. 20 is a mask circuit not to output the DOWN, UP while the outputs UPf and DOWNf are outputted. In the phase comparator according to the fifth preferred embodiment, as shown in the timing chart of FIG. 18, the output $\overline{UPf}$ and the output $\overline{DOWN}$ may be simultaneously outputted between the time t30 and the time t31. Also, though not shown in the figure, the output $\overline{DOWNf}$ and the output $\overline{UP}$ may be simultaneously outputted. If the output $\overline{UPf}$ and the output $\overline{DOWN}$ are simultaneously outputted, or if the output $\overline{DOWNf}$ and the output $\overline{UP}$ are simultaneously outputted, the agreement of frequency may not be performed adequately. Accordingly, a mask circuit for adequately performing the agreement of frequency is needed.

In the figure, 41 denotes a mask circuit, where IN 14 and IN 15 are inverters and AN 5 and AN 6 are AND gates. The output DOWNf is provided to the input terminal of the inverter IN 14. The AND gate AN 5 then takes AND of output of the inverter IN 14 and the output UP to output the output UP'. The output UPf is provided to the input terminal of the inverter IN 15. The AND gate AN 6 then takes AND of output of the inverter IN 15 and the output DOWN to output the output DOWN'. The mask circuit is formed only of logic gates and follows the logic in Table 5.

TABLE 5

| UP/DOWN | DOWNf/UPf | UP'/DOWN' |
|---------|-----------|-----------|
| 0 | 0 | 0 |
| 0 | 1 | 0 |
| 1 | 0 | 1 |
| 1 | 1 | 0 |

The mask function can be added to the phase comparator so that DOWN and UP are not outputted in a period in which the output UPf or the output DOWNf is "1" to give precedence to the agreement of frequency. To add the mask function to the phase comparator so that DOWN and UP are not be outputted in a period in which the output $\overline{UPf}$ or the output $\overline{DOWNf}$ is "0", this mask circuit 41 can be used by inverting the output $\overline{UPf}$ or the output $\overline{DOWNf}$ with inverter.

<Eighth Preferred Embodiment>

Figure 21A:
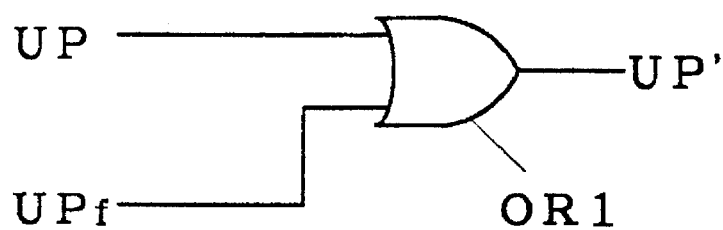
FIG. 21 is a circuit diagram for describing a phase comparator according to the eighth preferred embodiment of the present invention.
Figure 21B:
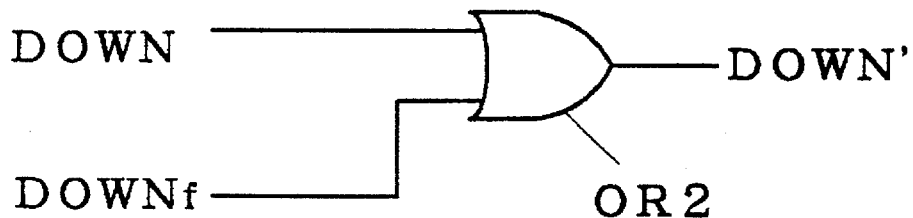

Next, a phase comparator according to the eighth preferred embodiment of the present invention will be described referring to FIG. 21. FIG. 21 is a logic circuit diagram showing the structure of a mask circuit used in the phase comparator according to the eighth preferred embodiment of the present invention. The circuit shown in FIG. 21 is used for the phase comparator of the eighth preferred embodiment for outputting UP and DOWN for a period in which UPf and DOWNf are outputted. According to the phase comparator of the fifth preferred embodiment, as depicted in the timing chart in FIG. 18, the output UP is always outputted if the output UPf is outputted and the output DOWN is always outputted if the output DOWNf is outputted, but they are respectively shifted by half clock. If UP and DOWN are outputted in the period when UPf, DOWNf are outputted, the agreement of frequency can be accelerated. In FIG. 21, 42 denotes a circuit for outputting UP, DOWN in the period in which UPf, DOWNf are outputted, OR 1 denotes an OR gate for ORing the output UP and the output UPf to newly generate the output UP', and OR 2 denotes an OR gate for ORing the output DOWN and the output DOWNf to newly generate the output DOWN'. This circuit 42 is formed only of logic gates and follows the logic in Table 6.

TABLE 6

| UP/DOWN | DOWNf/UPf | UP'/DOWN' |
|---------|-----------|-----------|
| 0 | 0 | 0 |
| 0 | 1 | 1 |
| 1 | 0 | 1 |
| 1 | 1 | 1 |

For example, provision of the circuit 42 in the phase comparator of the fifth preferred embodiment can add the function of outputting UP, DOWN in the period in which UPf, DOWNf are outputted to accelerate the agreement of frequency.

<Ninth Preferred Embodiment>

In phase comparators used for PLL (Phase Locked Loop) circuits, phase of input clock and internal clock are compared and if they do not agree error signals are outputted as follows. If the phase of the internal clock lags behind the phase of the input clock, then UP signal is outputted, and if it is leading, then DOWN signal is outputted.

Figure 22:
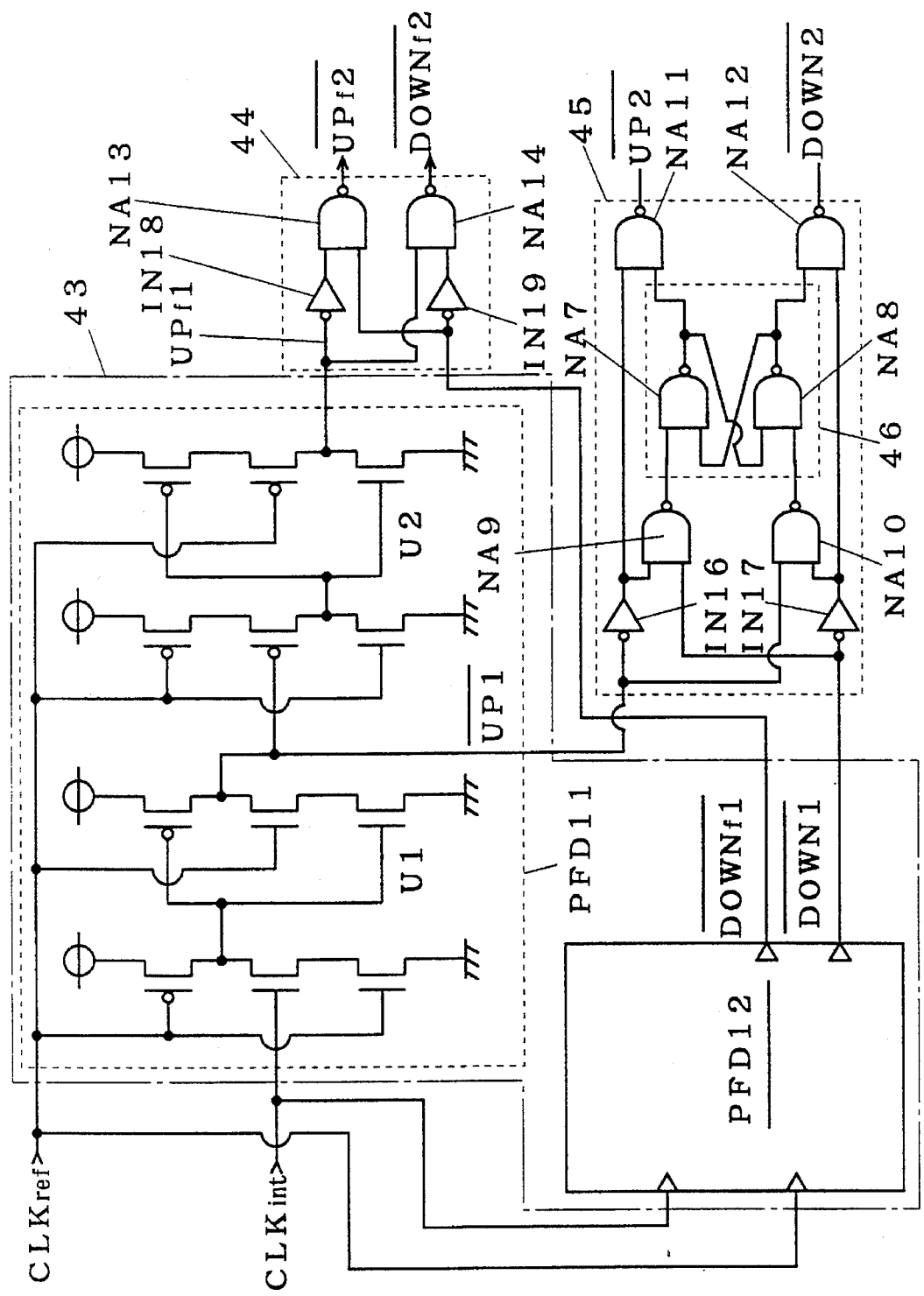
FIG. 22 is a circuit diagram showing the structure of a phase comparator according to the ninth preferred embodiment of the present invention.

FIG. 22 is a circuit diagram showing the structure of a phase comparator according to the ninth preferred embodiment of the present invention. This phase comparator, similarly to that shown in FIG. 17, includes a phase comparing portion 43 using the precharge method and a mask circuit 44 and a mask circuit 45 for preventing simultaneous output of the UP and DOWN, and the UPf and DOWNf. The phase comparing portion 43 is composed of a PFD 11 and a PFD 12. The phase comparing portion 43 has a structure the same as that of the phase comparator shown in FIG. 17. That is to say, the PFD 11 and the PFD 12 each includes two-stage connection of dynamic single-phase latch using no inversion clocks. The NMOS stage on the previous stage includes precharge NAND having a PMOS and an NMOS receiving clock as gate input and an NMOS receiving data as gate input connected in series and clocked inverter having a PMOS and an NMOS receiving data as gate input and an NMOS receiving clock as gate input connected in series to output phase error signal $\overline{UP1}$, $\overline{DOWN1}$. The PMOS stage on the following stage is configured complementary to the NMOS stage to output frequency error signals $\overline{UPf1}$, $\overline{DOWNf1}$.

The mask circuit 45 includes a flip-flop 46 having two NAND gates NA 7, NA 8, two inverters IN 16, IN 17 and four NAND gates NA 9–NA 12 to output mask results of the phase error signals, $\overline{UP2}$, $\overline{DOWN2}$.

The mask circuit 44 includes two inverters IN 18, IN 19 and two NAND gates NA 13, NA 14 to output mask results of the frequency error signals, $\overline{UPf2}$, $\overline{DOWNf2}$.

The operation of this circuit will be described according to the timing charts of FIGS. 23–28. FIG. 23 shows the case where the phase of the internal clock CLKint is lagging behind the phase of the input clock CLKref, FIG. 24 shows the case where it is advanced, FIG. 25 shows the case where they agree, i.e., the PLL is locked, and FIG. 26 shows the case of inversion, where the clock duty in FIGS. 23–26 is assumed to be 50%. FIG. 27 shows the case where the frequency of the internal clock CLKint is lower than the frequency of the CLKref and the ratio is larger than ½ and FIG. 28 shows the case where it is ½ or lower, where the clock duty of the internal clock CLKint is assumed to be 50% and that of the input clock CLKref is smaller than 50% in FIG. 27 and FIG. 28.

First, the PFD 11 for generating the output UP will be described. The output U1 of the precharge NAND on the input stage is precharged to "1" when the input clock CLKref is "0", holds "1" if the internal clock CLKint is "0" when the input clock CLKref is "1", and is pulled out to "0" if the internal clock CLKint is "1". Being precharge logic, U1 does not return to "1" until it is precharged with the next clock when it is once pulled out to "0". That is, the leading (rising) edge of the internal clock CLKint is passed, but the trailing (falling) edge is disappeared.

The clocked inverter on the next stage operates as an inverter when the input clock CLKref is "1" and operates as a latch when the input clock CLKref is "0". Accordingly, it performs phase comparison while the input clock CLKref is "1", and if the internal clock starts from "0" and there is a leading edge, it outputs the $\overline{UP1}$ for the phase difference between the time t32 and the time t33 in FIG. 23, and if there is not, it outputs $\overline{UP1}$ for 1 clock as shown in FIG. 27 and FIG. 28, and if the internal clock CLKint starts from "1", it then does not output as shown in FIG. 24 and FIG. 25. The output U2 of the precharge NOR on the third stage is precharged to "0" when the input clock CLKref is "1", holds "0" if the $\overline{UP1}$ in the latch state is "1" when the input clock CLKref is "0", and is pulled up to "1" if $\overline{UP1}$ is "0". That is to say, only if the internal clock CLKint was "0" all through the period in which the input clock CLKref is "1", i.e., if there was no edge of the internal clock CLKint (FIG. 26–FIG. 28), the U2 goes "1". The clocked inverter on the final stage operates as an inverter when the input clock CLKref is "1" and operates as a latch when the input clock CLKref is "0", and thus outputs $\overline{UPf1}$ for one clock only in the case stated above.

Considering the PFD 12 on the DOWN side in the same way, the waveforms D1, $\overline{DOWN1}$, $\overline{DOWN2}$, and $\overline{DOWNf1}$ shown in FIGS. 23–28 are obtained.

As described above, the PFD 1 using the precharge NAND, having no feedback path, can operate at a higher speed as compared with phase comparators using flip-flops which are generally used and further it has the advantage that it can be formed of fewer number of elements.

<Tenth Preferred Embodiment>

According to the phase comparator of the ninth preferred embodiment, there was a problem that the output $\overline{UP1}$ and the output $\overline{DOWN1}$, and $\overline{UPf1}$ and $\overline{DOWNf1}$ may be simultaneously outputted as shown in FIG. 26 and FIG. 27 to flow large current through the charge pump receiving these error signals as input. Thus, the mask circuit 44 and the mask circuit 2 are provided to prevent the simultaneous output of them. The FF of the mask circuit 44 is set by $\overline{UP1}$ and is reset by $\overline{DOWN1}$, and it maintains a previous state if they are outputted at the same time. That is, $\overline{UP2}$ is outputted preferentially when the FF is in the set state, and $\overline{DOWN2}$ is preferentially outputted when it is in the reset state. In the mask circuit 45, $\overline{UPf1}$ and $\overline{DOWNf1}$ disable to each other, so that neither of $\overline{UPf2}$ and $\overline{DOWNf2}$ is outputted when these are simultaneously outputted.

The PFD 11 and PFD 12 output frequency error signals if there is no edge of the second clock in a period in which the first clock is "1". The edge detection is effected only while the clock is at "1", therefore correct determination can be made if the clock duty is 50%, but wrong determination may be made if the clock duty is not 50% as illustrated in FIG. 27.

As described above, the PFD 11 and the PFD 12 have the advantage of operating at high speed and of being composed of fewer number of elements, but it also has the problem of necessity of providing mask circuit. It further involves the problem that frequency error signals may be erroneously outputted if the clock duty is not 50%.

Figure 29:
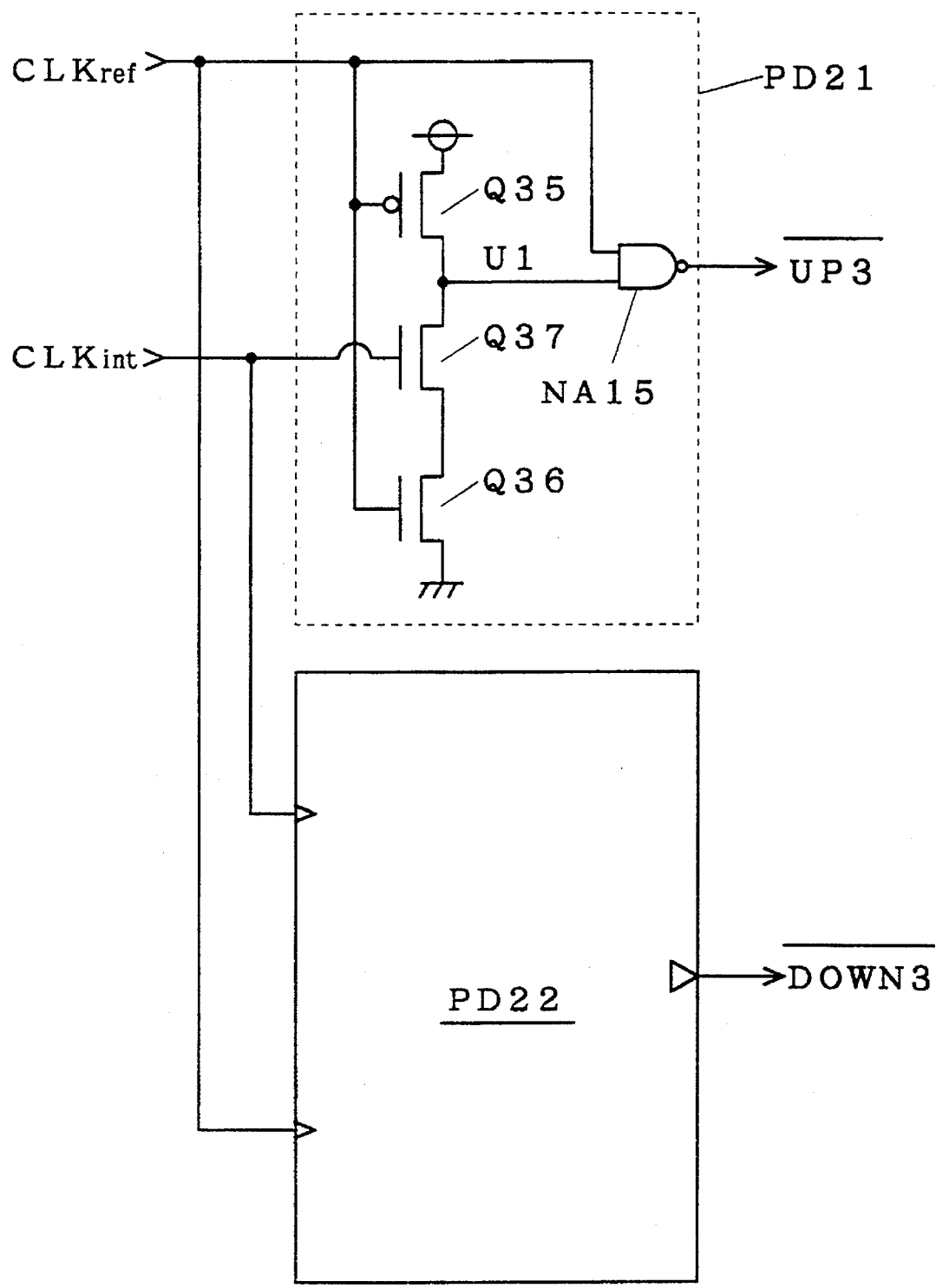
FIG. 29 is a circuit diagram showing the structure of a phase comparator according to the tenth preferred embodiment of the present invention.

FIG. 29 is a circuit diagram showing the structure of a phase comparator according to the tenth preferred embodiment of the present invention. In the figure, it includes two phase comparing portions PD 21 and PD 22 each composed of precharge NAND having a P-channel MOS transistor Q35 and an N-channel MOS transistor Q36 receiving clock as gate input, and an N-channel MOS transistor Q37 receiving data as gate input connected in series and a single NAND gate NA 15, and outputs phase error signals $\overline{UP3}$ and $\overline{DOWN3}$, respectively.

The operation of this circuit will be described referring to the timing charts of FIGS. 30–35. FIG. 30 shows the case in which the phase of the internal clock CLKint lags behind the phase of the input clock CLKref, FIG. 31 shows it is leading ahead, FIG. 32 shows the case in which they agree, i.e., the PLL is locked, and FIG. 33 shows the case of inversion, where the clock duty is assumed to be 50% in FIGS. 30–33. FIG. 34 shows the case where the frequency of the internal clock CLKint is lower than the frequency of the CLKref and the ratio is larger than ½, and FIG. 35 shows the case where it is ½ or smaller, and the clock duty of the internal clock CLKint is assumed to be 50%, and that of the input clock CLKref is smaller than 50% in FIG. 34 and FIG. 35.

The outputs U1 and D1 of the precharge AND gate in the phase comparing portions PD 21 and PD 22 are the same as PFD 1. By taking NOT-AND of the output U1 of the precharge NAND gate and the input clock CLKref, the output $\overline{UP3}$ of the phase comparing portion PD 21 is limited to the period in which the input clock CLKref is "1". Similarly, the output $\overline{DOWN3}$ of the phase comparing portion PD 22 is limited to the period when the internal clock CLKint is "1". As shown in FIGS. 30–35, $\overline{UP3}$ and $\overline{DOWN3}$ are not outputted at the same time, therefore it is not necessary to provide mask circuits.

<Eleventh Preferred Embodiment>

Figure 36:
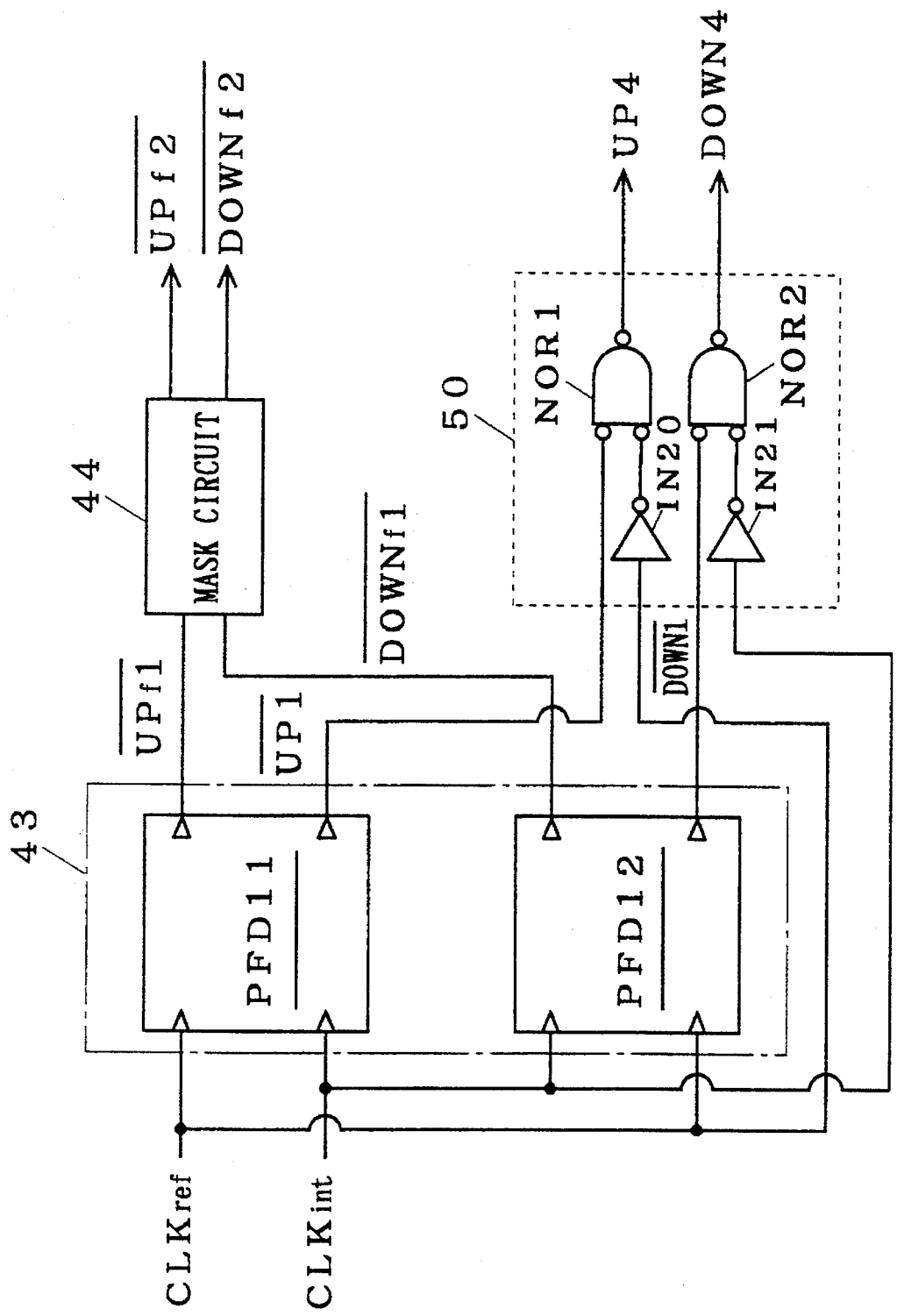
FIG. 36 is a circuit diagram showing the structure of a phase comparator according to the eleventh preferred embodiment of the present invention.

FIG. 36 is a circuit diagram showing the structure of a phase comparator according to the eleventh preferred embodiment of the present invention. In FIG. 36, it includes two phase comparing portions PFD 11 and PFD 12, a mask circuit 50 and a mask circuit 44 for preventing the output UP and the output DOWN, and the output UPf and the output DOWNf from being simultaneously outputted. The mask circuit 50 includes two inverters IN 20 and IN 21 and two NOR gates NOR 1 and NOR 2. The NOR gate NOR 1 takes NOT-OR of the output $\overline{UP1}$ and inversion logic of the input clock CLKint to output a mask result of a phase error signal, UP4. The NOR gate NOR 2 takes NOT-OR of the output $\overline{DOWN1}$ and inversion logic of the internal clock CLKint to output a mask result of the phase error signal, DOWN4. Output waveforms of the outputs UP4 and DOWN 4 of this phase comparator are illustrated in the timing charts of FIGS. 23–28.

For example, at the time t36 shown in FIG. 27, when the input clock CLKref falls from "1" to "0" and the internal clock CLKint rises from "0" to "1", the output $\overline{UP}$ of the phase comparing portion PFD 11 holds "0" and the output $\overline{DOWN}$ of the phase comparing portion PFD 12 changes from "1" to "0", and then both of the output $\overline{UP}$ and the output $\overline{DOWN}$ go "0", resulting in a problem. However, the output UP4 generated by taking NOT-OR of the output $\overline{UP}$ and the inversion logic of the input clock CLKref outputted from the inverter IN 20 in the NOR gate NOR 1 in the mask circuit 50 is "0" while the input clock CLKref is "0".

Also, at the time t37 shown in FIG. 27, when the input clock CLKref rises from "0" to "1" and the internal clock CLKint falls from "1" to "0", the output $\overline{UP}$ of the phase comparing portion PFD 11 holds "0" and the output $\overline{DOWN}$ of the phase comparing portion PFD 12 also holds "0". However, the output DOWN4 generated by taking NOT-OR of the output $\overline{DOWN}$ and the inversion logic of the internal clock CLKint outputted from the inverter IN 21 in the NOR gate NOR 2 in the mask circuit 50 is "0" while the internal clock CLKint is "0".

The mask circuit 50 limits the phase error outputs of the phase comparing portions PFD 11 and PFD 12, $\overline{UP1}$ and $\overline{DOWN1}$ to the period in which the input clock CLKref and the internal clock ClKint are "1". Accordingly, as can be seen by comparing FIG. 27 and FIG. 34, the mask results UP4 and DOWN4 are inversion signals of the phase error outputs of the PD 2, $\overline{UP3}$ and $\overline{DOWN3}$, respectively. The mask circuit 50 can reduce the number of elements to half or fewer as compared with the mask circuit 45 shown in FIG. 22.

<Twelfth Preferred Embodiment>

Figure 37:
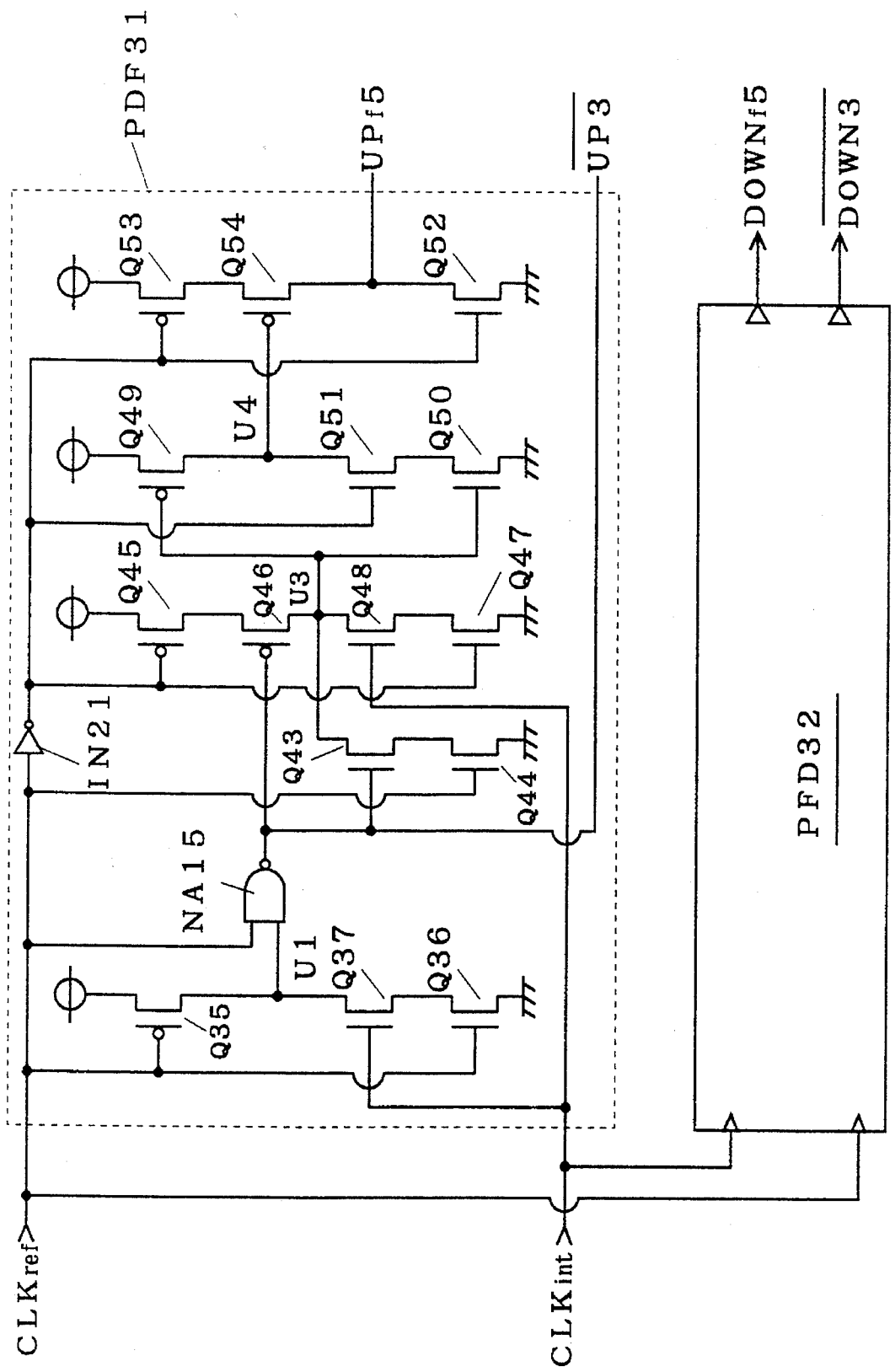
FIG. 37 is a circuit diagram showing the structure of a phase comparator according to the twelfth preferred embodiment of the present invention.

Next, a phase comparator according to the twelfth preferred embodiment of the present invention will be described. FIG. 37 is a circuit diagram showing the structure of the phase comparator according to the twelfth preferred embodiment of the present invention. The phase comparator shown in FIG. 37 includes two phase comparing portions PFD 31 and PFD 32. The phase comparing portions PFD 31 and PFD 32 are each formed by providing a frequency comparing circuit after the phase comparing portion PD 21, and PD 22 shown in FIG. 29.

This frequency comparing circuit includes, on the input stage, a clocked inverter composed of a P-channel MOS transistor Q45 receiving inversion clock of the input clock CLKref as gate input, a P-channel MOS transistor Q46 and an N-channel MOS transistor Q43 receiving output of the phase comparing portion PD 21 as gate input, and an N-channel MOS transistor Q44 receiving the input clock CLKref as gate input, and two N-channel MOS transistors Q47 and Q48 connected between output of this clocked inverter and the ground potential. The N-channel MOS transistor Q47 receiving inversion clock of the input clock CLKref as gate input and the N-channel MOS transistor Q48 receiving the internal clock CLKint as gate input are connected in series between the output of the clocked inverter and the ground potential. As to this clocked inverter and the transistors Q47 and Q48, the operation of the clocked inverter is limited when the input clock CLKref and the internal clock CLKint simultaneously attain "1".

The output stage for receiving output of the input stage and outputting it to out of the phase comparing portion includes a single-phase latch. In this single-phase latch, a P-channel MOS transistor Q49 and an N-channel MOS transistor Q50 receiving output of precharge NAND as gate input and an N-channel MOS transistor Q51 receiving inversion clock as gate input are connected in series between the power supply potential and the ground potential forming precharge NOR. Also, in this single-phase latch, a P-channel MOS transistor Q54 receiving output of the precharge NOR on the first stage as gate input and a P-channel MOS transistor Q53 and an N-channel MOS transistor Q52 receiving inversion clock of the input clock CLKref as gate input are connected in series forming precharge NOR. The inversion clock of the input clock CLKref is supplied via the inverter IN 21. The output of the precharge NOR including the transistors Q52–Q54 is the frequency error signal UPf5. The only difference between the phase comparing portion PFD 32 and the phase comparing portion PFD 31 is that the inputted input clock CLKref and the internal clock CLKint are interchanged. In the phase comparing portion PFD 32, the frequency error signal DOWNf5 is generated in the same way.

The operation of this circuit is shown in the timing charts of FIGS. 30-35. First, the PFD 31 for generating the output UP3 will be described.

The output U3 of the clocked inverter which inverts and outputs the output $\overline{UP3}$ of the NAND gate NA 15 under a predetermined condition inverts and outputs the $\overline{UP3}$ of the PD 2 when the input clock CLKref is "1", holds a value immediately before when the input clock CLKref is "0", and always becomes "0" if both the input clock CLKref and the internal clock CLKint are "1".

That is to say, detection of leading edge of the internal clock CLKint in the same manner as the precharge NOR gate of the transistors Q35–Q36 when the input clock CLKref is "0" with this clocked inverter is limited to the case where after the $\overline{UP3}$ was "0" and the internal clock CLKint was "0" all through the period in which the input clock CLKref was "1", the input clock CLKref changes from "1" to "0", and subsequently, the internal clock CLKint changes from "0" to "1". That is to say, it is limited to when there was no edge of the internal clock CLKint (e.g., the time t41–t42 in FIG. 33, the time t46–time t48 in FIG. 34 and the time t52–time t55 in FIG. 35).

The output U4 of the precharged NOR gate on the next stage inverter-outputs the U3 when the input clock CLKref is "0", holds the value immediately before if the U3 is "1" when the input clock CLKref is "1" and becomes "1" if U3 is "0".

The output UPf5 of the precharge NOR gate on the final stage is precharged to be "0" when the input clock CLKref is "0", holds "0" if U4 is "1" when the input clock CLKref is "1" and is pulled up to "1" if U4 is "0". That is, when edge detection of the internal clock CLKint is conducted also in the period when the input clock CLKref is "0" because there was no edge of the internal clock CLKint in the period when the input clock CLKref is "1" as stated above, only if there is no edge of the internal clock CLKint also in the period when the input clock CLKref is "0", UPf5 becomes "1" only in the period when the next input clock CLKref is "1". Considering the phase comparing portion PFD 32 on the DOWN side in the same way, the waveforms of the outputs D3, D4 and DOWNf5 depicted in FIGS. 30-35 are obtained.

Since the phase comparing portions PFD 11 and PFD 12 in FIG. 22 detect edge of the other clock only in the period when the clock is "1", a frequency error signal may be erroneously outputted only when the clock duty is not 50% as shown in the time t38 through the time t39 in FIG. 27. The phase comparing portions PFD 31 and PFD 32 according to the twelfth preferred embodiment detect edge of the other clock also in the period when the clock is at "0" when there was no edge of the other clock in the period when clock is at "1", therefore correct frequency comparison can be made irrespective of the clock duty as shown in FIG. 34.

<Thirteenth Preferred Embodiment>

Figure 38:
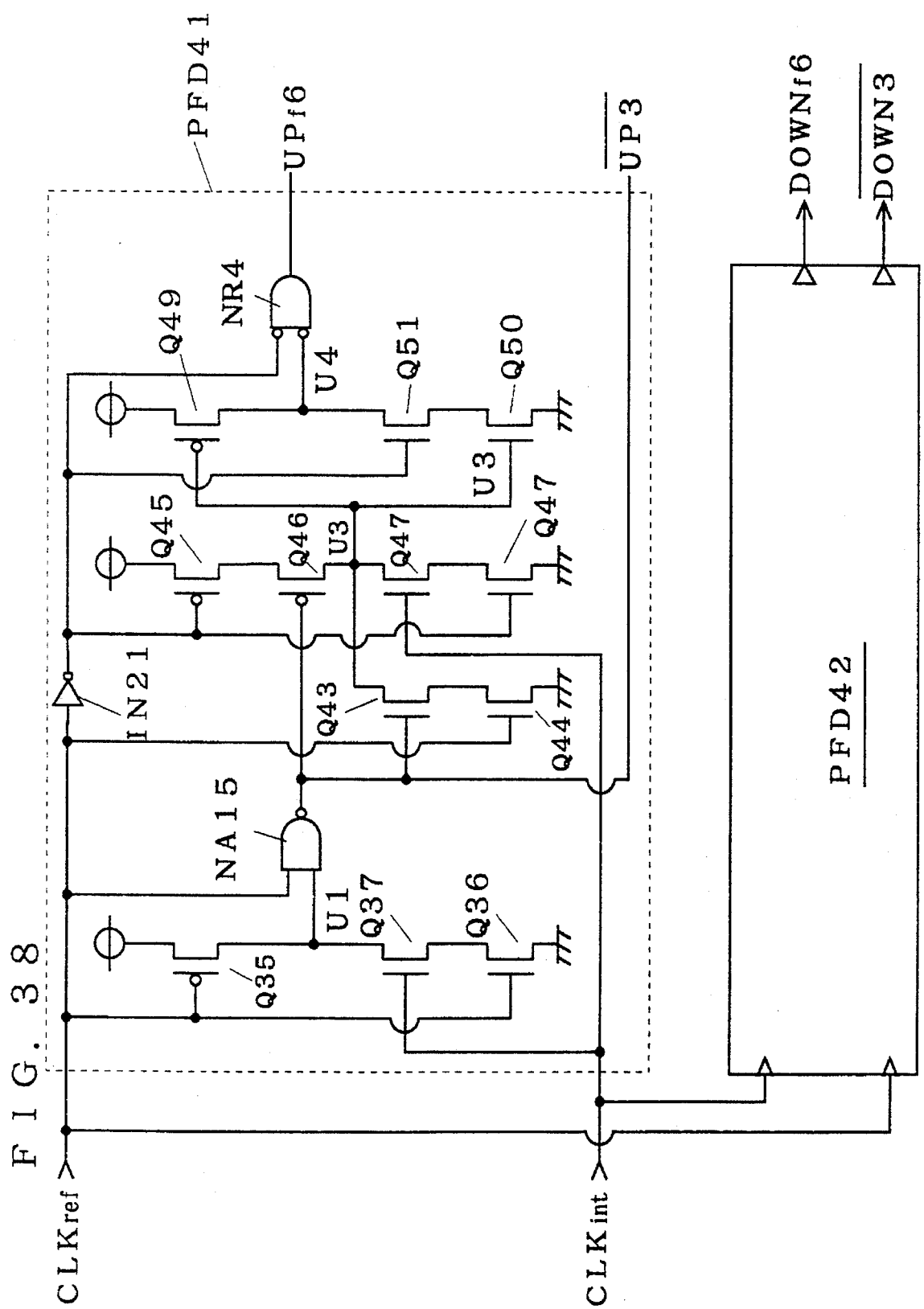
FIG. 38 is a circuit diagram showing the structure of a phase comparator according to the thirteenth preferred embodiment of the present invention.

FIG. 38 is a circuit diagram showing the structure of a phase comparator according to the thirteenth preferred embodiment of the present invention. The phase comparator according to the thirteenth preferred embodiment is composed of two phase comparing portions PFD 41 and PFD 42 each in which the precharge NOR gate on the final stage of the phase comparing portion PFD 31, PFD 32 of the twelfth preferred embodiment is replaced with a normal NOR gate. The frequency comparing circuits each composed of transistors Q43–Q50, an inverter IN 21 and a NOR gate NR 4 outputs frequency error signals UPf6 and DOWNf6, respectively. The waveforms of the frequency error signals UPf6 and DOWNf6 are shown in the timing charts in FIGS. 30-35. As shown in FIG. 35, the phase comparing portions PFD 31 and PFD 32 output frequency error signal in the period when the next clock is "1", but the phase comparing portions PFD 41 and PFD 42 limit the frequency error signals to the period when the next phase error signal is outputted.

<Fourteenth Preferred Embodiment>

Figure 39:
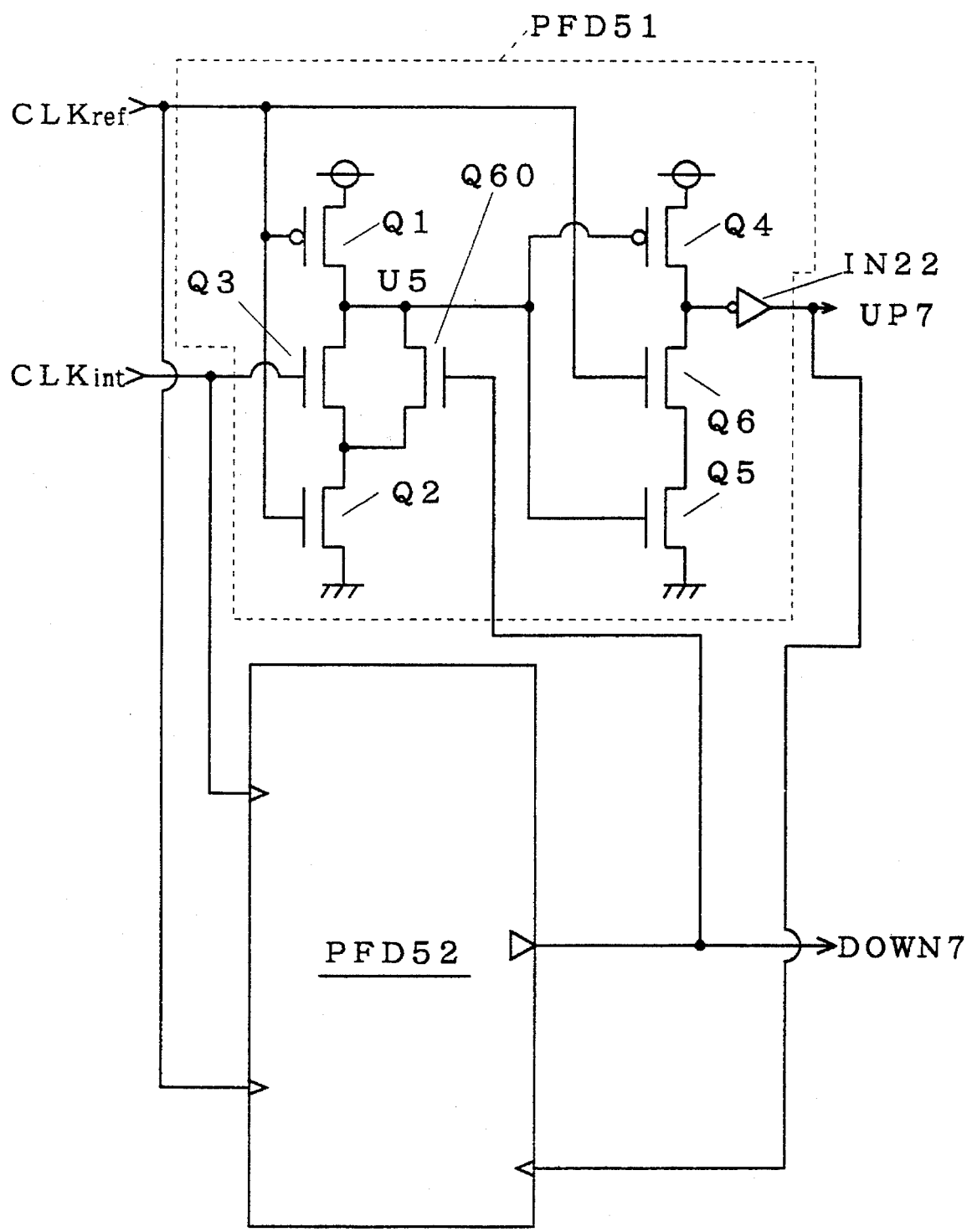
FIG. 39 is a circuit diagram showing the structure of a phase comparator according to the fourteenth preferred embodiment of the present invention.

FIG. 39 is a circuit diagram showing the structure of a phase comparator according to the fourteenth preferred embodiment of the present invention. The phase comparator shown in FIG. 39 includes two phase comparing portions PFD 51 and PFD 52 for detecting phase lag and phase lead of the internal clock CLKint, respectively. The PFD 51 includes the phase comparing portion PD 11 shown in FIG. 10, an N-channel MOS transistor Q60 and an inverter IN 22. The configuration of the phase comparing portion PFD 52 is similar to that of the phase comparing portion PFD 51 with only a difference that the inputted internal clock CLKint and the input clock CLKref are interchanged with each other.

The N-channel MOS transistor Q60 is connected in parallel with the N-channel MOS transistor Q3 of the precharge NAND gate on the input stage and the output DOWN7 of the phase comparing portion PFD 52 is inputted to the gate of the transistor Q60.

In the phase comparing portion PFD 51, the output of the precharged NAND gate including the transistors Q4–Q6 is inverted by the inverter IN 22 to output the phase error signal UP7. Connected to the gate of the N-channel MOS transistor added in the phase comparing portion PFD 52 generating the output DOWN7 is the output UP7 of the phase comparing portion PFD 51.

The operation of this circuit is illustrated in the timing charts of FIGS. 40-45. FIG. 40 shows the case where the phase of the internal clock CLKint lags behind the phase of the input clock CLKref, FIG. 41 shows the case where it is leading, FIG. 43 shows the case where the phase of the internal clock CLKint agrees with the phase of the input clock CLKref, i.e., the PLL is locked, and FIG. 42 shows the case of inversion, and the clock duty is assumed to be 50% in FIGS. 40-43. FIG. 44 shows the case where the frequency of the internal clock CLKint is lower than the frequency of the CLKref and its ratio is larger than ½ and FIG. 45 shows the case where it is ½ or smaller, and the clock duty of the internal clock CLKint is assumed to be 50% and the clock duty of the input clock CLKref is below 50% in FIGS. 44 and 45. The "D5" depicted in these figures represents output of the precharged NAND gate on the input stage of the phase comparing portion PFD 52.

The outputs U5 and D5 of the precharge NAND gate when the output UP7 and DOWN7 are not outputted from the phase comparing portions PFD 51 and PFD 52 are the same as the outputs U1 and D1 of the precharge NAND gate of the phase comparing portions PD 11 and PFD 12 shown in FIG. 10. When the output DOWN7 of the phase comparing portion PFD 52 is "1", edge detection of the internal clock CLKint is not effected in the period when the input clock CLKref is "1" by the N-channel MOS transistor Q60 added in the phase comparing portion PFD 51 and the U5 is pulled out to "0". That is to say, when the output DOWN7 is "1", the output UP7 of the phase comparing portion PFD 51 never attains "1". Similarly, when the output UP7 is "1", the output DOWN7 is "0". Accordingly, the mask circuit is not necessary.

Also when UP7 and DOWN7 are outputted over several clocks because of a difference in frequency, input of circuits on the DOWN, UP side is hindered in that period, so that the phase difference over periods can be detected. That is, frequency comparing circuits are not necessary, either.

<Fifteenth Preferred Embodiment>

Figure 46:
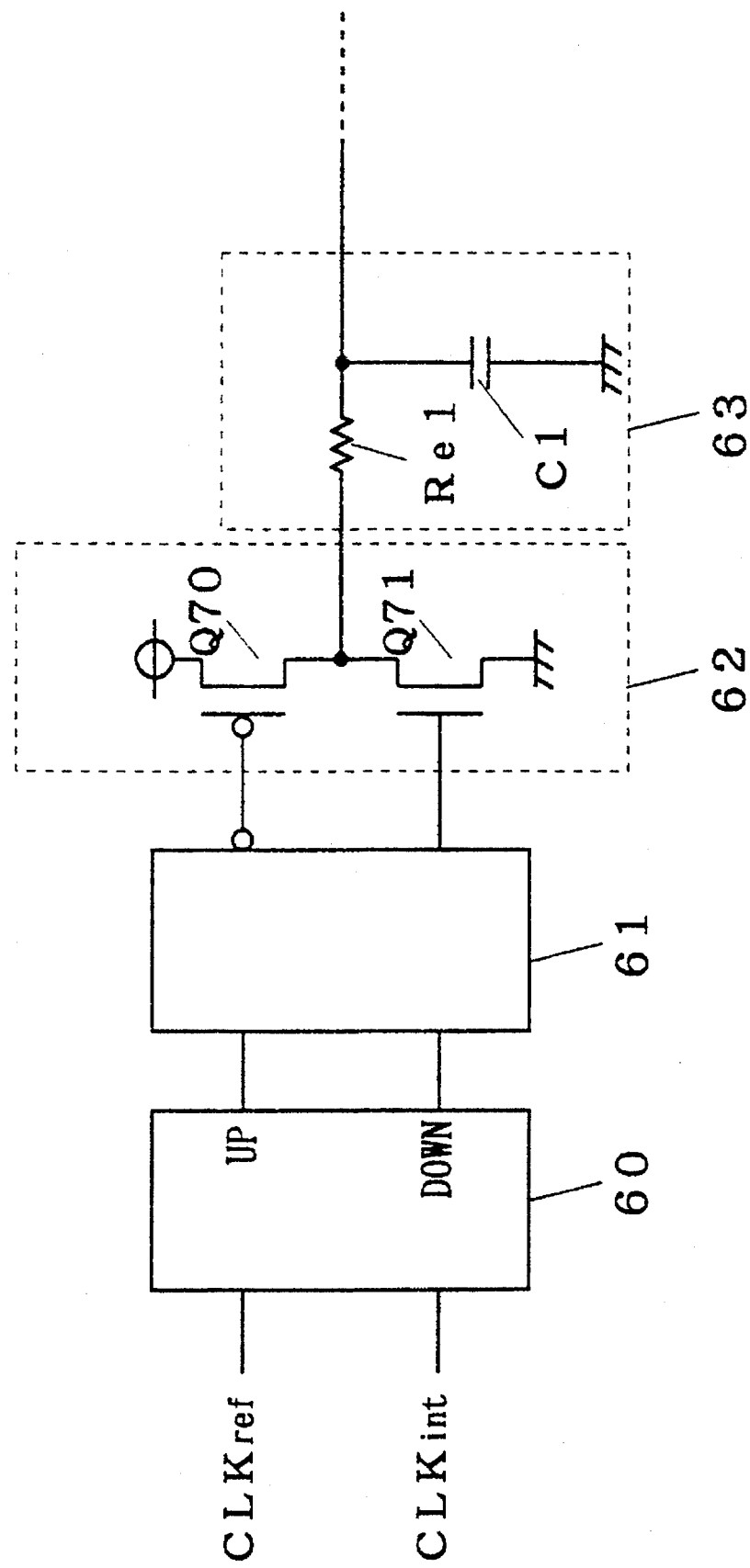
FIG. 46 is a block diagram for describing the structure of a PLL circuit according to the fifteenth preferred embodiment of the present invention.
Figure 47:
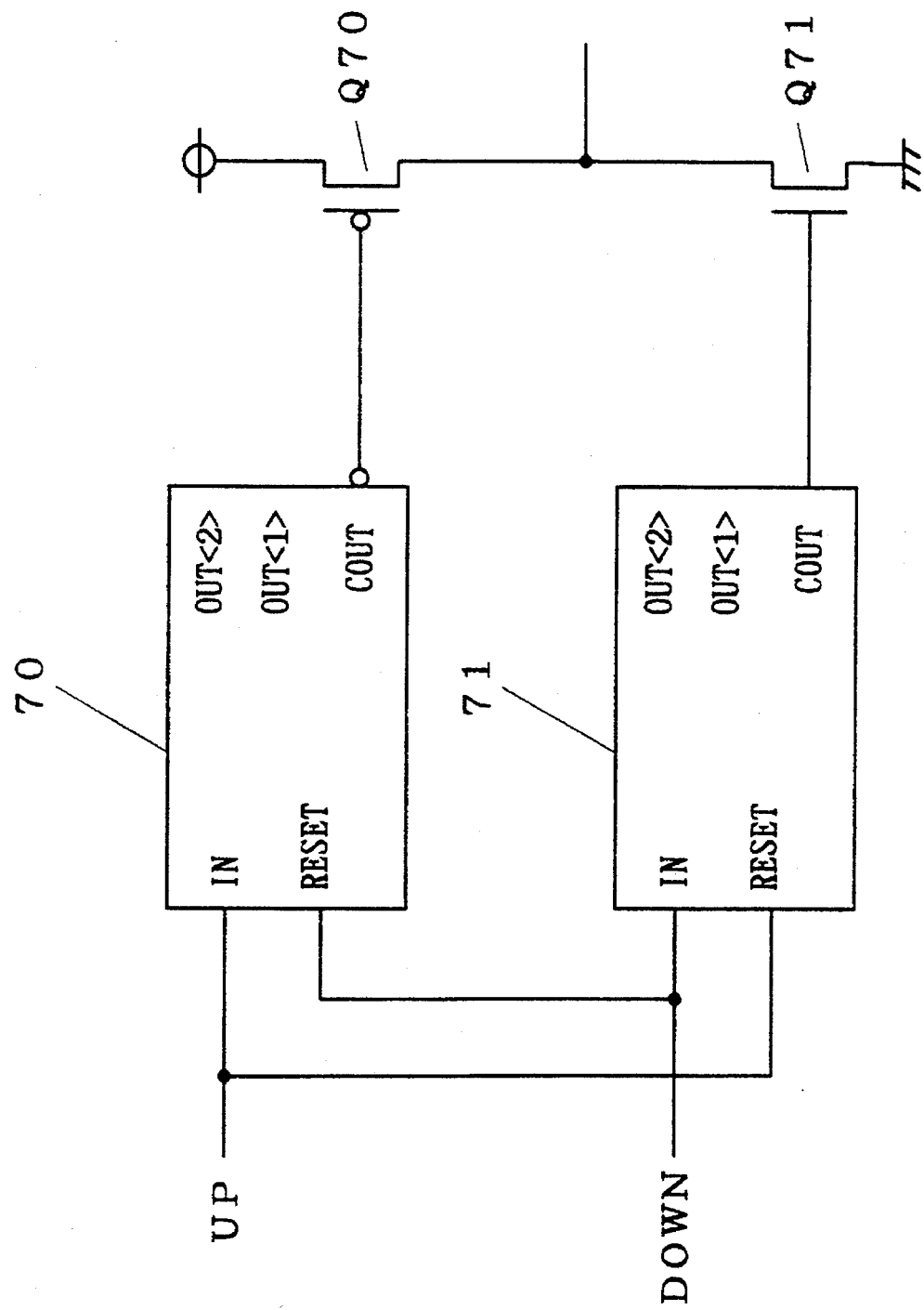
FIG. 47 is a block diagram for describing the structure of the digital filter shown in FIG. 46.
Figure 48:
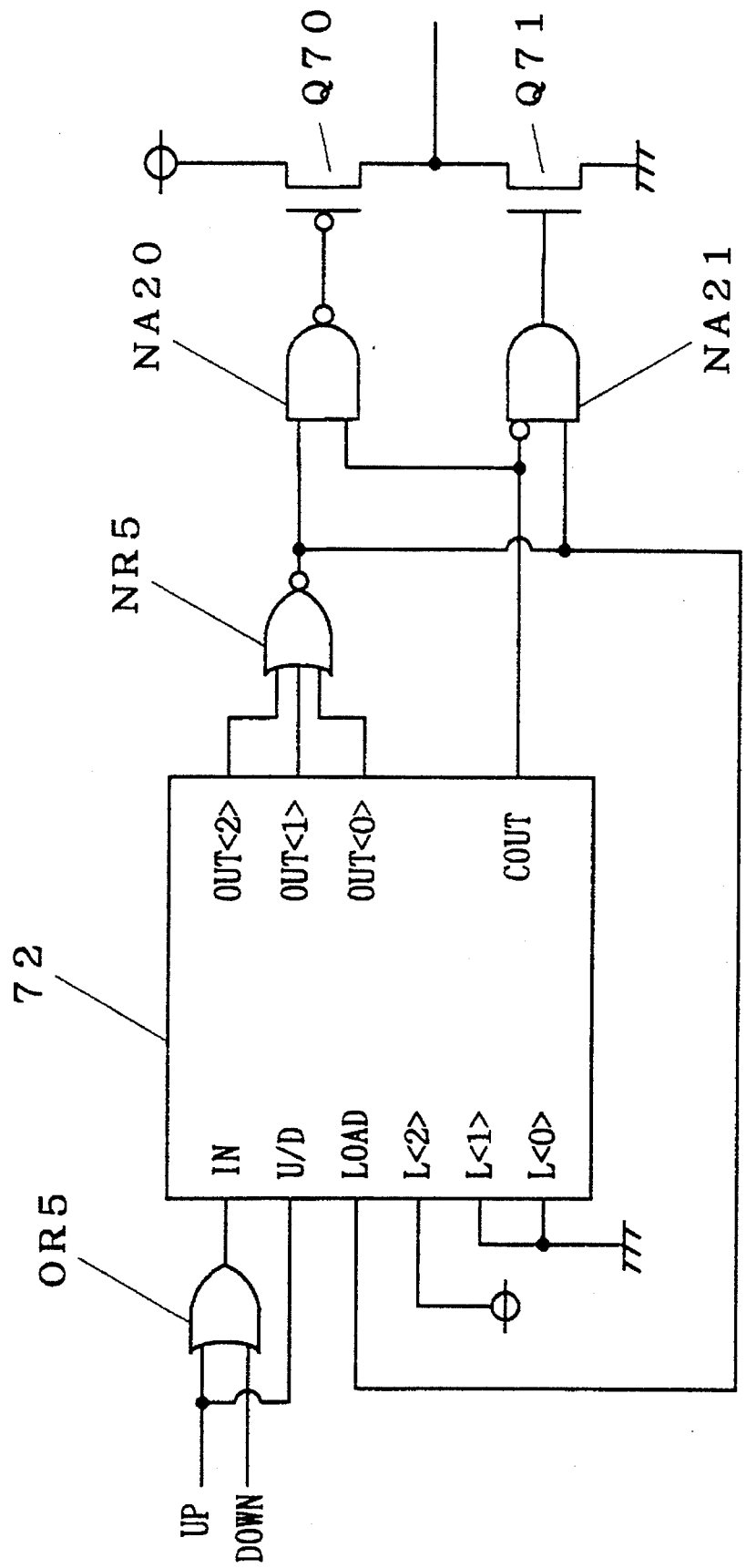
FIG. 48 is a block diagram for describing the structure of the digital filter shown in FIG. 46.
Figure 49:
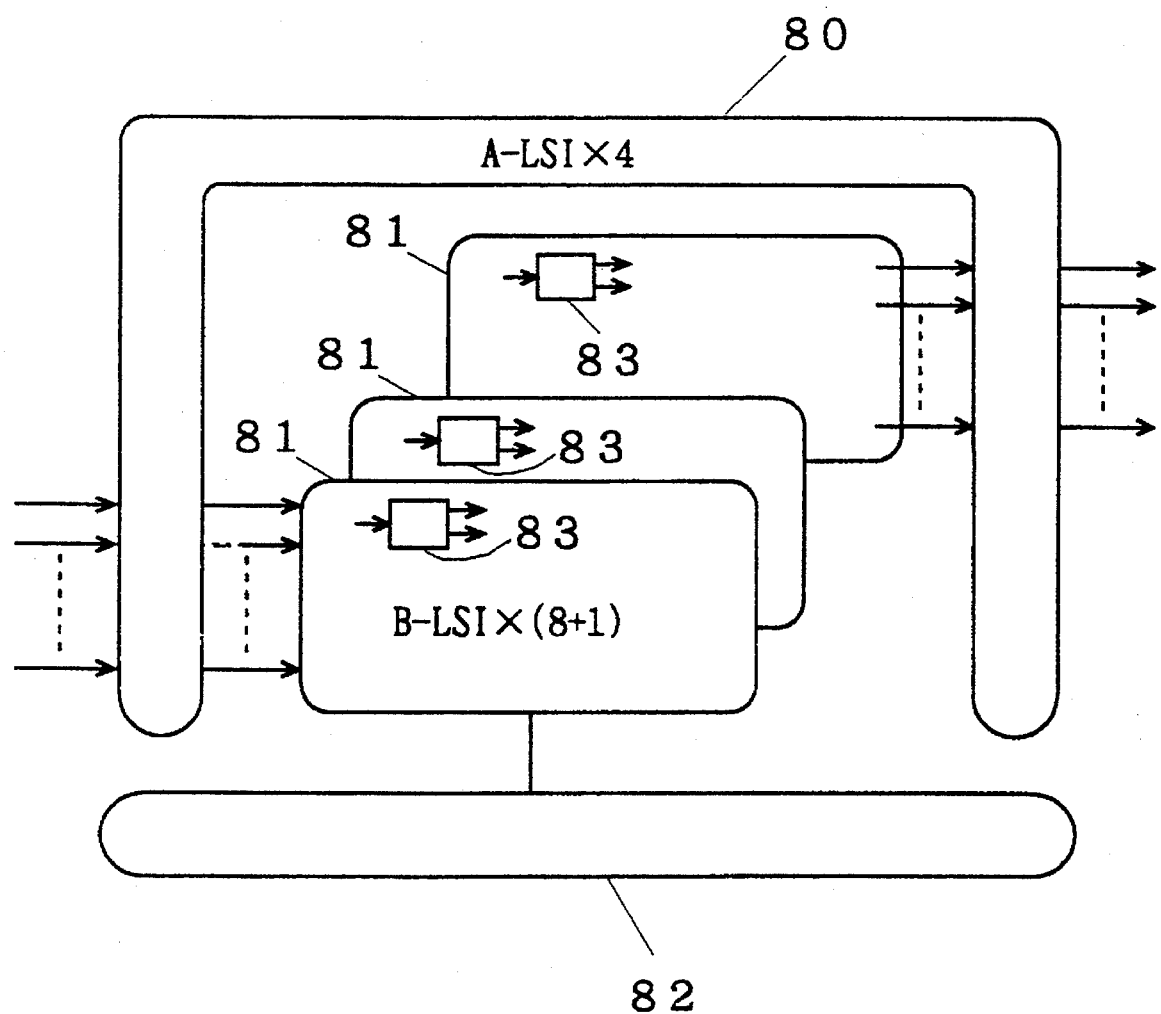
FIG. 49 is a diagram for illustrating the condition of use of the PLL circuit.
Figure 50:
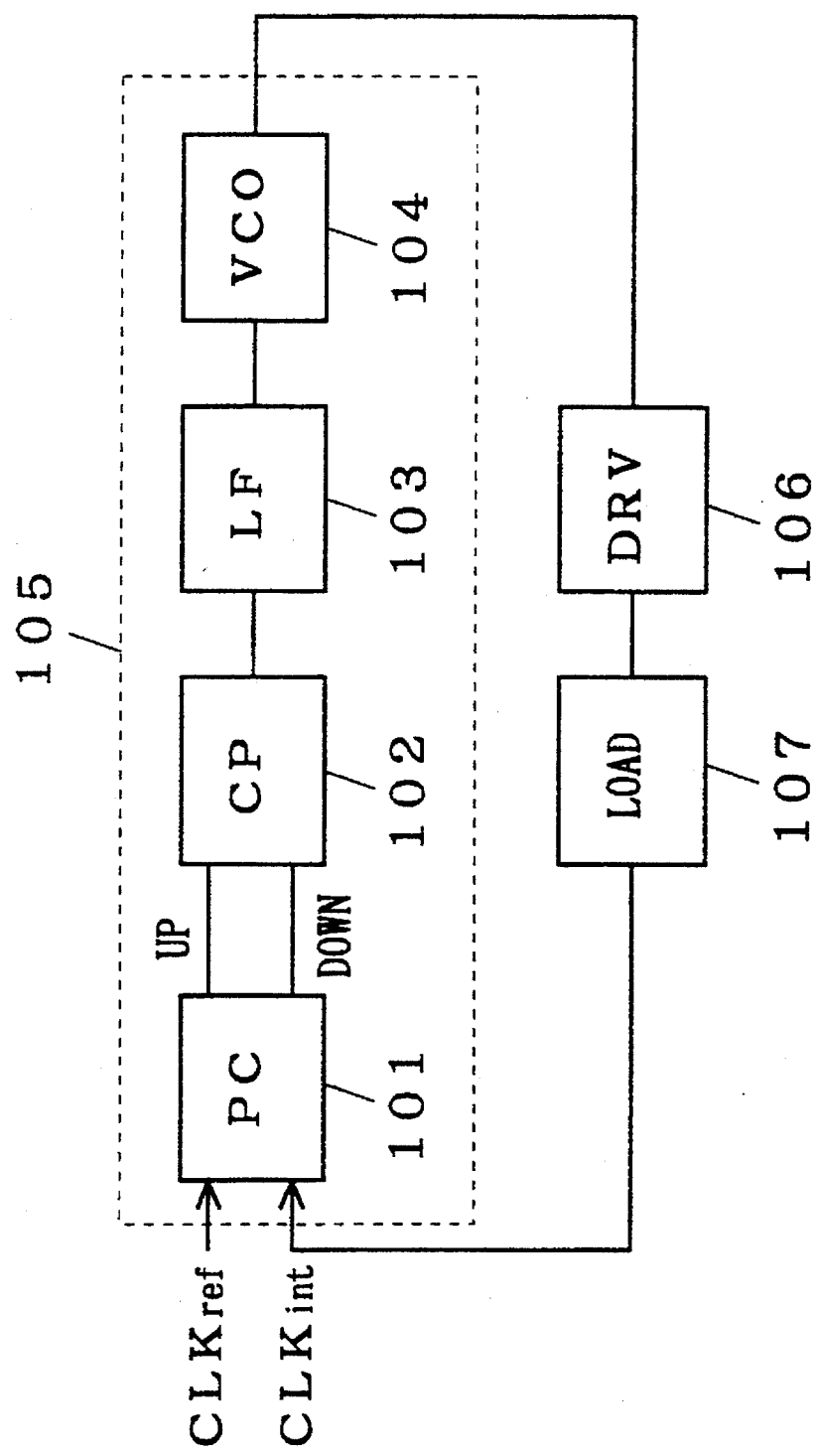
FIG. 50 is a block diagram showing the structure of a general PLL circuit.

FIG. 46 is a diagram for illustrating the structure of a PLL circuit according to the fifteenth preferred embodiment of the present invention. The structure of the PLL circuit shown in FIG. 46 corresponds to the structure from the phase comparator (PC) 101 to the loop filter (LF) 103 in FIG. 50. The charge pump (CP) 62 includes a P-channel transistor Q70 for pulling in current to VDD or LF and an N-channel transistor Q71 for pulling out current from the LF to GND, and where the LF is a lagged-type filter with a resistor Re 1 and a capacitor C 1. The digital filter (DFIL) 61 is composed of such counters as shown in FIGS. 47 and 48 which operate so that the CP turns on once when UP, DOWN is outputted n times. By placing part of the time constant required for the LF under the charge of the DFIL 61, the capacity of the capacitor C1 can be decreased to reduce the area. If the DFIL is formed of up-down counter, the CP does not turn on if UP and DOWN outputted after locked balance, resulting in a decrease in jitter.

FIG. 47 is a block diagram showing the structure of a digital filter including two 2-bit counters. In FIG. 47, 70 and 71 denote 2-bit counters. Inputted to the input IN of the 2-bit counter 70 is the output UP of the phase comparator 60 and inputted to the input RESET of the 2-bit counter 70 is the output DOWN of the phase comparator 60. If four outputs UP are continuously "1", "0" is outputted from the output COUT representing carry-out. Also, the output DOWN of the phase comparator 60 is inputted to the input IN of the 2-bit counter 71 and the output UP of the phase comparator 60 is inputted to the input RESET of the 2-bit counter 71. If four outputs DOWN are continuously "1", "1" is outputted from the output COUT representing carry-out. The counter 70 is reset when the output DOWN becomes "1" and the counter 71 is reset when the output UP becomes "1".

FIG. 48 is a diagram for illustrating a digital filter composed of an up-down counter. In the figure, 72 denotes a 3-bit up-down counter. The output UP, DOWN of the phase comparator 60 are inputted to the counter 72 through the OR gate OR 5. The output UP is also inputted to the up-down input U/D of the counter 72. Accordingly, the count value is increased when the output UP attains "1" and the count value is decreased when the output DOWN attains "1". If the output UP is continuously inputted, the outputs OUT<0> to OUT<2> of the counter 72 are all "0" and the output of the NOR gate NR 5 goes "1", and the output COUT representing carry-out goes "1", then the output of the NAND gate NA 20 taking NOT-AND of the output of the NOR gate NR 5 and the output COUT goes "0", and thus the transistor Q70 turns on. If the output DOWN is continuously inputted, the outputs OUT<0> to OUT<2> of the counter 72 are all "0" and the output COUT representing carry-out goes "0, and then the output of the NAND gate NA 21 goes "1", and thus the transistor Q71 turns on.

Although reset is made with one output of the phase comparator in the structure of the embodiment described above, reset may not be made, and in such a case, the operational stability is decreased but the response speed is increased.

While the invention has been shown and described in detail, the foregoing description is in all aspects illustrative and not restrictive. It is therefore understood that numerous modifications and variations can be devised without departing from the scope of the invention.

What is claimed is:

1. A phase comparator for detecting a phase difference between a first clock in which a first signal level and a second signal level alternately appear and a second clock in which a third signal level and a fourth signal level alternately appear by comparing timing of changing from said first signal level to said second signal level and timing of changing from said third signal level to said fourth signal level and outputting a first output signal when a phase of said first clock is leading a phase of said second clock and outputting a second output signal when said first clock is lagging behind said second clock, characterized by:

going into a first state in which said first and second output signals are not outputted when the phase of said first clock and the phase of said second clock agree;

in said first state, holding said first state when said second clock changes from said third signal level to said fourth signal level when said first clock is at said second signal level;

in said first state, holding said first state when said first clock changes from said first signal level to said second signal level when said second clock is at said fourth signal level;

in said first state, changing to a second state in which only said first output signal is outputted when said first clock changes from said first signal level to said second signal level when said second clock is at said third signal level;

in said second state, holding said second state when said first clock changes from said first signal level to said second signal level when said second clock is at said third signal level;

in said second state, changing to said first state when said second clock changes from said third signal level to said fourth signal level when said first clock is at said second signal level;

in said first state, changing to a third state in which said second output signal only is outputted when said second clock changes from said third signal level to said fourth signal level when said first clock is at said first signal level;

in said third state, holding said third state when said second clock changes from said third signal level to said fourth signal level when said first clock is at said first signal level;

in said third state, changing to said first state when said first clock changes from said first signal level to said second signal level when said second clock is at said fourth signal level; and making no state transition among said first, second and third states when said first clock changes from said second signal level to said first signal level and when said second clock changes from said fourth signal level to said third signal level.

2. A phase comparator for detecting a phase difference between a first clock in which a first signal level and a second signal level alternately appear and a second clock in which a third signal level and a fourth signal level alternately appear by comparing timing of changing from said first signal level to said second signal level and timing of changing from said third signal level to said fourth signal level, comprising:

a control circuit for outputting a first control signal when said first clock changes from said first signal level to said second signal level when said second clock is at said third signal level, outputting a second control signal when said first clock changes from said first signal level to said second signal level when said second clock is at said fourth signal level, outputting a third control signal when said second clock changes from said third signal level to said fourth signal level when said first clock is at said first signal level, and outputting said second control signal when said second clock changes from said third signal level to said fourth signal level when said first clock is at said second signal level;

a first flip-flop circuit having a first input terminal receiving said first control signal and a second input terminal receiving said second control signal for holding said first control signal in response to said second control signal; and a second flip-flop circuit having a first input terminal receiving said third control signal and a second input terminal receiving said second control signal for holding said third control signal in response to said second control signal.

3. A phase comparator for detecting a phase difference between a first clock in which a first signal level and a second signal level alternately appear and a second clock in which a third signal level and a fourth signal level alternately appear by comparing timing of changing from said first signal level to said second signal level and timing of changing from said third signal level to said fourth signal level, comprising:

first through fourth signal generating means for outputting a fifth or a sixth signal level in response to a control signal;

first control means receiving said first and second clock as input for causing said first signal generating means to output said fifth signal level when said first clock is at said first signal level and said second clock is at said third signal level, causing said first signal generating means to hold the state as it is when said first clock is at said first signal level and said second clock is at said fourth signal level, causing said first signal generating means to output said fifth signal level when said first clock is at said second signal level and said second clock is at said third signal level and causing said first signal generating means to output said sixth signal level when said first clock is at said second signal level and said second clock is at said fourth signal level;

second control means receiving said first and second clock as input for causing said second signal generating means to output said fifth signal level when said second clock is at said third signal level and said first clock is at said first signal level, causing said second signal generating means to hold the state as it is when said second clock is at said third signal level and said first clock is at said second signal level, causing said second signal generating means to output said fifth signal level when said second clock is at said fourth signal level and said first clock is at said first signal level and causing said second signal generating means to output said sixth signal level when said second clock is at said fourth signal level and said first clock is at said second signal level;

third control means receiving said second clock and output of said first signal generating means for causing a signal outputted from said third signal generating means at that time to be outputted as it is when said second clock is at said third signal level and said output of said first signal generating means is at said fifth signal level, causing said third signal generating means to output said sixth signal level when said second clock is at said fourth signal level and said output of said first signal generating means is at said fifth signal level and causing said third signal generating means to output said fifth signal level when said second clock is at said fourth signal level and said output of said first signal generating means is at said sixth signal level; and fourth control means receiving said first clock and output of said second signal generating means for causing a signal outputted from said fourth signal generating means at that time to be outputted as it is when said first clock is at said first signal level and said output of said second signal generating means is at said fifth signal level, causing said fourth signal generating means to output said sixth signal level when said first clock is at said second signal level and said second signal generating means is at said fifth signal level and causing said fourth signal generating means to output said fifth signal level when said first clock is at said second signal level and said output of said second signal generating means is at said sixth signal level.

4. A phase comparator for detecting a phase difference between a first clock in which a first signal level and a second signal level alternately appear and a second clock in which a third signal level and a fourth signal level alternately appear by comparing timing of changing from said first signal level to said second signal level and timing of changing from said third signal level to said fourth signal level, comprising:

first phase comparing means receiving said first and second clocks as input and having a first node, first precharge means for causing said first node to raise a first potential when said second clock is at said third signal level and first and second switch means connected in series between said first node and a second potential different from said first potential for placing said first switch means in a conductive state when said second clock is at said fourth signal level and placing said second switch means in a conductive state when said first clock is at said second signal level; and second phase comparing means receiving said first and second clocks as input and having a second node, second precharge means for causing said second node to raise said first potential when said second clock is at said first signal level and third and fourth switch means connected in series between said second node and said second potential for placing said third switch means in a conductive state when said first clock is at said second signal level and placing said fourth switch means in a conductive state when said second clock is at said fourth signal level; wherein said first and second clocks are compared in phase in accordance with the potentials at said first and second nodes and a comparison result is outputted.

5. The phase comparator according to claim 4, further comprising;

first signal output means for outputting a phase lag signal indicating that the phase of said first clock is lagging behind the phase of said second clock in accordance with exclusive OR of logic provided by potential at said first node and logic provided by said second clock, and second signal output means for outputting a phase lead signal indicating that the phase of said first clock is leading the phase of said second clock in accordance with exclusive OR of logic provided by potential at said second node and logic provided by said first clock.

6. The phase comparator according to claim 4, further comprising;

first signal output means receiving said second clock and the potential at said first node as input and having a third node for outputting a phase lag signal, third precharge means for causing said third node to raise said first potential when said first node is at said second potential and fifth and sixth switch means connected in series between said third node and said second potential for placing said fifth switch means in a conductive state when said second clock is at said fourth signal level and placing said sixth switch means in a conductive state when said first node is at said first potential, and second signal output means receiving said first clock and potential at said second node as input and having a fourth node for outputting a phase lead signal, fourth precharge means for causing said fourth node to raise said first potential when said second node is at said second potential and seventh and eighth switch means connected in series between said fourth node and said second potential for placing said seventh switch means in a conductive state when said first clock is at said second signal level and placing said eighth switch means in a conductive state when the potential at said second node is at said first potential.

7. The phase comparator according to claim 5 or 6, further comprising;

first signal holding means for holding said phase lag signal outputted from said first signal output means according to said second clock, and second signal holding means for holding said phase lead signal outputted from said second signal output means according to said first clock.

8. The phase comparator according to claim 6, further comprising:

signal holding means receiving an output of said first signal output means and said second clock as input and having fifth and sixth nodes, fifth precharge means for causing said fifth node to raise said second potential when said second clock is at said fourth signal level, sixth precharge means for causing said sixth node to raise said second potential when said fifth node is at said first potential, ninth and tenth switch means connected in series between said fifth node and said first potential and eleventh and twelfth switch means connected in series between said sixth node and said first potential, for placing said ninth switch means in a conductive state when said second clock is at said third signal level, placing said tenth switch means in a conductive state when output of said first output means is at said second potential, placing said eleventh switch means in a conductive state when said second clock is at said third signal level and placing said twelfth switch means in a conductive state when said fifth node is at said second potential; and signal holding means receiving an output of said second signal output means and said first clock as input and having seventh and eighth nodes, seventh precharge means for causing said seventh node to raise said second potential when said first clock is at said second signal level, eighth precharge means for causing said eighth node to raise said second potential when said seventh node is at said first potential, thirteenth and fourteenth switch means connected in series between said seventh node and said first potential and fifteenth and sixteenth switch means connected in series between said eighth node and said first potential, for placing said thirteenth switch means in a conductive state when said first clock is at said first signal level, placing said fourteenth switch means in a conductive state when the output of said second signal output means is at said second potential, and placing said fifteenth switch means in a conductive state when said first clock is at said first signal level and placing said sixteenth switch means in a conductive state when said seventh node is at said second potential.

9. The phase comparator according to claim 5 or 6, further comprising mask means for controlling output signal so that said first and second signal output means do not output said phase lead signal and said phase lag signal at the same time.

10. The phase comparator according to claim 7, further comprising mask means for controlling output signal so that said second signal output means does not output said phase lead signal when said first signal holding means is outputting said phase lag signal and said first signal output means does not output said phase lag signal when said second signal holding means is outputting said phase lead signal.

11. The phase comparator according to claim 7, further comprising mask means for controlling output signal so that said first signal output means outputs said phase lag signal when said first signal holding means is outputting said phase lag signal or said second signal output means outputs said phase lead signal when said second signal holding means is outputting said phase lead signal.

12. The phase comparator according to claim 4, further comprising;

first signal output means for outputting an output signal in accordance with NOT-AND of logic provided by the potential at said first node and logic provided by said second clock, and second signal output means for outputting an output signal in accordance with NOT-AND of logic provided by the potential at said second node and logic provided by said first clock.

13. The phase comparator according to claim 12, further comprising;

first determining means for determining whether said first clock goes to said second signal level or not when said second clock is at said third signal level if said first clock has not changed from said first signal level to said second signal level when said second clock has been at said fourth signal level, first holding means for holding the defemination result of said first determining means when said second clock changes from said third signal level to said fourth signal level, second determining means for determining whether said second clock goes to said fourth signal level or not when said first clock is at said first signal level if said second clock has not changed from said third signal level to said fourth signal level when said first clock has been at said second signal level, and second holding means for holding the determination result of said second determining means when said first clock changes from said first signal level to said second signal level.

14. The phase comparator according to claim 13, wherein said first holding means is able to output said determination result held therein when said first phase comparing means is outputting said second potential, and said second holding means is able to output said determination result held therein when said second phase comparing means is outputting said second potential.

15. The phase comparator according to claim 5 or 6, further comprising; mask means for outputting NOT-OR of logic provided by output of said first output means and inversion logic of logic provided by said second clock and outputting NOT-OR of logic provided by output of said second output means and inversion logic of logic provided by said first clock.

16. The phase comparator according to claim 6, wherein said first phase comparing means further comprises ninth switch means connected in parallel to said second switch means and which goes into a conductive state when output of said second signal output means is at said second potential, and said second phase comparing means further comprises tenth switch means connected in parallel to said fourth switch means and which goes into a conductive state when output of said first signal output means is at said second potential.

17. The phase comparator according to claim 1, claim 2, claim 3 or claim 4, wherein said first signal level and said third signal level are the same level and said second signal level and said fourth signal level are the same level.

* * * * *